(12) United States Patent
Kamino

(10) Patent No.: US 10,026,775 B2
(45) Date of Patent: Jul. 17, 2018

(54) METHOD OF MANUFACTURING SEMICONDUCTOR DEVICE UTILIZING DIFFERENT MASK THICKNESSES TO FORM GATE ELECTRODES OVER DIFFERENT SEMICONDUCTOR REGIONS

(71) Applicant: Renesas Electronics Corporation, Koutou-ku, Tokyo (JP)

(72) Inventor: Takeshi Kamino, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 72 days.

(21) Appl. No.: 15/050,300

(22) Filed: Feb. 22, 2016

(65) Prior Publication Data

US 2016/0172419 A1    Jun. 16, 2016

Related U.S. Application Data

(62) Division of application No. 14/481,977, filed on Sep. 10, 2014, now abandoned.

(30) Foreign Application Priority Data

Sep. 13, 2013  (JP) ................................ 2013-190808

(51) Int. Cl.
*H01L 21/20*  (2006.01)
*H01L 27/146*  (2006.01)

(52) U.S. Cl.
CPC .. *H01L 27/14689* (2013.01); *H01L 27/14612* (2013.01); *H01L 27/14614* (2013.01);
(Continued)

(58) Field of Classification Search
CPC ....... H01L 27/14689; H01L 21/823456; H01L 21/0337
See application file for complete search history.

(56) References Cited

U.S. PATENT DOCUMENTS 7,342,269 B1    3/2008  Yuzurihara
7,602,034 B2   10/2009  Park
(Continued)

FOREIGN PATENT DOCUMENTS

JP    2000-150857 A    5/2000
JP    2001-111022 A    4/2001
(Continued)

OTHER PUBLICATIONS

Office Action dated Dec. 6, 2016, in Japanese Patent Application No. 2013-190808.
Office Action dated May 23, 2017, in Japanese Patent Application No. 2013-190808.
(Continued)

*Primary Examiner* — Thao X Le
*Assistant Examiner* — Laura Dykes
(74) *Attorney, Agent, or Firm* — Shapiro, Gabor and Rosenberger, PLLC

(57) ABSTRACT

The performances of a semiconductor device are improved. A semiconductor device has a photodiode and a transfer transistor formed in a pixel region. Further, the semiconductor device has a second transistor formed in a peripheral circuit region. The transfer transistor includes a first gate electrode, and a film part formed of a thick hard mask film formed over the first gate electrode. The second transistor includes a second gate electrode, source/drain regions, silicide layers formed at the upper surface of the second gate electrode, and the upper surfaces of the source/drain regions.

11 Claims, 38 Drawing Sheets

(52) U.S. Cl.
CPC .. *H01L 27/14627* (2013.01); *H01L 27/14643* (2013.01); *H01L 27/14687* (2013.01)

(56) References Cited

U.S. PATENT DOCUMENTS

| | | |
|---|---|---|
| 8,115,154 B2 | 2/2012 | Matsumoto et al. |
| 8,872,953 B2 | 10/2014 | Sakano et al. |
| 9,082,639 B2 | 7/2015 | Mishima et al. |
| 2002/0102782 A1* | 8/2002 | Oshima ........... H01L 21/823456 438/200 |
| 2002/0111025 A1* | 8/2002 | Weybright ........ H01L 21/76897 438/689 |
| 2005/0064665 A1 | 3/2005 | Han |
| 2007/0148811 A1 | 6/2007 | Han |
| 2008/0258188 A1 | 10/2008 | Kao |
| 2011/0102620 A1* | 5/2011 | Sakano ............. H01L 27/14609 348/222.1 |
| 2013/0087838 A1 | 4/2013 | Mishima et al. |

FOREIGN PATENT DOCUMENTS

| | | |
|---|---|---|
| JP | 2006-157019 A | 6/2006 |
| JP | 2009-158753 A | 7/2009 |
| JP | 2010-40636 A | 2/2010 |
| JP | 2011-108839 A | 6/2011 |
| JP | 2013-084740 A | 5/2013 |

OTHER PUBLICATIONS

Office Action dated Apr. 27, 2018, in Chinese patent application No. 201410464770.1.

* cited by examiner

FIG. 20

METHOD OF MANUFACTURING SEMICONDUCTOR DEVICE UTILIZING DIFFERENT MASK THICKNESSES TO FORM GATE ELECTRODES OVER DIFFERENT SEMICONDUCTOR REGIONS

CROSS-REFERENCE TO RELATED APPLICATIONS

The disclosure of Japanese Patent Application No. 2013-190808 filed on Sep. 13, 2013 including the specification, drawings and abstract is incorporated herein by reference in its entirety.

BACKGROUND

The present invention relates to a semiconductor device and a manufacturing method thereof, and is preferably applicable to a semiconductor device including, for example, a solid-state image sensing element, and a manufacturing method thereof.

As a solid-state image sensing element, a CMOS image sensor using a CMOS (Complementary Metal Oxide Semiconductor) has been under development. The CMOS image sensor includes a plurality of pixels each having a photodiode and a transfer transistor. The photodiode and the transfer transistor are formed in the pixel region of a semiconductor substrate. On the other hand, in the peripheral circuit region of the semiconductor substrate, there are formed transistors forming a logic circuit, namely, logic transistors.

The manufacturing steps of a semiconductor device including a CMOS image sensor as a solid-state image sensing element have a step of doping ions into a semiconductor substrate in order to form a photodiode in a pixel region. In the ion doping step, for example, into a p type well formed on the upper surface side of the semiconductor substrate, for example, n type impurity ions are doped from the upper surface side of the semiconductor substrate, thereby to form an n type well in the inside of the p type well. This results in the formation of a photodiode having a pn junction between the p type well and the n type well.

Further, the manufacturing steps of a semiconductor device including a CMOS image sensor have a step of forming silicide layers in the pixel region and a peripheral circuit region. In the silicide layer formation step, after forming the photodiode in the pixel region, in the peripheral circuit region, silicide layers are formed at the upper surface of the gate electrode of a logic transistor and the upper surfaces of the source/drain regions on the opposite sides of the gate electrode.

Japanese Unexamined Patent Publication No. 2010-40636 (Patent Document 1) discloses the following technology: with the resist pattern left over the gate electrode of a transfer transistor in a pixel region as a mask, ions are doped into a semiconductor substrate, thereby to form a photodiode.

PATENT DOCUMENT

Patent Document 1

Japanese Unexamined Patent Publication No. 2010-40636

SUMMARY

In a CMOS image sensor, in order to receive lights including a red light, to generate electrons with efficiency, and to trap the generated electrons with efficiency, the pn junction of the photodiode is desirably arranged at a position deep from the upper surface of the semiconductor substrate. Therefore, of the p type well and the n type well forming the pn junction of the photodiode, for the n type well formed at the upper layer part of the p type well, the lower surface of the n type well is desirably arranged at a position as deep as possible.

However, when ions are doped in alignment with the gate electrode, the ions may penetrate through the gate electrode, to be doped into a gate insulation film and a semiconductor substrate under the gate electrode. Under such circumstances, in order to prevent or inhibit ions from being doped into the gate insulation film and the semiconductor substrate under the gate electrode, for example, it can be considered that ions are doped with an insulation film formed over the gate electrode.

However, in the peripheral circuit region, silicide layers are formed at the upper surface of the gate electrode, and the upper surfaces of the source/drain regions. For this reason, after doping ions and forming a photodiode, it is necessary to remove the insulation film over the gate electrode in the peripheral circuit region. However, when the thick insulation film over the gate electrode in the peripheral circuit region is removed by, for example, wet etching, an element isolation region or a gate insulation film may be partially removed. Therefore, it is difficult to remove the insulation film over the gate electrode in the peripheral circuit region after forming the photodiode.

Namely, in order to form silicide layers with ease, a thick insulation film cannot be formed over the gate electrode, and n type impurity ions cannot be doped to a position deep from the upper surface of the semiconductor substrate in the photodiode forming region. As a result, the photodiode is formed at a position shallow from the upper surface of the semiconductor substrate. Accordingly, impurity ions in a p type semiconductor region formed in the vicinity of the upper surface of the semiconductor substrate are diffused into the inside of the photodiode. Then, the number of saturated electrons in the photodiode is reduced, which may reduce the sensitivity of the CMOS image sensor, resulting in the degradation of the performances of the semiconductor device.

Further, in the CMOS image sensor, when the photodiode includes therein a large number of crystal defects, the photodiode is determined as being irradiated with a light despite not being irradiated with a light. As a result, erroneous lighting is caused, so that white points are formed. The portion in the vicinity of the upper surface of the semiconductor substrate includes therein a large number of crystal defects. For this reason, the photodiode is formed at a position shallow from the upper surface of the semiconductor substrate. This results in an increase in frequency of the formation of white points with no light applied thereto, namely, the formation of pixel defects. This may degrade the performances of the CMOS image sensor, resulting in the degradation of the performances of the semiconductor device.

Other objects and novel features will be apparent from the description of this specification and the accompanying drawings.

In accordance with one embodiment, a semiconductor device has a photodiode and a transfer transistor formed in a pixel region on the upper surface side of a semiconductor substrate. Further, the semiconductor device has a transistor formed in a peripheral circuit region on the upper surface side of the semiconductor substrate. The transfer transistor includes a first gate electrode, and a first film part formed of a thick hard mask film formed over the first gate electrode. The transistor formed in the peripheral circuit region includes a second gate electrode, source/drain regions, and silicide layers formed at the upper surface of the second gate electrode, and the upper surfaces of the source/drain regions. Further, the semiconductor device has an interlayer insulation film formed in such a manner as to cover the transfer transistor.

Further, in accordance with another embodiment, in a method for manufacturing a semiconductor device, in a pixel region on the upper surface side of a semiconductor substrate, a first film part formed of a thick hard mask film formed over a conductive film is formed; and in a peripheral circuit region on the upper surface side of the semiconductor substrate, a second film part formed of a thin hard mask film formed over the conductive film is formed. Then, by etching the conductive film, the conductive film covered with the first film part is left, thereby to form a first gate electrode, and the conductive film covered with the second film part is left, thereby to form a second gate electrode. Then, in the inside of a portion of a p type well arranged on a first side of the first gate electrode, an n type well is formed in alignment with the first gate electrode by an ion implantation method, thereby to form a photodiode including the p type well and the n type well. Then, the second film part is removed. Then, in a second portion of the p type well arranged on the side of the first gate electrode opposite to the first side, a drain region is formed, thereby to form a transfer transistor including the first gate electrode, the drain region, and the first film part. Further, in the peripheral circuit region, in the p type well, source/drain regions are formed, thereby to form a transistor including the second gate electrode and the source/drain regions. Then, silicide layers are formed at the upper surface of the second gate electrode, and the upper surfaces of the source/drain regions.

In accordance with one embodiment, it is possible to improve the performances of a semiconductor device.

BRIEF DESCRIPTION OF THE DRAWINGS

FIG. 20 is a cross sectional view showing the semiconductor device of First Embodiment during a manufacturing step;

DETAILED DESCRIPTION

In the following embodiments, the description may be divided into a plurality of sections, or embodiments for convenience, if required. However, unless otherwise specified, these are not independent of each other, but, are in a relation such that one is a modification example, details, a complementary explanation, or the like of a part or the whole of the other.

Further, in the following embodiments, when a reference is made to the number of elements, and the like (including number, numerical value, quantity, range, or the like), the number of elements is not limited to a specific number, but may be greater than or less than the specific number, unless otherwise specified, or except the case where the number is apparently limited to the specific number in principle.

Further, in the following embodiments, it is naturally understood that the constitutional elements (including element steps, or the like) are not always essential, unless otherwise specified, or except the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, or unless otherwise considered apparently in principle, or except for other cases. This also applies to the foregoing numerical values and ranges.

Below, respective embodiments will be described in details by reference to the accompanying drawings. Incidentally, in all the drawings for describing the embodiments, the members having the same function are given the same reference signs and numerals, and a repeated description thereon is omitted. Further, in the following embodiments, a description on the same or similar portions will not be repeated unless otherwise required.

Further, in the accompanying drawings for use in embodiments, hatching may be omitted even in cross section for ease of understanding of the drawings.

Further, in a cross sectional view, the size of each part does not correspond to that of an actual device. For ease of understanding of the drawings, a specific part may be shown on a relatively enlarged scale.

First Embodiment

Below, a semiconductor device of the present First Embodiment will be described in details by reference to the accompanying drawings.

<Configuration of Semiconductor Device>

Figure 1:
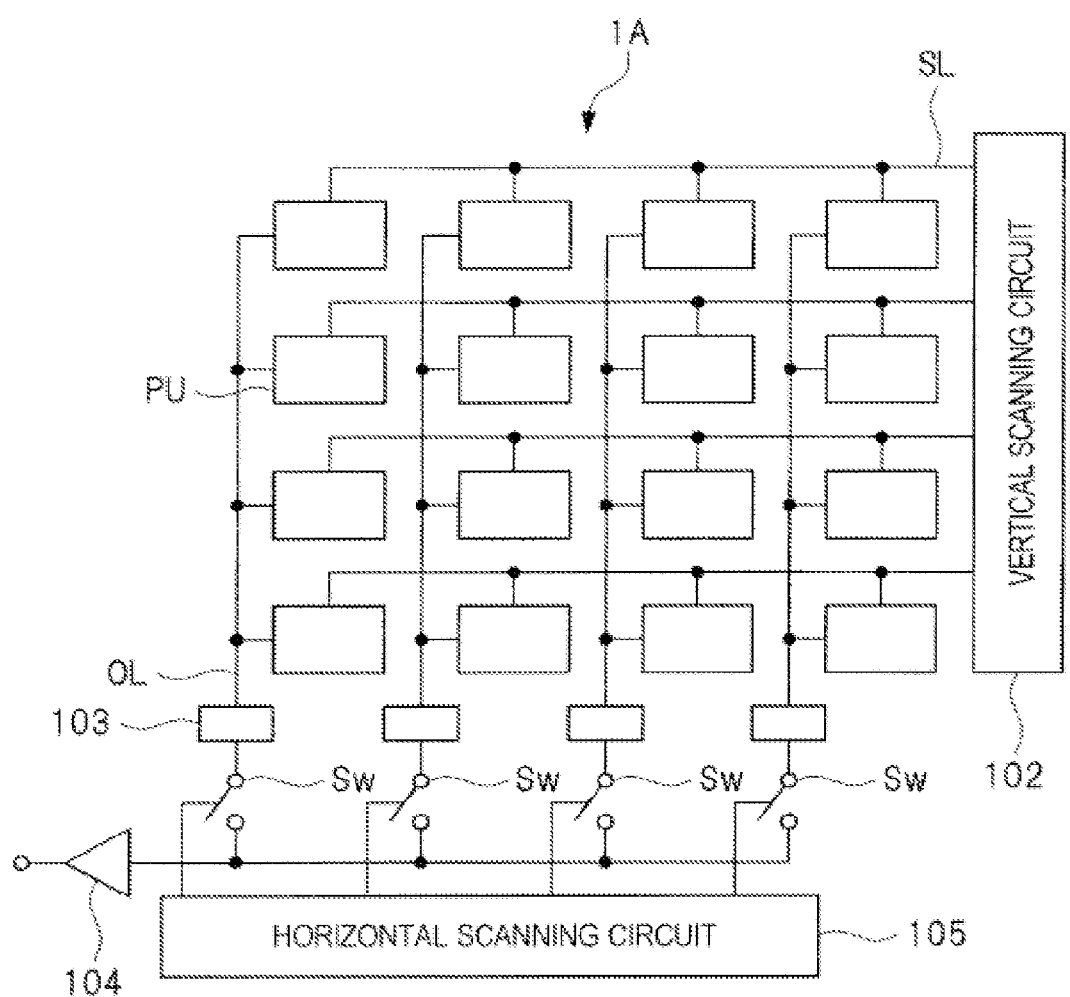
FIG. 1 is a circuit block diagram showing a configuration example of a semiconductor device of First Embodiment.
Figure 2:
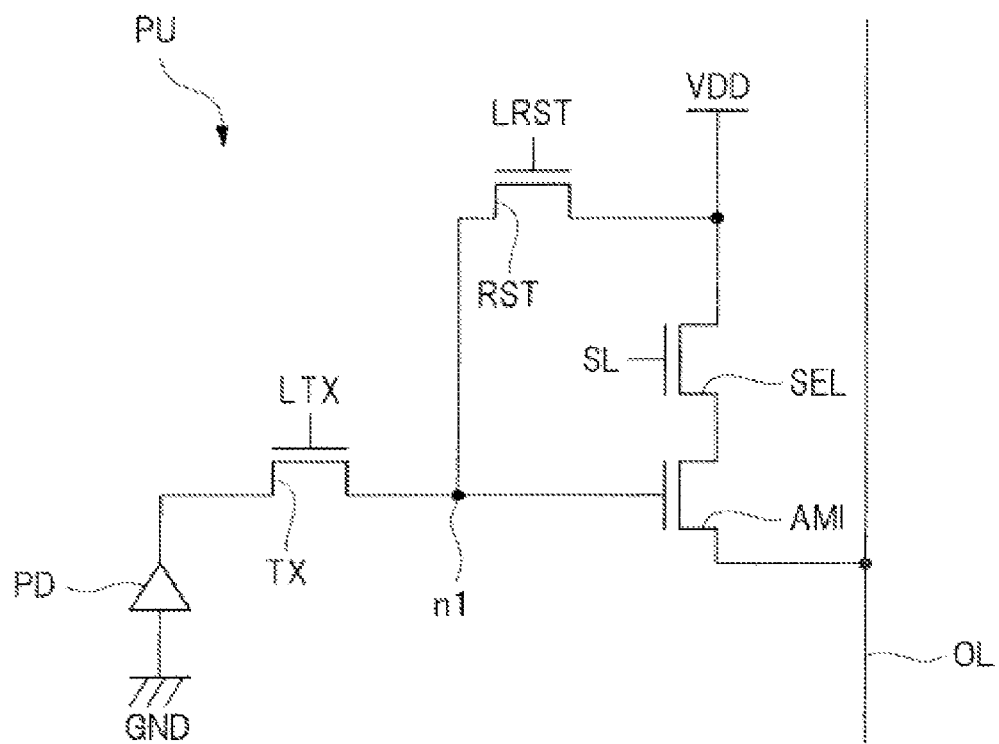
FIG. 2 is a circuit diagram showing a configuration example of a pixel.

FIG. 1 is a circuit block diagram showing a configuration example of a semiconductor device of First Embodiment. FIG. 2 is a circuit diagram showing the configuration example of a pixel. Incidentally, FIG. 1 shows 16 pixels arranged in an array of 4 rows and 4 columns. However, when the semiconductor device of First Embodiment is applied to an electronic device such as a camera, for example, several hundreds of pixels are provided.

In a pixel region 1A shown in FIG. 1, a plurality of pixels PU are arranged in an array. In the periphery thereof, there are arranged driving circuits such as a vertical scanning circuit 102 and a horizontal scanning circuit 105. Namely, the semiconductor device of the present First Embodiment has a pixel array including a plurality of pixels PU arranged in an array therein. In other words, the semiconductor device of the present First Embodiment has a plurality of pixels PU arranged in an array.

Respective pixels PU are arranged at points of intersection of selection lines SL and output lines OL, respectively. The selection lines SL are coupled with the vertical scanning circuit 102, and the output lines OL are coupled with column circuits 103, respectively. The column circuits 103 are coupled with an output amplifier 104 via switches Sw, respectively. Respective switches Sw are coupled with the horizontal scanning circuit 105, and are controlled by the horizontal scanning circuit 105.

For example, an electrical signal read from the pixel PU selected by the vertical scanning circuit 102 and the horizontal scanning circuit 105 is outputted via the output line OL and the output amplifier 104.

The pixel PU includes, for example, as shown in FIG. 2, a photodiode PD and four MOSFETs. The MOSFETs are of an n channel type. RST is a reset transistor, TX is a transfer transistor, SEL is a selection transistor, and AMI is an amplification transistor. The transfer transistor TX transfers electrical charges generated by the photodiode PD. Incidentally, other than these transistors, other transistors or elements such as capacitive elements may be incorporated. Further, as the coupling forms of the transistors, various modified examples can be used. Then, a MOSFET is an abbreviation of Metal Oxide Semiconductor Field Effect Transistor, and may also be described as MISFET (Metal Insulator Semiconductor Field Effect Transistor). Further, FET (Field Effect Transistor) is an abbreviation of field effect transistor.

In the circuit example shown in FIG. 2, in the pixel PU, the photodiode PD and the transfer transistor TX are coupled in series between the ground potential GND and a node n1. The reset transistor RST is coupled between the node n1 and a power supply potential VDD. The power supply potential VDD is the electrical potential of a power supply potential line. The selection transistor SEL and the amplification transistor AMI are coupled in series between the power supply potential VDD and the output line OL. The gate electrode of the amplification transistor AMI is coupled with the node n1. Whereas, the gate electrode of the reset transistor RST is coupled with the reset line LRST. Then, the gate electrode of the selection transistor SEL is coupled with the selection line SL, and the gate electrode of the transfer transistor TX is coupled with the transfer line LTX.

For example, the transfer line LTX and the reset line LRST are raised and set at a H level, so that the transfer transistor TX and the reset transistor RST are put in an ON state. As a result, the electrical charges in the photodiode PD are extracted, and depleted. Then, the transfer transistor TX is rendered in an OFF state.

Thereafter, the shutter such as a mechanical shutter of an electronic device such as a camera is opened. Then, during the period in which the shutter is opened, in the photodiode PD, electrical charges are generated by an incident light, and are accumulated. In other words, the photodiode PD receives an incident light, and generates electrical charges.

Then, after closing the shutter, the reset line LRST is lowered, and is set at a L level, so that the reset transistor RST is rendered in an OFF state. Further, the selection line SL and the transfer line LTX are raised, and are set at a H level, so that the selection transistor SEL and the transfer transistor TX are rendered in an ON state. As a result, the electrical charges generated by the photodiode PD are transferred to the end on the node n1 side of the transfer transistor TX (a floating diffusion FD shown in FIG. 3 described later). At this step, the signal from the floating diffusion FD, namely, the electrical potential thereof changes into a value corresponding to the electrical charges transferred from the photodiode PD. The value of the signal is amplified by the amplification transistor AMI, and is outputted to the output line OL. The signal from the output line OL, namely, the electrical potential thereof serves as an electrical signal (light receiving signal), and is read as an output signal from the output amplifier 104 via the column circuit 103 and the switch Sw.

<Element Structure of Pixel Region and Peripheral Circuit Region>

Figure 3:
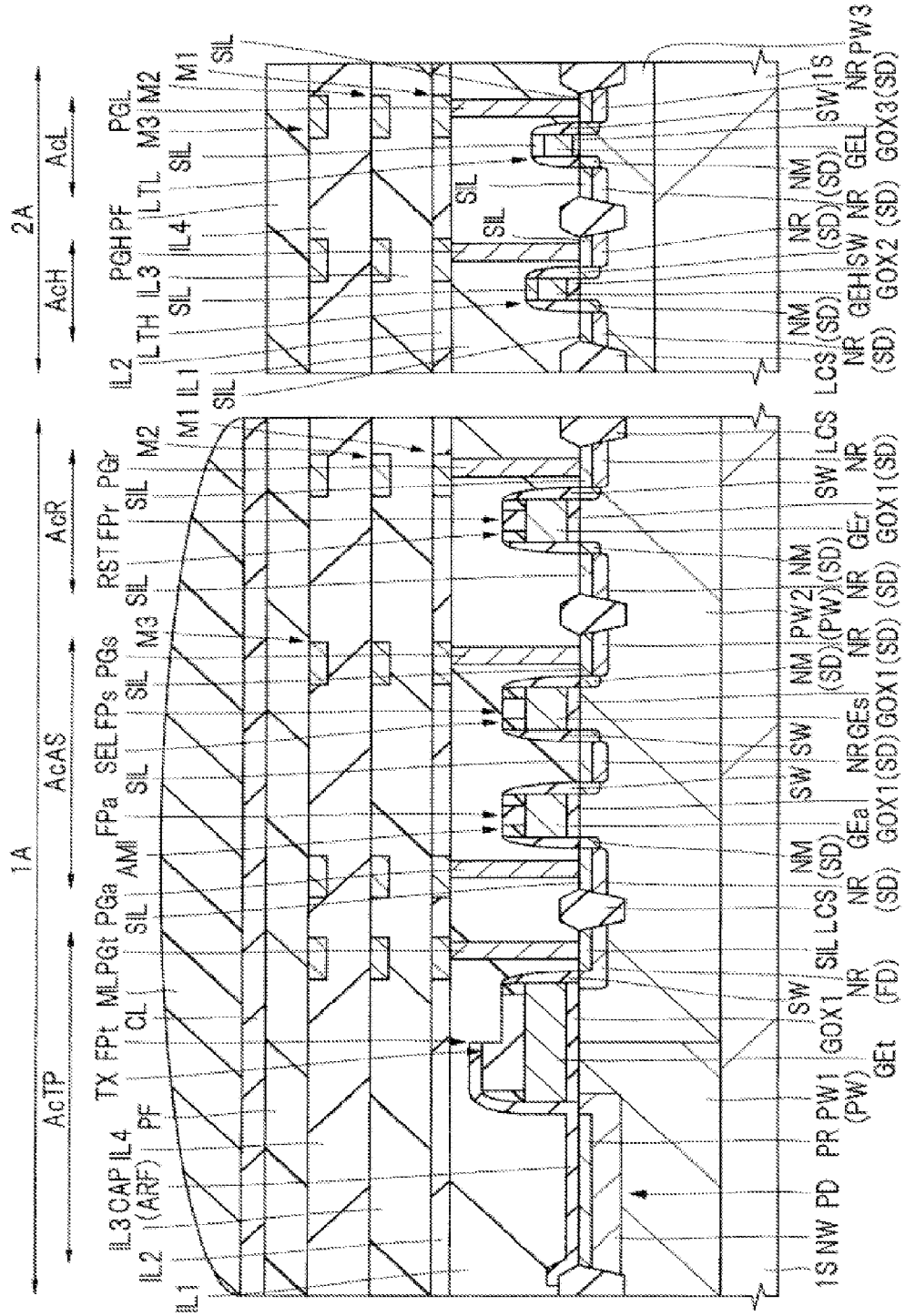
FIG. 3 is a cross sectional view showing the configuration of a semiconductor device of First Embodiment.
Figure 4:
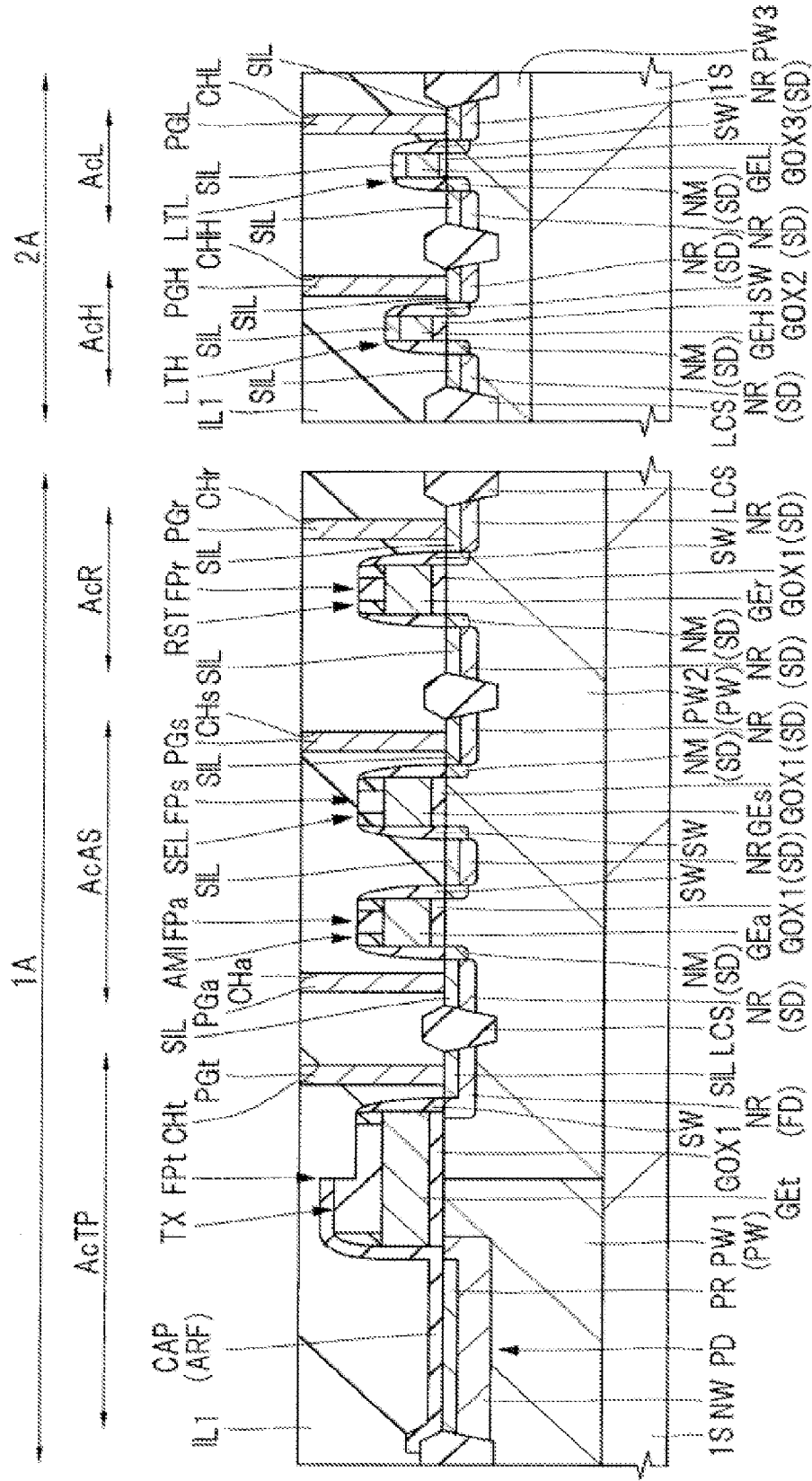
FIG. 4 is a cross sectional view showing the configuration of the semiconductor device of First Embodiment.

Then, a description will be given to the element structure of the pixel region and the peripheral circuit region. FIGS. 3 and 4 are each a cross sectional view showing the configuration of the semiconductor device of First Embodiment. Incidentally, in FIGS. 3 and 4, the element structure of the pixel region and the element structure of the peripheral circuit region are shown together. Whereas, in FIG. 4, the portion above the interlayer insulation film IL1 of FIG. 3 is not shown.

As shown in FIG. 3, the semiconductor device of the present First Embodiment has a semiconductor substrate 1S, active regions AcTP, AcAS, and AcR which are semiconductor regions formed in the pixel region 1A formed on the side of the upper surface as the main surface of the semiconductor substrate 1S, and active regions AcH and AcL which are semiconductor regions formed in the peripheral circuit region 2A formed on the upper surface side of the semiconductor substrate 1S.

The semiconductor device of the present First Embodiment has, in the pixel region 1A, the photodiode PD, the transfer transistor TX, the amplification transistor AMI, the selection transistor SEL, and the reset transistor RST.

The photodiode PD is formed in the active region AcTP, and generates electrical charges by photoelectric conversion. The transfer transistor TX is formed in the active region AcTP, and transfers the electrical charges generated by the photodiode PD. The amplification transistor AMI is formed in the active region AcAS, and amplifies a signal according to the electrical charges transferred by the transfer transistor TX. The selection transistor SEL is formed in the active region AcAS, and selects the pixel PU including the photodiode PD and the transfer transistor TX (see FIGS. 1 and 2). In other words, the selection transistor SEL selects the amplification transistor AMI. The reset transistor RST is formed in the active region AcR, and erases the electrical charges in the photodiode PD.

The semiconductor device of the present First Embodiment has a transistor LTH and a transistor LTL as logic transistors forming a logic circuit in the peripheral circuit region 2A. The logic circuit in the peripheral circuit region 2A includes an n channel type MISFET using electrons as carriers, and a p channel type MISFET using holes as carriers. In FIG. 3, as examples thereof, there are shown the transistors LTH and LTL which are n channel type MISFETs of the transistors forming the logic circuit in the peripheral circuit region 2A.

The transistor LTH is formed in the active region AcH, and the transistor LTL is formed in the active region AcL. The driving voltage of the transistor LTH is larger than the driving voltage of the transistor LTL. The driving voltage of the transistor LTH is, for example, 3.3 V, and the driving voltage of the transistor LTL is, for example, 1.5 V. Namely, in the peripheral circuit region 2A, there are formed a plurality of types of n channel type transistors having different driving voltages. Incidentally, although not shown, in the peripheral circuit region 2A, there may be formed a plurality of types of p channel type transistors having different driving voltages.

The semiconductor substrate 1S is a single crystal silicon containing n type impurities such as phosphorus (P) or arsenic (As). At respective outer edges of the active regions AcTP, AcAS, AcR, AcH, and AcL, there are arranged element isolation regions LCS. Thus, respective portions surrounded by the element isolation regions LCS on the upper surface side of the semiconductor substrate 1S serve as active regions such as the active regions AcTP, AcAS, AcR, AcH, and AcL.

In the pixel region 1A, in the portion of the active region AcTP in which the photodiode PD is formed, there is formed a p type well PW1 as a semiconductor region doped with p type impurities such as boron (B). Further, in the pixel region 1A, in the portion of the active region AcTP other than the portion in which the photodiode PD is formed, and the active regions AcAS and AcR, there is formed a p type well PW2 as a semiconductor region doped with p type impurities such as boron (B). Whereas, in the peripheral circuit region 2A, in the active regions AcH and AcL, there is formed a p type well PW3 as a semiconductor region doped with p type impurities such as boron (B). Incidentally, in the present specification, the p type well PW1 and the p type well PW2 are collectively defined as a semiconductor region PW.

The p type impurity concentration of each of the p type wells PW1, PW2, and PW3 has no particular restriction, and can be set at a given value. In this case, the p type impurity concentration in the p type well PW3 of the active region AcH can be set different from the p type impurity concentration in the p type well PW3 of the active region AcL.

Over the active region AcTP, a gate electrode GEt is formed across over the p type well PW1 to over the p type well PW2 via a gate insulation film GOX1. The gate electrode GEt is a gate electrode of the transfer transistor TX. In a plan view, on one side of the gate electrode GEt (the left-hand side of FIG. 3), there is formed the photodiode PD. Whereas, in a plan view, on the other side of the gate electrode GEt (the right-hand side of FIG. 3), namely, on the side of the gate electrode GEt opposite to the photodiode PD side, there is formed a floating diffusion FD having a function as a charge accumulation part or a floating diffusion layer.

In the inside of the p type well PW1, there is formed an n type well NW as a semiconductor region doped with n type impurities such as phosphorus (P) or arsenic (As). Specifically, the n type well NW is formed in the upper layer part of the p type well PW1. The p type well PW1 and the n type well NW form the photodiode PD. Namely, the photodiode PD includes the p type well PW1 formed in the active region AcTP, and the n type well NW formed in the inside of the p type well PW1. Further, the photodiode PD includes the pn junction between the p type well PW1 and the n type well NW.

In a part of the upper surface of the n type well NW, there is formed a $p^+$ type semiconductor region PR. The $p^+$ type semiconductor region PR is formed for the purpose of suppressing the generation of electrons based on a large number of interface states formed at the upper surface of the semiconductor substrate 1S. Namely, at the portion in the vicinity of the upper surface of the semiconductor substrate 1S, under the influence of the interface states, electrons may be generated even while not being irradiated with light, thereby causing an increase in dark current. For this reason, in the upper surface of the n type well NW using electrons as majority carriers, there is formed the $p^+$ type semiconductor region PR using holes as majority carriers. As a result, it is possible to suppress the generation of electrons with no light applied thereto, which can suppress the increase in dark current. Namely, the photodiode PD has the $p^+$ type semiconductor region PR formed in a part of the upper surface of the n type well NW.

Over the gate electrode GEt, there is formed a film part FPt. The film part FPt includes a film part FPt1 formed of a thick hard mask HM1 (see FIG. 13 described later) as an insulation film and sidewalls SWt as sidewall parts each formed of a thin hard mask film HM2 formed at the side surfaces of the film part FPt1 (see FIG. 13 described later).

Herein, the film thickness TH5 of the hard mask film HM1 (see FIG. 13 described later) is, for example, about 200 to 300 nm. The film thickness TH6 of the hard mask film HM2 (see FIG. 13 described later) is, for example, about 20 nm. Whereas, each thickness of the film part FPt and the film part FPt1 (see FIG. 13 described later) is equal to the film thickness TH5 of the hard mask film HM1 (see FIG. 13 described later). The width of the sidewall SWt (see FIG. 13 described later) is equal to the film thickness TH6 of the hard mask film HM2 (see FIG. 13 described later).

In the present First Embodiment, over the gate electrode GEt, there is formed the film part FPt. As a result, when, for example, n type impurity ions are doped in order to form the n type well NW of the photodiode PD, the impurity ions can be prevented or inhibited from penetrating through the gate electrode GEt, and being doped into the gate insulation film GOX1 and the p type well PW1 under the gate electrode GEt. Accordingly, n type ion impurity ions can be doped to a position deep from the upper surface of the p type well PW1, so that an n type well NW can be formed at a position deep from the upper surface of the p type well PW1. As a result, it is possible to prevent or inhibit the reduction of the number of the saturated electrons in the photodiode PD. This can reduce the frequency of the formation of white points with no light applied thereto, namely, the formation of pixel defects.

The distance TH7 from the upper surface of the semiconductor substrate 1S to the lower surface of the n type well NW, namely, the surface of the semiconductor substrate 1S opposite to the upper surface side thereof in the n type well NW (see FIG. 15 described later) may be larger than the film thickness TH4 of the gate electrode GEt (see FIG. 15 described later). Even in such a case, in accordance with the present First Embodiment, when, for example, n type impurity ions are doped in order to form the n type well NW, the impurity ions can be prevented or inhibited from penetrating through the gate electrode GEt, and being doped into the gate insulation film GOX1 and the p type well PW1 under the gate electrode GEt. Incidentally, the film thickness TH4 of the gate electrode GEt is, for example, about 200 nm.

Preferably, as the thick hard mask film HM1 forming the film part FPt (see FIG. 13 described later), there can be used an insulation film which is a monolayer film including one, or a lamination film including two or more of a silicon oxide ($SiO_2$) film, a silicon nitride (SiN) film, and a silicon oxynitride (SiON) film. In the present First Embodiment using the film part FPt as the mask for doping impurity ions, the film part FPt can be prevented or inhibited from being altered or modified as compared with, for example, the case using a resist film in place of the film part FPt.

Further preferably, as the thick hard mask film HM1 forming the film part FPt, there can be used a silicon oxide film. As a result, even when the hard mask film HM1 is thick, patterning can be performed with ease.

On the other hand, as the thin hard mask film HM2 forming the film part FPt (see FIG. 13 described later), there can be used an insulation film which is a monolayer film including one, or a lamination film including two or more of a silicon oxide film, a silicon nitride film, and a silicon oxynitride film.

Further, the film part FPt may have a step part STP (see FIG. 18 described later). In this case, the film thickness of a portion of the film part FPt opposite to the photodiode PD side thereof from the step part STP is smaller than the film thickness TH5 of a portion of the film part FPt on the photodiode PD side from the step part STP (see FIG. 13 described later).

A cap insulation film CAP is formed across from the upper surface of the $p^+$ type semiconductor region PR to the upper surface of the film part FPt. The cap insulation film CAP is formed for keeping favorable the characteristics at the upper surfaces of the n type well NW and the $p^+$ type semiconductor region PR. Whereas, the cap insulation film CAP also functions as an antireflection film ARF. Namely, the photodiode PD has the antireflection film ARF formed over the n type well NW and the $p^+$ type semiconductor region PR.

Incidentally, a sidewall SW formed of an insulation film is formed at the side surface of the gate electrode GEt opposite to the photodiode PD side thereof, and the side surface of the film part FPt opposite to the photodiode PD side thereof.

On the side of the gate electrode GEt opposite to the photodiode PD side thereof, namely, in the upper layer part of the active region AcTP in which the p type well PW2 is formed, there is formed an n type high concentration semiconductor region NR doped with n type impurities such as phosphorus (P) or arsenic (As). The n type high concentration semiconductor region NR is a semiconductor region as a floating diffusion FD, and is also a drain region of the transfer transistor TX. Namely, the transfer transistor TX includes the gate electrode GEt formed over the active region AcTP, and the n type high concentration semiconductor region NR which is the drain region formed in alignment with the gate electrode GEt in the upper layer part of the active region AcTP.

Over the p type well PW2 of the active region AcAS, a gate electrode GEa and a gate electrode GEs are formed via gate insulation films GOX1, respectively. The gate electrode GEa is the gate electrode of the amplification transistor AMI. The gate electrode GEs is the gate electrode of the selection transistor SEL. Over the gate electrode GEa, there is formed a film part FPa, and over the gate electrode GEs, there is formed a film part FPs. The film part FPa includes a film part FPa1 formed of a thick hard mask film HM1 (see FIG. 13 described later) as an insulation film and sidewalls SWa as sidewall parts each formed of a thin hard mask film HM2 formed at the side surfaces of the film part FPa1 (see FIG. 13 described later). The film part FPs includes a film part FPs1 formed of a thick hard mask film HM1 (see FIG. 13 described later) as an insulation film and sidewalls SWs as sidewall parts each formed of a thin hard mask film HM2 formed at the side surfaces of the film part FPs1 (see FIG. 13 described later).

The hard mask film HM1 forming the film part FPa1 (see FIG. 13 described later) is an insulation film formed at the same layer as the hard mask film HM1 forming the film part FPt1 (see FIG. 13 described later). The hard mask film HM2 forming the sidewall SWa (see FIG. 13 described later) is an insulation film formed at the same layer as the hard mask film HM2 forming the sidewall SWt (see FIG. 13 described later). The hard mask film HM1 forming the film part FPs1 (see FIG. 13 described later) is an insulation film formed at the same layer as the hard mask film HM1 forming the film part FPt (see FIG. 13 described later). The hard mask film HM2 forming the sidewall SWs (see FIG. 13 described later) is an insulation film formed at the same layer as the hard mask film HM2 forming the sidewall SWt (see FIG. 13 described later).

At the side surfaces on the opposite sides of the gate electrode GEa and the film part FPa, there are formed the sidewalls SW formed of an insulation film, respectively. At the side surfaces on the opposite sides of the gate electrode GEs and the film part FPs, there are formed the sidewalls SW formed of an insulation film, respectively.

In the portions of the p type well PW2 on the still outer opposite sides of the gate electrode GEa including the sidewalls SW formed at the side surfaces on the opposite sides thereof, the source/drain regions SD of the amplification transistor AMI are formed in alignment with the gate electrode GEa. The source/drain regions have a LDD (Lightly Doped Drain) structure, and are each formed of an n type low concentration semiconductor region NM, namely, an n⁻ type semiconductor region NM, and an n type high concentration semiconductor regions NR, namely, an n⁺ type semiconductor regions NR. Whereas, at the upper surface of each n type high concentration semiconductor region NR, there is formed a silicide layer SIL formed of a metal silicide layer such as nickel silicide. Namely, in the upper layer part of each n type high concentration semiconductor region NR, there is formed the silicide layer SIL.

Incidentally, in the present specification, the source/drain region SD means a semiconductor region which is a source region or a drain region.

Further, in the portions of the p type well PW2 on the still outer opposite sides of the gate electrode GEs including the sidewalls SW formed at the side surfaces on the opposite sides thereof, the source/drain regions SD of the selection transistor SEL are formed in alignment with the gate electrode GEs. The source/drain regions SD have a LDD structure, and are each formed of an n type low concentration semiconductor region NM, and an n type high concentration semiconductor region NR. The selection transistor SEL and the amplification transistor AMI are coupled in series with each other, and hence have one source/drain region SD in common.

Over the p type well PW2 in the active region AcR, a gate electrode GEr is formed via a gate insulation film GOX1. The gate electrode GEr is the gate electrode of the reset transistor RST. Over the gate electrode GEr, there is formed a film part FPr. The film part FPr includes a film part FPr1 formed of a thick hard mask film HM1 (see FIG. 13 described later) as an insulation film and sidewalls SWr as sidewall parts each formed of a thin hard mask film HM2 formed at the side surfaces of the film part FPr1 (see FIG. 13 described later).

The hard mask film HM1 forming the film part FPr1 (see FIG. 13 described later) is an insulation film formed at the same layer as the hard mask film HM1 forming the film part FPt (see FIG. 13 described later). The hard mask film HM2 forming the sidewall SWr (see FIG. 13 described later) is an insulation film formed at the same layer as the hard mask film HM2 forming the sidewall SWt (see FIG. 13 described later). At the side surfaces on the opposite sides of the gate electrode GEr and the film part FPr, there are formed sidewalls SW.

Further, in the portions of the p type well PW2 on the still outer opposite sides of the gate electrode GEr including the sidewalls SW formed at the side surfaces on the opposite sides thereof, the source/drain regions SD are formed in alignment with the gate electrode GEr. The source/drain regions SD have a LDD structure, and are each formed of an n type low concentration semiconductor region NM, and an n type high concentration semiconductor region NR. Further, at the upper surface of the n type high concentration semiconductor region NR, there is formed a silicide layer SIL formed of a metal silicide layer such as nickel silicide. Namely, in the upper layer part of the n type high concentration semiconductor region NR, there is formed the silicide layer SIL.

Namely, the amplification transistor AMI has the gate electrode GEa, the source/drain regions SD, the film part FPa, and the silicide layers SIL respectively formed at the upper surfaces of the source/drain regions SD. Whereas, the selection transistor SEL has the gate electrode GEs, the source/drain regions SD, the film part FPs, and the silicide layers SIL respectively formed at the upper surfaces of the source/drain regions SD. Further, the reset transistor RST has the gate electrode GEr, the source/drain regions SD, the film'part FPr, and the silicide layers SIL respectively formed at the upper surfaces of the source/drain regions SD.

On the other hand, over the p type well PW3 in the active region AcH, a gate electrode GEH is formed via a gate insulation film GOX2. The gate electrode GEH is the gate electrode of the transistor LTH. At the side surfaces on the opposite sides of the gate electrode GEH, there are formed the sidewalls SW formed of an insulation film.

Further, over the p type well PW3 in the active region AcL, a gate electrode GEL is formed via a gate insulation film GOX3. The gate electrode GEL is the gate electrode of the transistor LTL. At the side surfaces on the opposite sides of the gate electrode GEL, there are formed the sidewalls SW formed of an insulation film.

The film thickness TH2 of the gate insulation film GOX2 (see FIG. 9 described later) is larger than the film thickness TH3 of the gate insulation film GOX3 (see FIG. 9 described later). As a result, the driving voltage of the transistor LTH can be set larger than the driving voltage of the transistor LTL. Incidentally, the film thickness TH1 of the gate insulation film GOX1 (see FIG. 9 described later) can be set equal to, for example, the film thickness TH2 of the gate insulation film GOX2 (see FIG. 9 described later).

Further, in the portions of the p type well PW3 on the still outer opposite sides of the gate electrode GEH including the sidewalls SW formed at the side surfaces on the opposite sides thereof, the source/drain regions SD are formed in alignment with the gate electrode GEH. Whereas, in the portions of the p type well PW3 on the still outer opposite sides of the gate electrode GEL including the sidewalls SW formed at the side surfaces on the opposite sides thereof, the source/drain regions SD are formed in alignment with the gate electrode GEL. The source/drain regions have a LDD structure, and are each formed of an n type low concentration semiconductor region NM and an n type high concentration semiconductor region NR.

Whereas, at the upper surface of the gate electrode GEH, the upper surface of the gate electrode GEL, and the upper surface of the n type high concentration semiconductor region NR, there are formed the silicide layers SIL each formed of a metal silicide layer such as nickel silicide. In other words, in the upper layer part of the gate electrode GEH, the upper layer part of the gate electrode GEL, and the upper layer part of the n type high concentration semiconductor region NR, there are formed the silicide layers SIL, respectively.

Namely, the transistor LTH has the gate electrode GEH, the source/drain regions SD, the silicide layer SIL formed at the upper surface of the gate electrode GEH, and the silicide layers SIL formed at the upper surfaces of the source/drain regions SD. Whereas, the transistor LTL has the gate electrode GEL, the source/drain regions SD, the silicide layer SIL formed at the upper surface of the gate electrode GEL, and the silicide layers SIL formed at the upper surfaces of the source/drain regions SD.

Incidentally, at the upper surface of the n type high concentration semiconductor region NR which is a floating diffusion FD, a silicide layer SIL may be formed. Namely, at the upper layer part of the n type high concentration semiconductor region NR which is a floating diffusion FD, a silicide layer SIL may be formed. Alternatively, at the surface of the n type high concentration semiconductor region NR which is a floating diffusion FD, a silicide layer need not be formed.

Whereas, at the upper surface of the gate electrode GEt of the transfer transistor TX, there is not formed a silicide layer. However, when the distance between the portion of the gate electrode GEt arranged over the p type wells PW1 and PW2 and the portion thereof to be coupled with a plug is short, the resistance between the portion of the gate electrode GEt arranged over the p type wells PW1 and PW2 and the portion thereof to be coupled with a plug is small. Therefore, even when a silicide layer is not formed at the upper surface of the gate electrode GEt of the transfer transistor TX, the gate electrode GEt and the plug can be coupled at a low resistance.

In the pixel region 1A, an interlayer insulation film IL1 is formed in such a manner as to cover the active region AcTP including the transfer transistor TX and the photodiode PD. In this case, the interlayer insulation film IL1 is formed over the film part FPt. Then, in the interlayer insulation film IL1, there is formed a plug PGt penetrating through the interlayer insulation film IL1, and reaching the n type high concentration semiconductor region NR which is the floating diffusion FD.

Further, in the pixel region 1A, the interlayer insulation film IL1 is formed in such a manner as to cover the active region AcAS including the amplification transistor AMI and the selection transistor SEL. In this case, the interlayer insulation film IL1 is formed over the film part FPa, and over the film part FPs. Then, in the interlayer insulation film IL1, there is formed a plug PGa penetrating through the interlayer insulation film IL1, and reaching the n type high concentration semiconductor region NR opposite to the gate electrode GEs across the gate electrode GEa. Further, in the interlayer insulation film IL1, there is formed a plug PGs penetrating through the interlayer insulation film IL1, and reaching the n type high concentration semiconductor region NR opposite to the gate electrode GEa across the gate electrode GEs.

Further, in the pixel region 1A, the interlayer insulation film IL1 is formed in such a manner as to cover the active region AcR including the reset transistor RST. In this case, the interlayer insulation film IL1 is formed over the film part FPr. Then, in the interlayer insulation film IL1, there are formed plugs PGr penetrating through the interlayer insulation film IL1, and reaching the n type high concentration semiconductor regions NR on the opposite sides of the gate electrode GEr. Incidentally, in FIG. 3, there is shown only the plug PGr reaching the n type high concentration semiconductor region NR on one side of the gate electrode GEr (the right-hand side of FIG. 3).

Further, in the peripheral circuit region 2A, an interlayer insulation film IL1 is formed in such a manner as to cover the active region AcH including the transistor LTH. In this case, between the silicide layer SIL formed at the upper surface of the gate electrode GEH and the interlayer insulation film IL1, there is not formed a film part formed of an insulation film formed at the same layer as the hard mask film HM1 forming the film part FPt (see FIG. 13 described later). Then, in the interlayer insulation film IL1, there are formed plugs PGH penetrating through the interlayer insulation film IL1, and reaching the n type high concentration semiconductor regions NR on the opposite sides of the gate electrode GEH. Incidentally, in FIG. 3, there is shown only the plug PGH reaching the n type high concentration semiconductor region NR on one side of the gate electrode GEH (the right-hand side of FIG. 3).

Whereas, in the peripheral circuit region 2A, an interlayer insulation film IL1 is formed in such a manner as to cover the active region AcL including the transistor LTL. In this case, between the silicide layer SIL formed at the upper surface of the gate electrode GEL and the interlayer insulation film IL1, there is not formed a film part formed of an insulation film formed at the same layer as the hard mask film HM1 forming the film part FPt (see FIG. 13 described later). Then, in the interlayer insulation film IL1, there are formed plugs PGL penetrating through the interlayer insulation film IL1, and reaching the n type high concentration semiconductor regions NR on the opposite sides of the gate electrode GEL. Incidentally, in FIG. 3, there is shown only the plug PGL reaching the n type high concentration semiconductor region NR on one side of the gate electrode GEL (the right-hand side of FIG. 3).

The interlayer insulation film IL1 is formed of a silicon oxide ($SiO_2$) film using, for example, TEOS (Tetra Ethyl Ortho Silicate) as a raw material. Whereas, as shown in FIG. 4, in the interlayer insulation film IL1, there are formed contact holes CHt, CHa, CHs, CHr, CHH, and CHL. In each of the contact holes CHt, CHa, CHs, CHr, CHH, and CHL, there are embedded a barrier conductor film formed of, for example, a titanium film and a titanium nitride film formed over the titanium film, and a main conductor film formed of a tungsten film formed over the barrier conductor film. As a result, the plugs, PGt, PGa, PGs, PGr, PGH, and PGL are respectively formed.

In the pixel region 1A and the peripheral circuit region 2A, over the interlayer insulation film IL1 including the plugs PGt, PGa, PGs, PGr, PGH, and PGL formed therein, as shown in FIG. 3, for example, an interlayer insulation film IL2 is formed. In the interlayer insulation film IL2, there is formed a wire M1. The plugs PGt, PGa, PGs, PGr, PGH, and PGL are coupled with the wire M1.

The interlayer insulation film IL2 is formed of, for example, a lamination film of a silicon nitride (SiN) film and a silicon oxide (SiO₂) film, but is not limited thereto, and can also be formed of, for example, a low dielectric constant film lower in dielectric constant than the silicon oxide film. Examples of the low dielectric constant film may include a carbon-containing silicon oxide (SiOC) film. Whereas, the wire M1 is formed of, for example, a copper wire, and can be formed by, for example, a damascene method. Incidentally, the wire M1 is not limited to a copper wire, and can also be formed of an aluminum wire.

Over the interlayer insulation film IL2 including the wire M1 formed therein, there is formed an interlayer insulation film IL3 formed of, for example, a silicon oxide film or a low dielectric constant film. In the interlayer insulation film IL3, there is formed a wire M2. Further, over the interlayer insulation film IL3 including the wire M2 formed therein, there is formed an interlayer insulation film IL4. In the interlayer insulation film IL4, there is formed a wire M3. The wires M1 to M3 form a wiring layer. The plugs PGt, PGa, PGs, PGr, PGH, and PGL are coupled by the wiring layer formed of the wires M1 to M3. As a result, it is possible to form the circuit shown in FIGS. 1 and 2.

Incidentally, the wires M1 to M3 are formed so as not to overlap the photodiode in a plan view. This is for preventing a light incident upon the photodiode from being blocked by the wires M1 to M3.

Further, in the pixel region 1A, over the interlayer insulation film IL4 including the wire M3 formed therein, there is mounted a microlens ML. Incidentally, as shown in FIG. 3, between the microlens ML and the interlayer insulation film IL4, a passivation film PF and a color filter CL may be formed sequentially from the semiconductor substrate 1S side. At this step, as shown in FIG. 3, also in the peripheral circuit region 2A, over the interlayer insulation film IL4, there may be provided the passivation film PF.

In FIG. 3, when a light is applied to the pixel PU (see FIG. 1), first, the incident light passes through the microlens ML. Then, the light passes through the interlayer insulation films IL4 to IL1 transparent to a visible light, and then, is made incident upon the antireflection film ARF. At the antireflection film ARF, the reflection of the incident light is suppressed, so that a sufficient light quantity of incident light is made incident upon the photodiode PD. In the photodiode PD, the energy of the incident light is larger than the bandgap of silicon. For this reason, the incident light is absorbed by photoelectric conversion, resulting in the formation of hole electron pairs. The electrons formed at this step are accumulated in the n type well NW.

Then, at a proper timing, the transfer transistor TX is turned ON. Specifically, the gate electrode GEt of the transfer transistor TX is applied with a voltage equal to, or larger than the threshold voltage. Then, in the portions of the p type well PW1 and PW2 under the gate insulation film GOX1, there is formed a channel region. This results in an electrical conduction between the n type well NW which is the source region of the transfer transistor TX and the n type high concentration semiconductor region NR which is the drain region of the transfer transistor TX. As a result, the electrons accumulated in the n type well NW pass through the channel region, reaches the drain region, and are extracted from the drain region to the outside through the wiring layer.

<Method for Manufacturing a Semiconductor Device>

Figure 5:
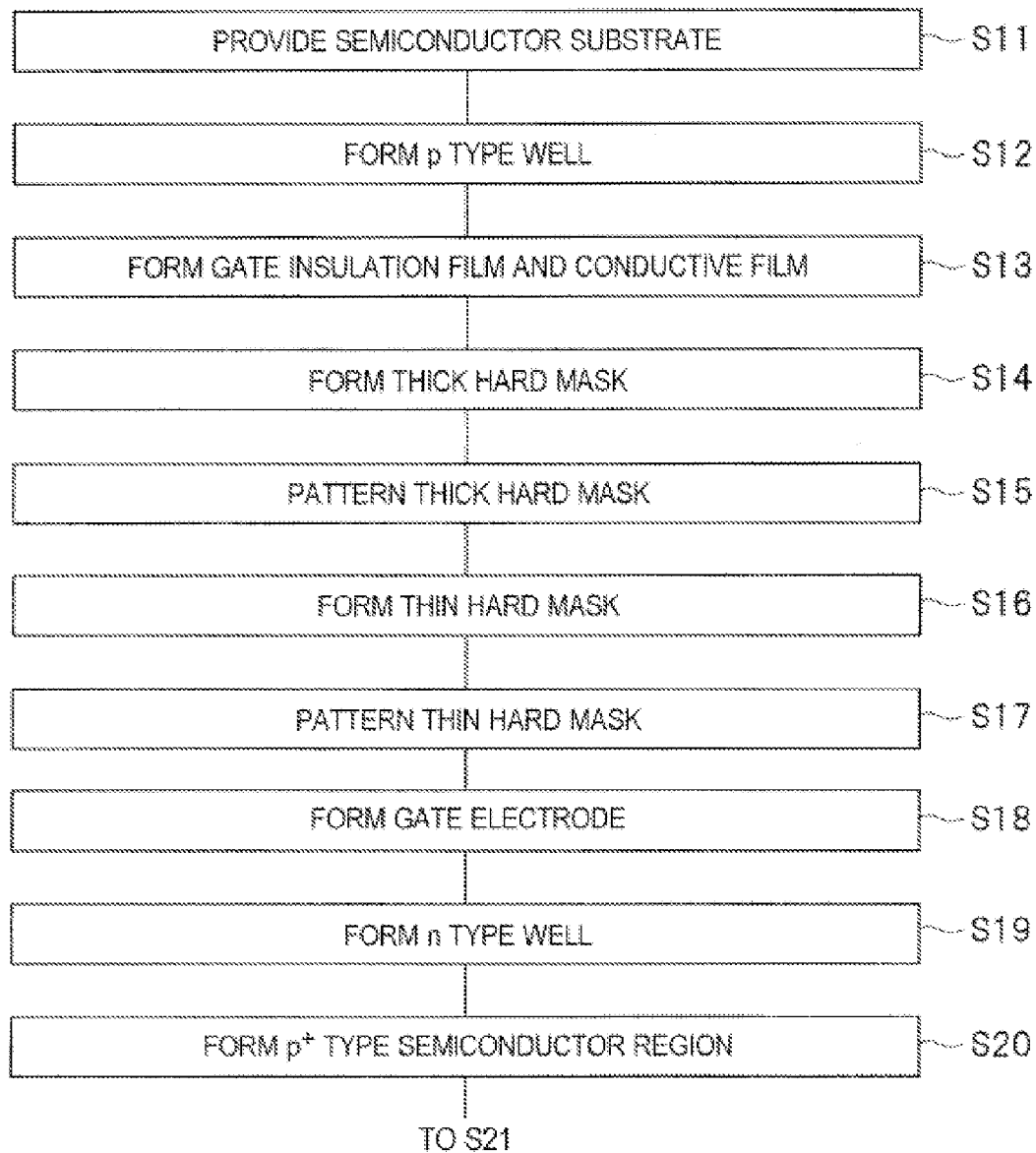
FIG. 5 is a manufacturing process flowchart showing some of the manufacturing steps of the semiconductor device of First Embodiment.
Figure 6:
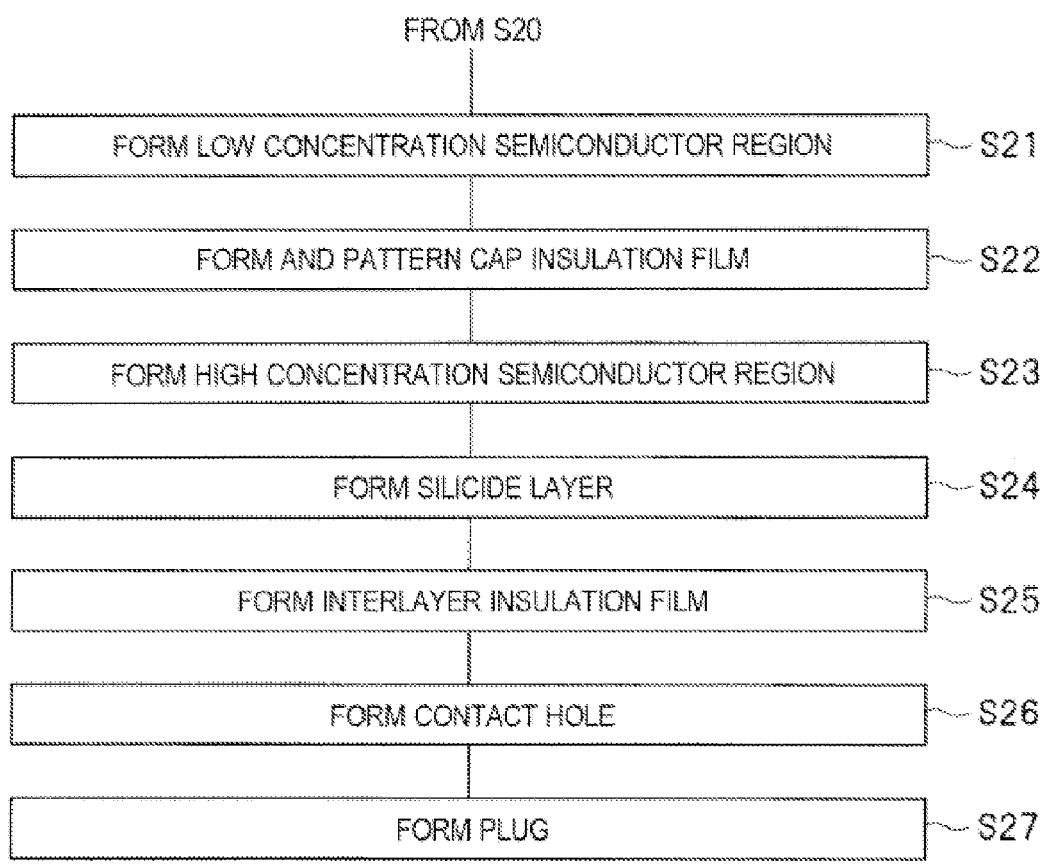
FIG. 6 is a manufacturing process flowchart showing others of the manufacturing steps of the semiconductor device of First Embodiment.

Then, a description will be given to a manufacturing method of the semiconductor device of the present First Embodiment. FIGS. 5 and 6 are each a manufacturing process flowchart showing some of the manufacturing steps of the semiconductor device of First Embodiment. FIGS. 7 to 22 are each a cross sectional view showing the semiconductor device of First Embodiment during a manufacturing step. Incidentally, in FIGS. 7 to 22, the manufacturing steps in the pixel region 1A and the manufacturing steps in the peripheral circuit region 2A are shown together.

Figure 7:
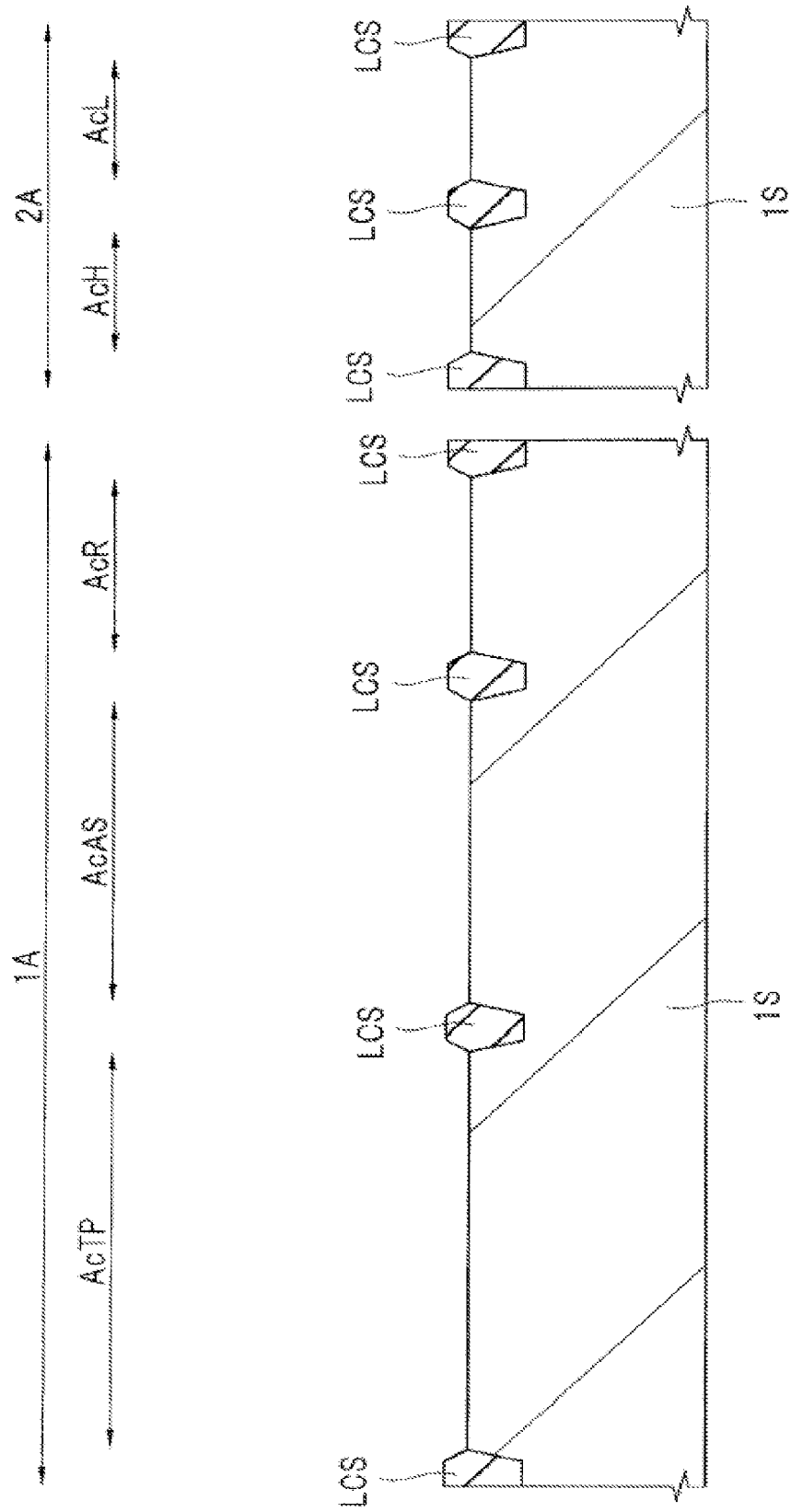
FIG. 7 is across sectional view showing the semiconductor device of First Embodiment during a manufacturing step.

First, as shown in FIG. 7, a semiconductor substrate 1S is provided (Step S11 of FIG. 5). In the Step S11, first, as the semiconductor substrate 1S, there is provided an n type single crystal silicon substrate containing n type impurities such as phosphorus (P) or arsenic (As).

Then, in the semiconductor substrate 1S, there is formed an element isolation region LCS. The element isolation region LCS is formed of a thermal oxide film. For example, in the semiconductor substrate 1S, regions to be active regions such as the active regions AcTP, AcAS, AcR, AcH, and AcL are covered with a silicon nitride (SiN) film, and are thermally oxidized, thereby to form element isolation regions LCS each formed of an insulation member such as a silicon oxide (SiO₂) film. Such an element isolation method is referred to as a LOCOS (Local oxidation of silicon) method. The element isolation regions LCS define, namely, form the active regions such as the active regions AcTP, AcAS, AcR, AcH, and AcL. The active regions AcTP, AcAS, and AcR are formed in the pixel region 1A, and the active regions AcH and AcL are formed in the peripheral circuit region 2A.

Incidentally, the element isolation regions may be formed by using the STI (Shallow Trench Isolation) method in place of the LOCOS method. In this case, the element isolation region is formed of an insulation member embedded in the trench in the semiconductor substrate 1S. For example, using the silicon nitride film as a mask, the semiconductor substrate 1S is etched, thereby to form an isolation trench. Then, an insulation film such as a silicon oxynitride film is embedded in the inside of the isolation trench, thereby to form an element isolation region.

Figure 8:
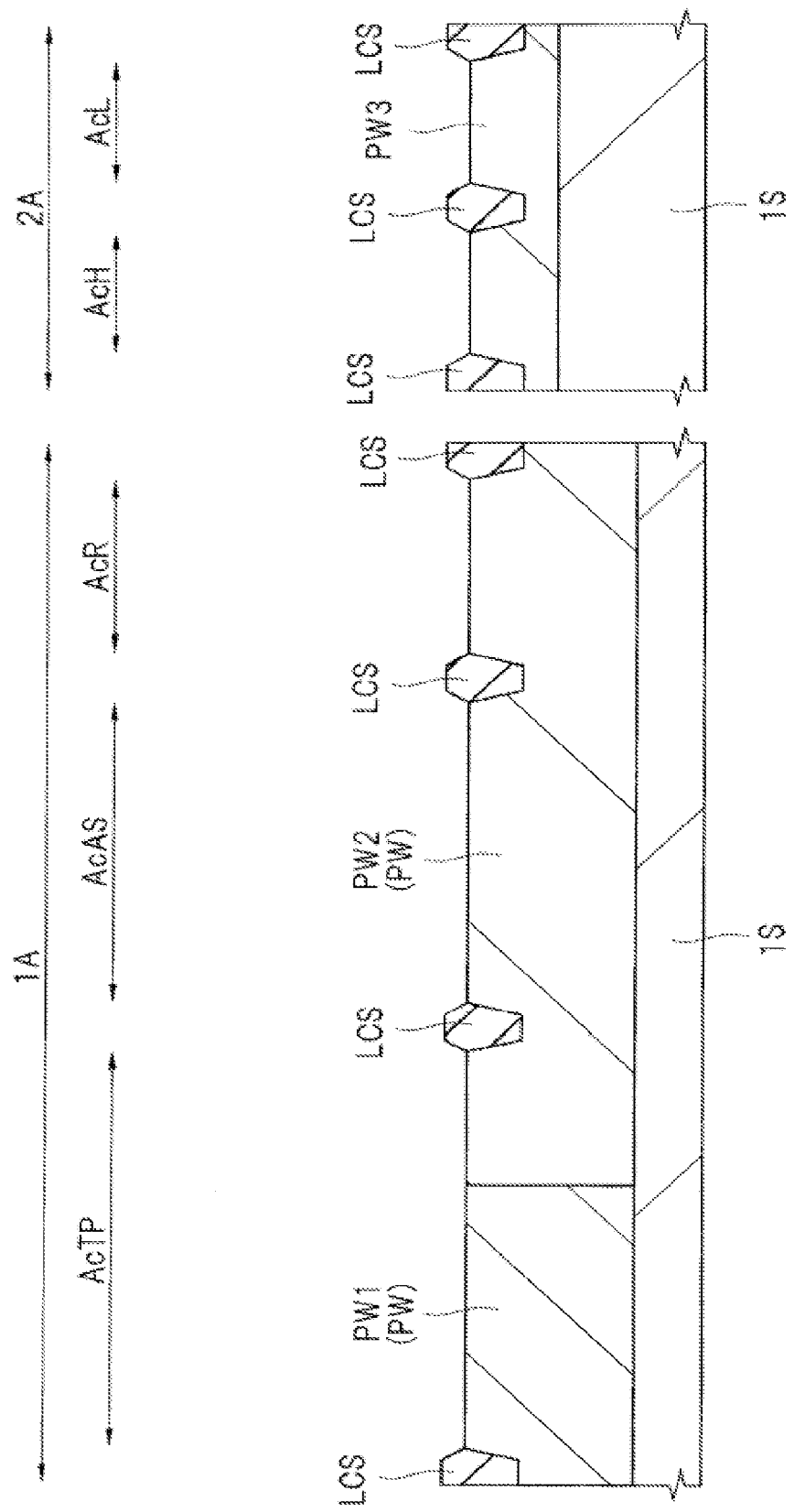
FIG. 8 is a cross sectional view showing the semiconductor device of First Embodiment during a manufacturing step.

Then, as shown in FIG. 8, the p type wells PW1, PW2, and PW3 are formed (Step S12 of FIG. 5). In the Step S12, in the pixel region 1A, in one portion (the portion on the left-hand side of FIG. 8) of the active region AcTP, there is formed the p type well PW1. Whereas, in Step S12, in the pixel region 1A, in the other portion (the portion on the right-hand side of FIG. 8) of the active region AcTP, and the active regions AcAS and AcR, there is formed the p type well PW2. Further, in Step S12, in the peripheral circuit region 2A, in the active regions AcH and AcL, there is formed the p type well PW3.

In the Step S12, by using the photolithography technology and the ion implantation method, in the active regions AcTP, AcAS, and AcR, and the active regions AcH and AcL, p type impurities such as boron (B) are doped into the semiconductor substrate 1S. As a result, in the pixel region 1A and the peripheral circuit region 2A, the p type wells PW1, PW2, and PW3 are formed. The conductivity type of the p type wells PW1, PW2, and PW3 is p type, and is the opposite conductivity type to n type which is the conductivity type of the semiconductor substrate 1S.

The p type impurity concentration in each of the p type wells PW1, PW2, and PW3 has no particular restriction, and can be set at a given value. Further, the p type impurity concentration in the p type well PW3 of the active region AcH can be set different from the p type impurity concentration in the p type well PW3 of the active region AcL.

Figure 9:
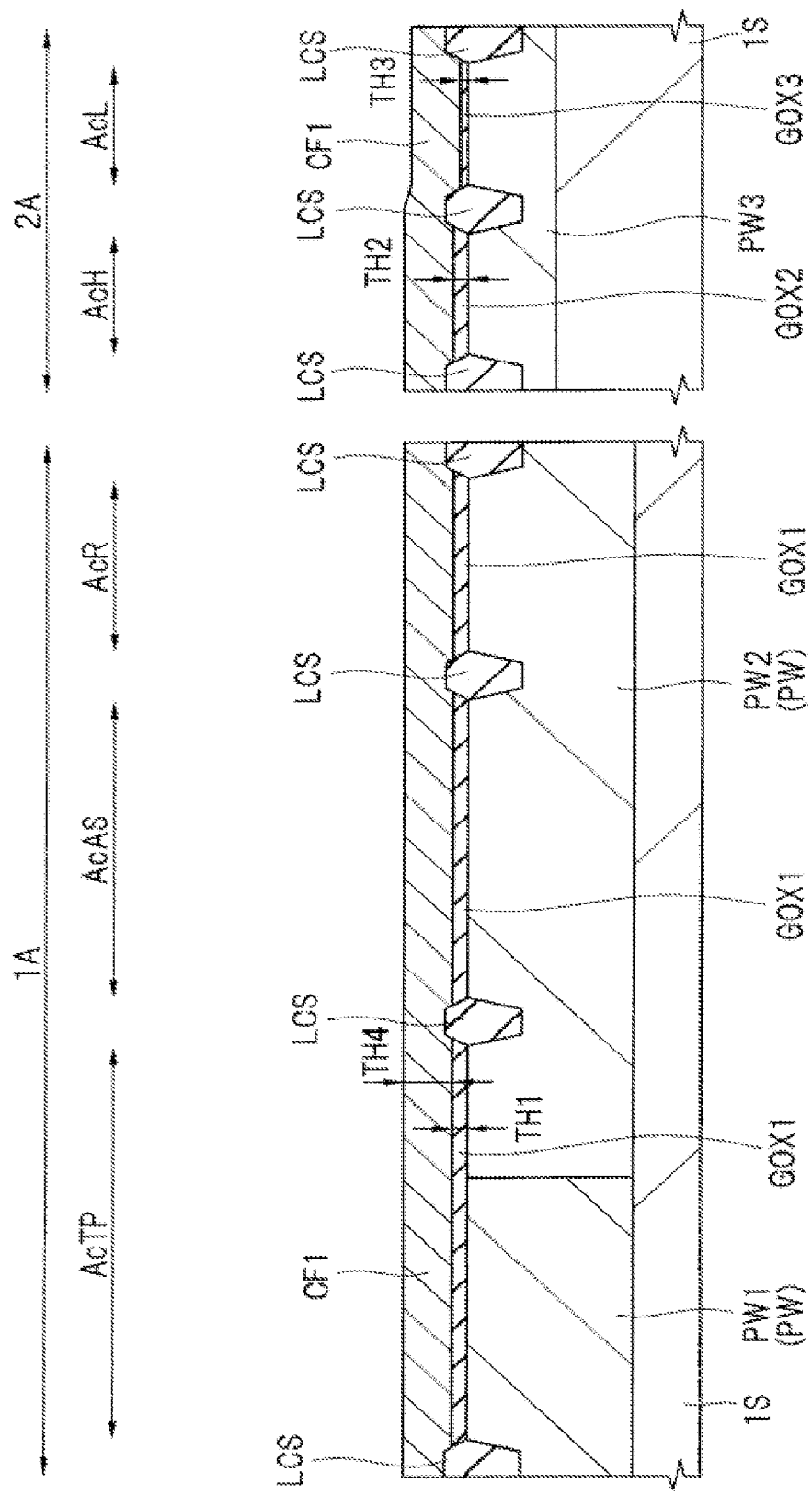
FIG. 9 is a cross sectional view showing the semiconductor device of First Embodiment during a manufacturing step.

Then, as shown in FIG. 9, the gate insulation films GOX1, GOX2, and GOX3, and a conductive film CF1 are formed (Step S13 of FIG. 5). In the Step S13, first, the semiconductor substrate 1S is thermally oxidized. As a result, in the pixel region 1A, in respective upper surfaces of the p type wells PW1 and PW2, there is formed a gate insulation film GOX1 formed of a silicon oxide ($SiO_2$) film, and having a film thickness TH1. Further, the semiconductor substrate 1S is thermally oxidized. As a result, in the peripheral circuit region 2A, at the upper surface of the p type well PW3 in the active region AcH, there is formed a gate insulation film GOX2 formed of a silicon oxide film, and having a film thickness TH2. Further, the semiconductor substrate 1S is thermally oxidized. As a result, in the peripheral circuit region 2A, at the upper surface of the p type well PW3 in the active region AcL, there is formed a gate insulation film GOX3 formed of a silicon oxide film, and having a film thickness TH3.

The film thickness TH2 of the gate insulation film GOX2 is larger than the film thickness TH3 of the gate insulation film GOX3. As a result, the driving voltage of transistor LTH (see FIG. 19 described later) can be set larger than the driving voltage of the transistor LTL (see FIG. 19 described later).

Incidentally, the film thickness TH1 of the gate insulation film GOX1 can be set equal to, for example, the film thickness TH2 of the gate insulation film GOX2.

As the gate insulation films GOX1, GOX2, and GOX3, there may be used silicon nitride (SiN) films, silicon oxynitride (SiON) films, or the like. Alternatively, there may be used so-called high dielectric constant films such as hafnium type insulation films obtained by doping a hafnium oxide ($HfO_2$) film with lanthanum oxide ($La_2O_3$), namely, films higher in dielectric constant than a silicon nitride film. The films can be formed using, for example, a CVD (Chemical Vapor Deposition) method.

Then, as shown in FIG. 9, over the gate insulation films GOX1, GOX2, and GOX3, as a conductive film CF1, for example, a polycrystal silicon film is formed using a CVD method or the like.

Figure 10:
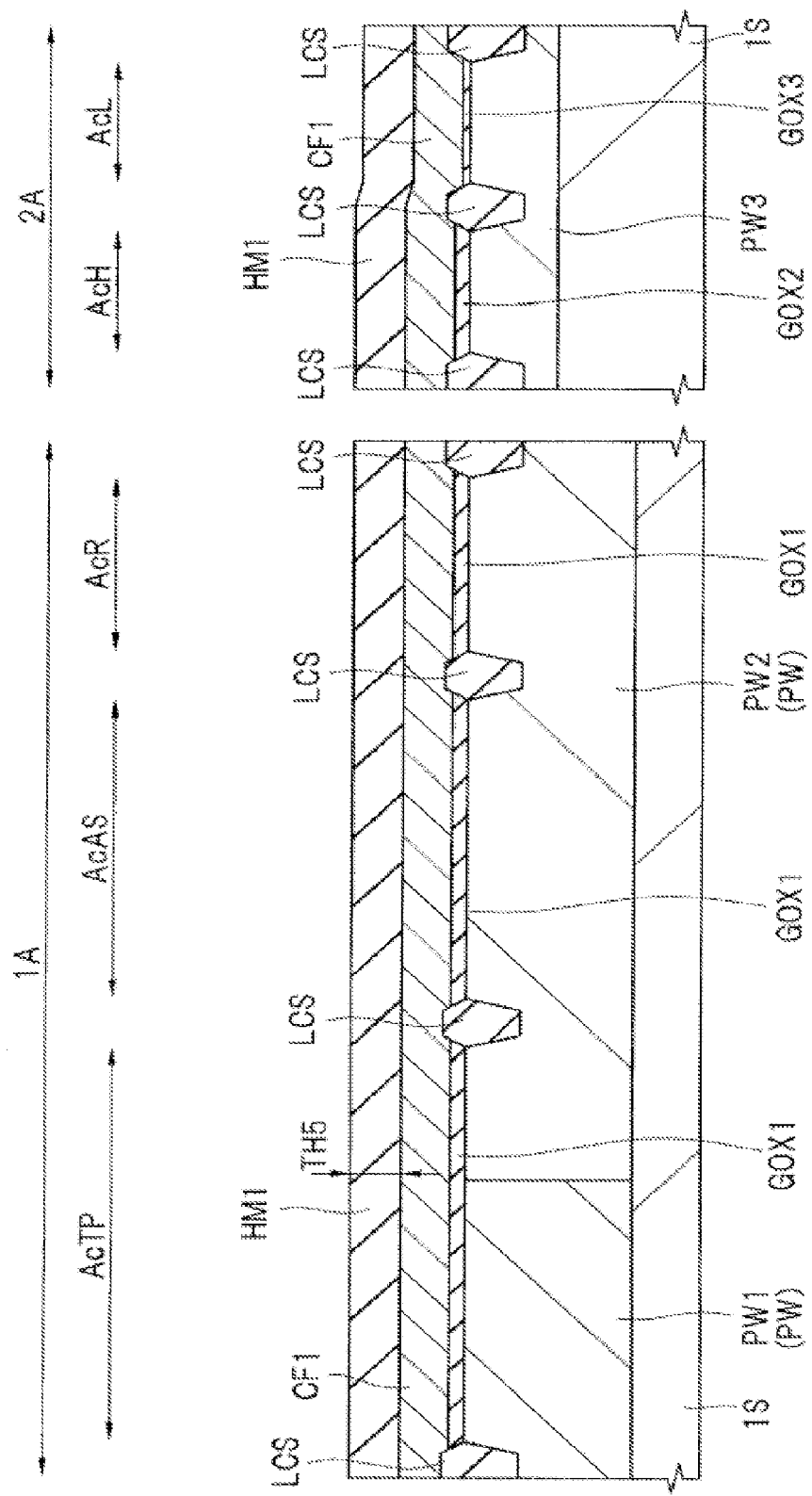
FIG. 10 is a cross sectional view showing the semiconductor device of First Embodiment during a manufacturing step.

Then, as shown in FIG. 10, there is formed a thick hard mask film HM1 (Step S14 of FIG. 5). In the Step S14, in the pixel region 1A and the peripheral circuit region 2A, over the conductive film CF1, the hard mask film HM1 as an insulation film is formed by, for example, a CVD method. The thickness TH5 of the hard mask film HM1 is larger than the film thickness TH6 of the hard mask film HM2 (see FIG. 12 described later).

Preferably, as the hard mask film HM1, there can be formed an insulation film which is a monolayer film formed of one, or a lamination film formed of two or more of a silicon oxide ($SiO_2$) film, a silicon nitride (SiN) film, and a silicon oxynitride (SiON) film. In the present First Embodiment in which the film part FPt formed of the hard mask film HM1 (see FIG. 15 described later) is used as the mask for doping impurity ions, as compared with the case using, for example, a resist film in place of the film part FPt, it is possible to prevent or inhibit the film part FPt from being altered or modified.

Further preferably, as the hard mask film HM1, a silicon oxide film can be formed. As a result, even when the hard mask film HM1 is thick, the hard mask film HM1 can be patterned with ease.

Figure 11:
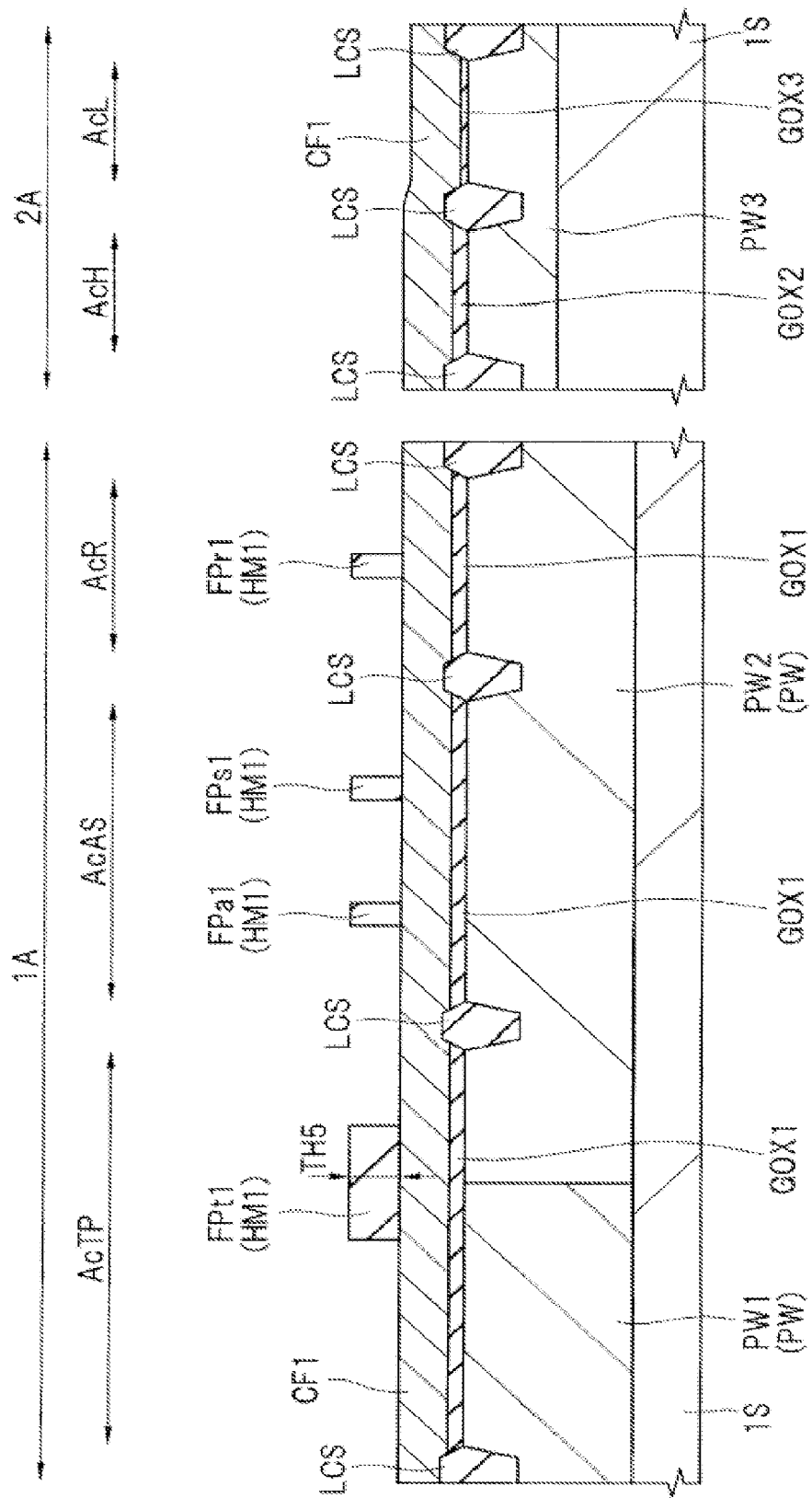
FIG. 11 is a cross sectional view showing the semiconductor device of First Embodiment during a manufacturing step.

Then, as shown in FIG. 11, the thick hard mask film HM1 is patterned (Step S15 of FIG. 5). In the Step S15, in the pixel region 1A, the thick hard mask film HM1 is patterned. As a result, the film parts FPt1, FPa1, FPs1, and FPr1 each formed of the thick hard mask film HM1 are formed, and in the peripheral circuit region 2A, the thick hard mask film HM1 is removed.

Specifically, over the thick hard mask film HM1, a photoresist film (not shown) is formed, and is subjected to exposure and development treatments using a photolithography technology. The photoresist film is also referred to as a resist film. As a result, in the peripheral circuit region 2A, the photoresist film is not left. However, in the pixel region 1A, the photoresist film is left in regions in which the film parts FPt1, FPa1, FPs1, and FPr1 are formed.

Then, using the photoresist film as a mask, the thick hard mask film HM1 is etched. As a result, in the pixel region 1A, over the active region AcTP, over the conductive film CF1, the thick hard mask film HM1 is left, thereby to form the film part FPt1. Whereas, in the pixel region 1A, over the active region AcAS, over the conductive film CF1, the thick hard mask film HM1 is left, thereby to form the film parts FPa1 and FPs1. Further, in the pixel region 1A, over the active region AcR, over the conductive film CF1, the thick hard mask film HM1 is left, thereby to form the film part FPr1. Then, the photoresist film is removed by ashing or the like. Such a step from the formation to the removal of the photoresist film is referred to as patterning.

Further, the film part FPt1 is formed continuously from over the p type well PW1 to over the p type well PW2 in the active region AcTP.

Figure 12:
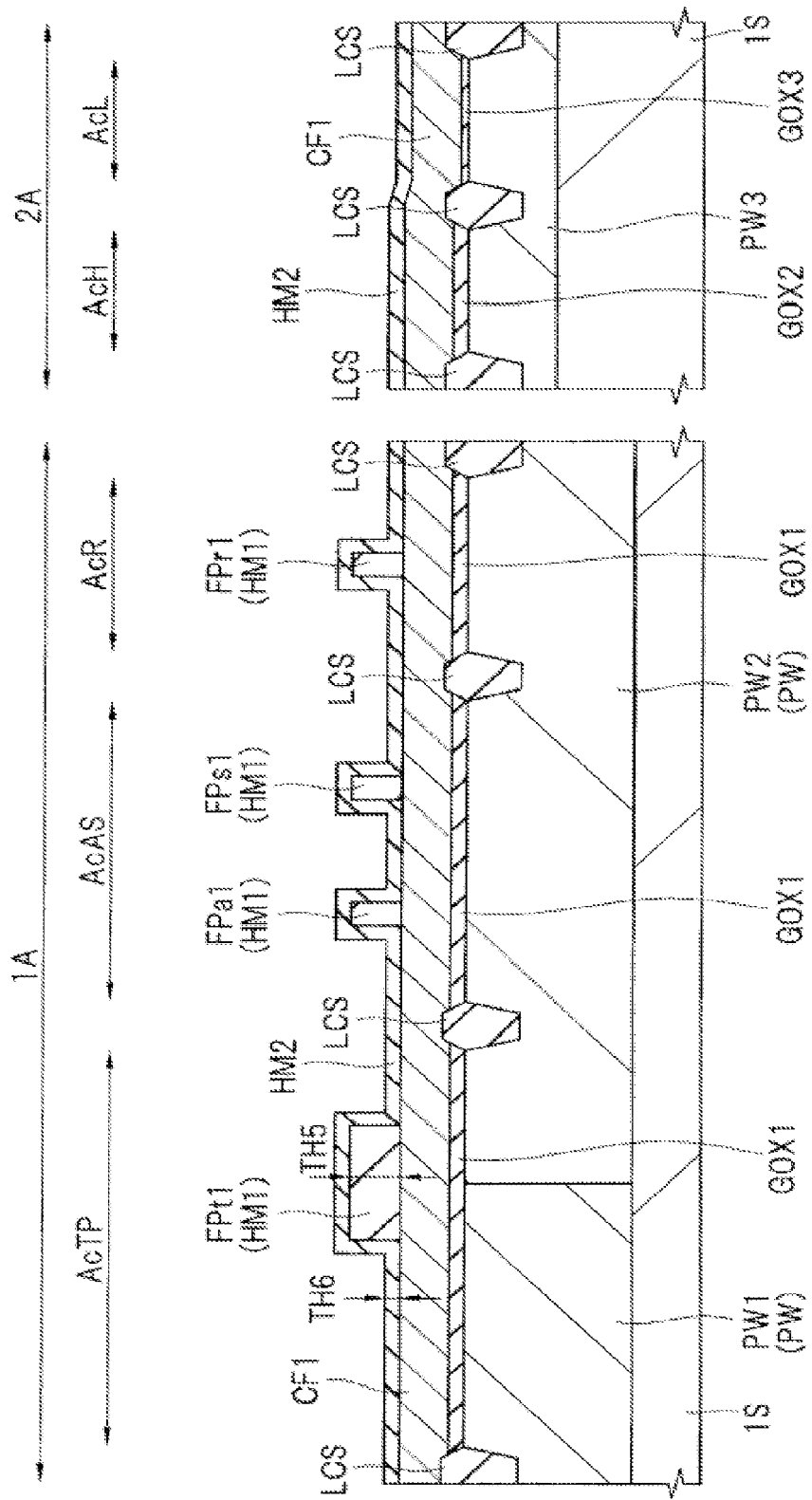
FIG. 12 is a cross sectional view showing the semiconductor device of First Embodiment during a manufacturing step.

Then, as shown in FIG. 12, a thin hard mask film HM2 is formed (Step S16 of FIG. 5). In the Step S16, in the pixel region 1A and the peripheral circuit region 2A, over the conductive film CF1 including over the film part FPt1, over the film part FPa1, over the film part FPs1, and over the film part FPr1, the hard mask film HM2 as an insulation film is formed by, for example, a CVD method. The film thickness TH6 of the hard mask film HM2 is smaller than the film thickness TH5 of the hard mask film HM1.

As the hard mask film HM2, there can be formed an insulation film which is a monolayer film formed of one, or a lamination film formed of two or more of a silicon oxide ($SiO_2$) film, a silicon nitride (SiN) film, and a silicon oxynitride (SiON) film.

Whereas, the film thickness TH5 of the hard mask film HM1 is, for example, about 200 to 300 nm, and the film thickness TH6 of the hard mask film HM2 is, for example, about 20 nm.

Figure 13:
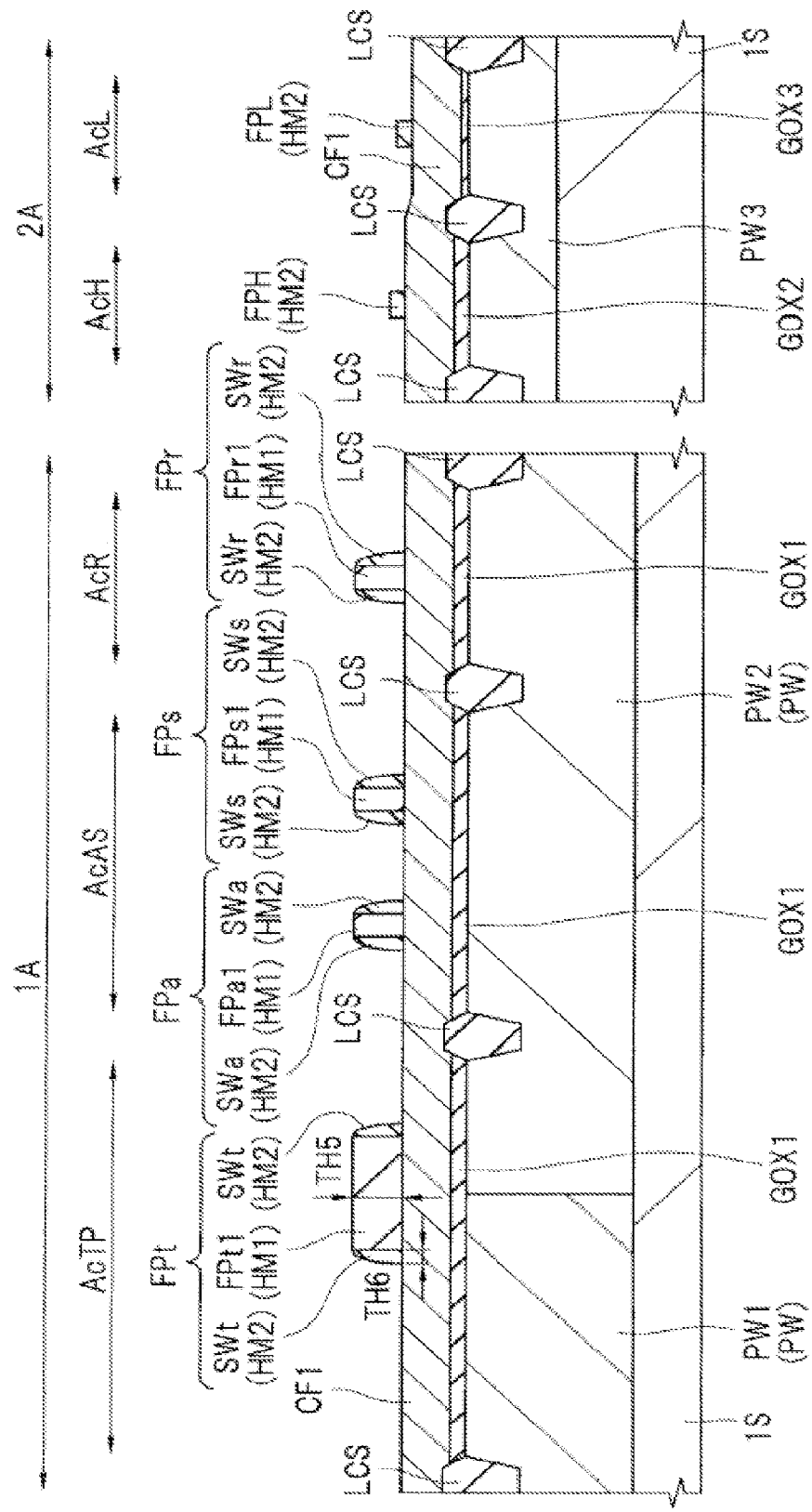
FIG. 13 is a cross sectional view showing the semiconductor device of First Embodiment during a manufacturing step.

Then, as shown in FIG. 13, the thin hard mask film HM2 is patterned (Step S17 of FIG. 5). In the Step S17, in the peripheral circuit region 2A, the thin hard mask film HM2 is patterned, thereby to form the film parts FPH and FPL formed of the thin hard mask film HM2.

Specifically, over the thin hard mask film HM2, the photoresist film (not shown) is formed, and is subjected to exposure and development treatments using a photolithography technology. As a result, in the pixel region 1A, the photoresist film is not left. However, in the peripheral circuit region 2A, the photoresist film is left in regions in which the film parts FPH and FPL are formed. Then, using the photoresist film as a mask, the thin hard mask film HM2 is etched. As a result, in the peripheral circuit region 2A, over the conductive film CF1, the thin hard mask film HM2 is left, thereby to form the film parts FPH and FPL.

At this step, in the pixel region 1A, the thin hard mask film HM2 is etched back. As a result, over the active region AcTP, at the side surfaces of the film part FPt1, the thin hard mask film HM2 is left, thereby to form sidewalls SWt. Thus, over the conductive film CF1, there is formed a film part FPt formed of the film part FPt1 and the sidewalls SWt.

Further, over the active region AcAS, at the side surfaces of the film part FPa1, the thin hard mask film HM2 is left, thereby to form sidewalls SWa. Thus, over the conductive film CF1, there is formed a film part FPa formed of the film part FPa1 and the sidewall SWa. Further, over the active region AcAS, at the side surfaces of the film part FPs1, the thin hard mask film HM2 is left, thereby to form sidewalls SWs. Thus, over the conductive film CF1, there is formed a film part FPs formed of the film part FPs1 and the sidewalls SWs. Further, over the active region AcR, at the side surfaces of the film part FPr1, the thin hard mask film HM2 is left, thereby to form sidewalls SWr. Thus, over the conductive film CF1, there is formed a film part FPr formed of the film part FPr1 and the sidewalls SWr.

Incidentally, in the pixel region 1A, at respective side surfaces of each of the film parts FPt1, FPa1, FPs1, and FPr1, the thin hard mask film HM2 need not be left. Then, in the pixel region 1A, there may be formed the film part FPt formed of only the film part FPt1, the film part FPa formed of only the film part FPa1, the film part FPs formed of only the film part FPs1, and the film part FPr formed of only the film part FPr1.

Further, the film part FPt is formed continuously from over the p type well PW1 to over the p type well PW2.

Figure 14:
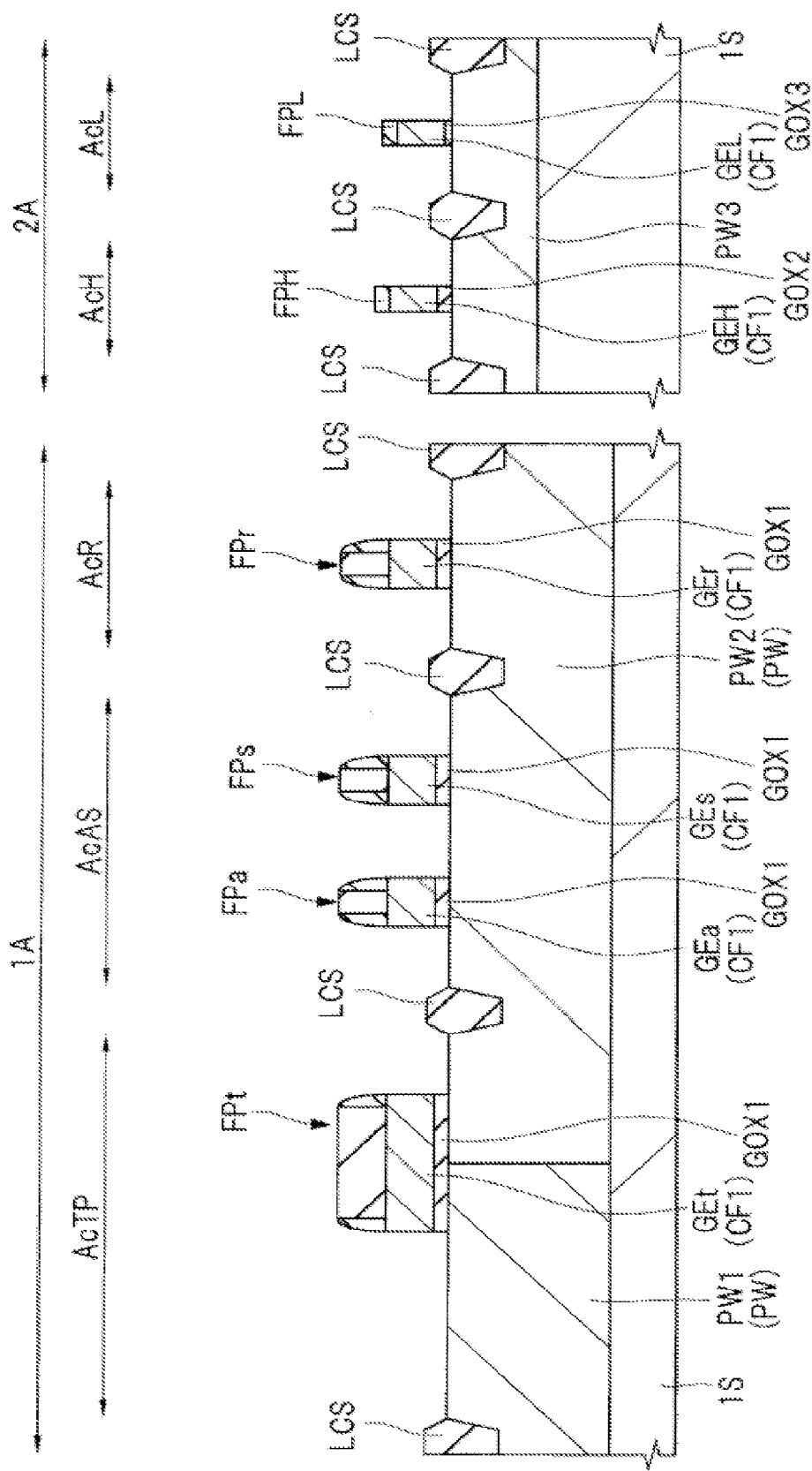
FIG. 14 is a cross sectional view showing the semiconductor device of First Embodiment during a manufacturing step.

Then, as shown in FIG. 14, the gate electrodes GEt, GEa, GEs, GEr, GEH, and GEL are formed (Step S18 of FIG. 5). In the Step S18, in the pixel region 1A, the gate electrodes GEt, GEa, GEs, and GEr are formed. In the peripheral circuit region 2A, the gate electrodes GEH and GEL are formed.

Specifically, using the film parts FPt, FPa, FPs, and FPr, and the film parts FPH and FPL as a mask, the conductive film CF1, and the gate insulation films GOX1, GOX2, and GOX3 are etched.

At this step, in the pixel region 1A, the portions of the conductive film CF1 and the gate insulation film GOX1 not covered with any of the film parts FPt, FPa, FPs, and FPr are removed. As a result, the portions of the conductive film CF1 and the gate insulation film GOX1 covered with the film part FPt are left. As a result, over the active region AcTP, the gate electrode GEt formed of the conductive film CF1 is formed via the gate insulation film GOX1.

Whereas, the portions of the conductive film CF1 and the gate insulation film GOX1 covered with the film part FPa are left. As a result, over the active region AcAS, the gate electrode GEa formed of the conductive film CF1 is formed via the gate insulation film GOX1. Then, the portions of the conductive film CF1 and the gate insulation film GOX1 covered with the film part FPs are left. As a result, over the active region AcAS, the gate electrode GEs formed of the conductive film CF1 is formed via the gate insulation film GOX1. Further, the portions of the conductive film CF1 and the gate insulation film GOX1 covered with the film part FPr are left. As a result, over the active region AcR, the gate electrode GEr formed of the conductive film CF1 is formed via the gate insulation film GOX1.

On the other hand, in the peripheral circuit region 2A, the portions of the conductive film CF1, and the gate insulation films GOX2 and GOX3 not covered with any of the film parts FPH and FPL are removed. As a result, the portions of the conductive film CF1 and the gate insulation film GOX2 covered with the film part FPH are left. Accordingly, over the active region AcH, the gate electrode GEH formed of the conductive film CF1 is formed via the gate insulation film GOX2. Whereas, the portions of the conductive film CF1 and the gate insulation film GOX3 covered with the film part FPL are left. As a result, over the active region AcL, the gate electrode GEL formed of the conductive film CF1 is formed via the gate insulation film GOX3.

Incidentally, the gate electrode GEt is formed continuously from over the p type well PW1 to over the p type well PW2.

Figure 15:
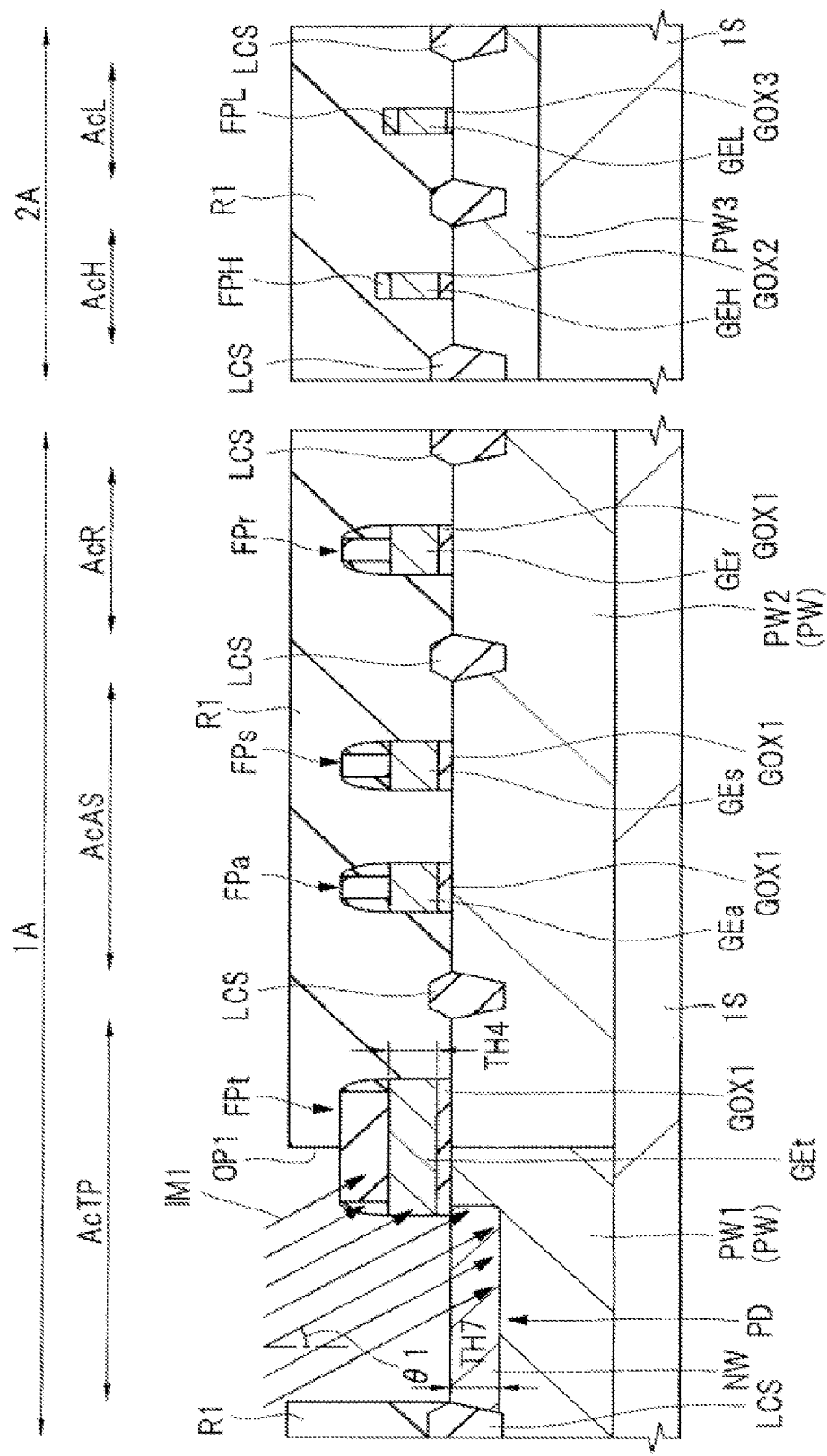
FIG. 15 is a cross sectional view showing the semiconductor device of First Embodiment during a manufacturing step.

Then, as shown in FIG. 15, the n type well NW is formed (Step S19 of FIG. 5). In the Step S19, in the pixel region 1A, of the active region AcTP, in the inside of the p type well PW1 arranged on one side of the gate electrode GEt (the right-hand side of FIG. 15), the n type well NW is formed by an ion implantation method.

For example, in the pixel region 1A and the peripheral circuit region 2A, over the semiconductor substrate 1S, a photoresist film R1 is formed, and is subjected to exposure and development treatments using a photolithography technology. As a result, in the pixel region 1A, there is formed an opening OP1 penetrating through the photoresist film R1, and reaching a portion arranged on one side (the left-hand side of FIG. 15) of the gate electrode GEt, namely, the p type well PW1 in the active region AcTP. Then, in the pixel region 1A, the p type well PW1 which is the portion of the active region AcTP in which the n type well NW is formed is exposed at the bottom of the opening OP1.

On the other hand, in the pixel region 1A, the p type well PW2 which is the portion of the active region AcTP in which the n type well NW is not formed, and the p type well PW2 of the active regions AcAS and AcR are covered with the photoresist film R1 so as to be prevented from being doped with n type impurity ions. Whereas, in the peripheral circuit region 2A, the p type well PW3 of the active regions AcH and AcL is covered with the photoresist film R1 so as not to be doped with n type impurity ions.

Thus, using the photoresist film R1 including the opening OP1 formed therein as a mask, n type impurity ions IM1 are doped. As a result, as shown in FIG. 15, n type impurity ions IM1 are doped into the upper layer part of the p type well PW1, thereby to form the n type well NW. Namely, in the inside of the p type well PW1, there is formed the n type well NW. The pn junction between the p type well PW1 and the n type well NW forms the photodiode PD.

Preferably, the direction in which the n type impurity ions IM1 are exposed is tilted at an angle θ1 with respect to the normal direction to the main surface of the semiconductor substrate 1S so that the n type impurity ions IM1 are exposed to the side surface on the photodiode PD side of the gate electrode GEt. The angle θ1 is, for example, about 30°. Incidentally, the n type impurity ions IM1 may be doped twice by vertical ion implantation and oblique ion implantation by an angle θ1. The angle for the vertical ion implantation is preferably in the range of 0° to 7°.

When the impurity ions IM1 are doped in the direction in parallel with the normal direction to the main surface of the semiconductor substrate 1S, it is difficult to form the n type well NW in such a manner as to overlap the gate electrode GEt in a plan view unless the doping depth of the impurity ions IM1 is a very large value.

On the other hand, a consideration will be given to the case where the impurity ions IM1 are doped in a direction tilted in the normal direction to the main surface of the semiconductor substrate 1S so that the n type impurity ions IM1 are applied to the side surface on the photodiode PD side of the gate electrode GEt. In this case, even when the doping depth of the impurity ions IM1 is not a very large value, the n type well NW can be formed in such a manner as to overlap the gate electrode GEt in a plan view. Thus, a part of the n type well NW and the gate electrode GEt overlap each other in a plan view. This allows the n type well NW to also function as the source region of the transfer transistor TX (see FIG. 19 described later).

In the present First Embodiment, when, for example, n type impurity ions are doped in order to form the photodiode PD, the n type impurity ions are doped in self-alignment with the gate electrode GEt covered with the film part FPt. This makes it difficult for the impurity ions to penetrate through the gate electrode GEt, and to be doped into the gate insulation film GOX1 and the p type well PW1 under the gate electrode GEt. For this reason, n type impurity ions can be doped to a position deep from the upper surface of the p type well PW1. Accordingly, the n type well NW can be formed at a position deep from the upper surface of the p type well PW1. As a result, it is possible to prevent or inhibit the reduction of the number of saturated electrodes in the photodiode PD. This can reduce the frequency of the formation of white points with no light applied thereto, namely, the formation of pixel defects.

The distance TH7 from the upper surface of the semiconductor substrate 1S to the lower surface of the n type well NW may be larger than the film thickness TH4 of the gate electrode GEt. Even in such a case, in accordance with the present First Embodiment, when, for example, n type impurity ions are doped in order to form the n type well NW, the impurity ions can be prevented or inhibited from penetrating through the gate electrode GEt, and being doped into the gate insulation film GOX1 and the p type well PW1 under the gate electrode GEt. Incidentally, the film thickness TH4 of the gate electrode GEt is, for example, about 200 nm.

Preferably, the opening OP1 is formed in consideration of the alignment precision for exposure so that the portion of the p type well PW1 adjacent to the gate electrode GEt is exposed at the bottom of the opening OP1 with reliability in a plan view. Namely, the opening OP1 is formed in such a manner as to penetrate through the photoresist film R1, and to reach the end on one side (the left-hand side of FIG. 15) of the film part FPt. As a result, in a plan view, into the upper layer portion at the portion of the p type well PW1 adjacent to the gate electrode GEt, n type impurity ions can be doped with reliability to form the n type well NW.

Figure 16:
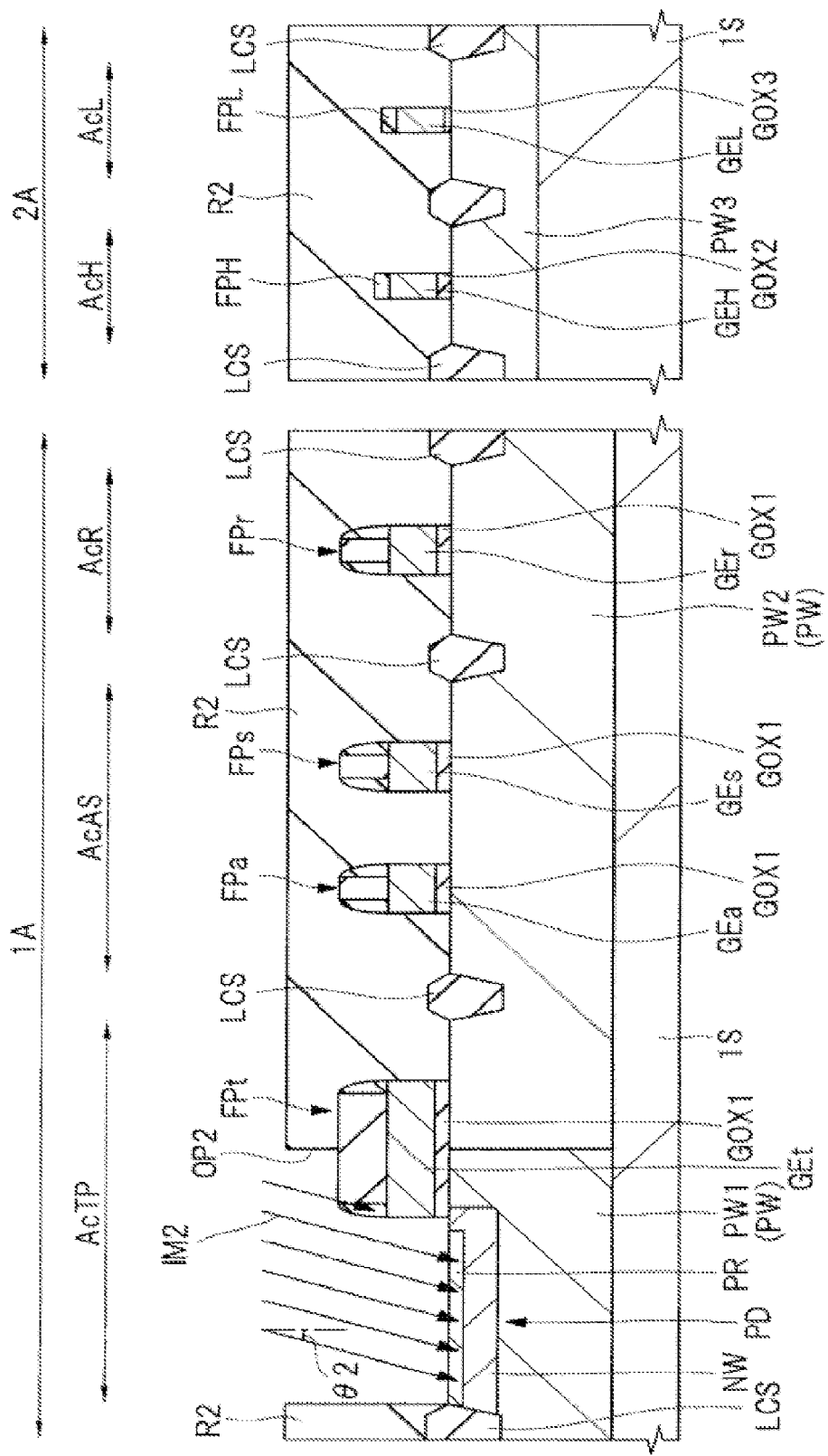
FIG. 16 is a cross sectional view showing the semiconductor device of First Embodiment during a manufacturing step.

Then, as shown in FIG. 16, a $p^+$ type semiconductor region PR is formed (Step S20 of FIG. 5). In the Step S20, at the upper layer part of the n type well NW, there is formed the $p^+$ type semiconductor region PR.

For example, in the pixel region 1A and the peripheral circuit region 2A, over the semiconductor substrate 1S, a photoresist film R2 is formed, and is subjected to exposure and development treatments using a photolithography technology. As a result, in the pixel region 1A, there is formed an opening OP2 penetrating through the photoresist film R2, and reaching the n type well NW in the active region AcTP. Then, in the pixel region 1A, the n type well NW which is the portion of the active region AcTP in which the $p^+$ type semiconductor region PR is formed is exposed at the bottom of the opening OP2.

On the other hand, in the pixel region 1A, the p type well PW2 which is the portion of the active region AcTP in which the $p^+$ type semiconductor region PR is not formed, and the p type well PW2 in the active regions AcAS and AcR are covered with the photoresist film R2 so as not to be doped with p type impurity ions. Whereas, in the peripheral circuit region 2A, the p type well PW3 in the active regions AcH and AcL is covered with the photoresist film R2 so as not be doped with p type impurity ions.

Thus, using the photoresist film R2 including the opening OP2 formed therein as a mask, p type impurity ions IM2 are doped. As a result, as shown in FIG. 16, the upper layer part of the n type well NW is doped with the p type impurity ions IM2, thereby to form the $p^+$ type semiconductor region PR.

Preferably, the direction in which the p type impurity ions IM2 are exposed is tilted at an angle θ2 with respect to the normal direction to the upper surface of the semiconductor substrate 1S so as to prevent n type impurity ions from being applied to the side surface on the photodiode PD side of the gate electrode GEt. The angle θ2 is, for example, about 10 to 30°.

As a result, the portion of the upper layer part of the n type well NW away from the gate electrode GEt is doped with p type impurity ions. Therefore, the $p^+$ type semiconductor region PR is formed in the portion of the upper layer part of the n type well NW away from the gate electrode GEt.

Incidentally, as the photoresist film R2, there may be used the photoresist film R1 (see FIG. 15) as it is.

Figure 17:
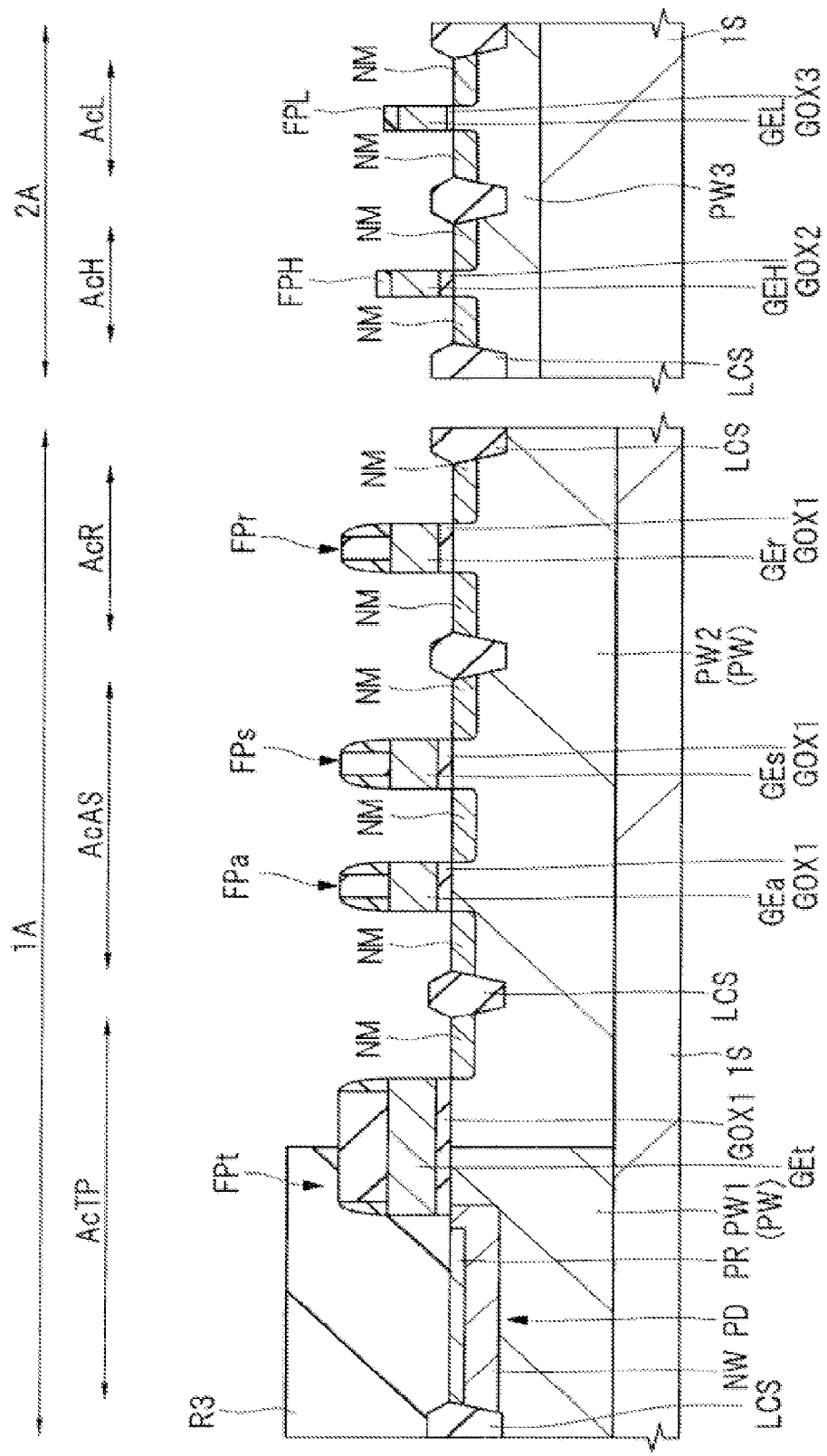
FIG. 17 is a cross sectional view showing the semiconductor device of First Embodiment during a manufacturing step.

Then, as shown in FIG. 17, n type low concentration semiconductor regions NM are formed (Step S21 of FIG. 6). In the Step S21, in the pixel region 1A, in the active region AcAS, in the portions of the p type well PW2 on the opposite sides of the gate electrode GEa, and the portions of the p type well PW2 on the opposite sides of the gate electrode GEs, there are formed n type low concentration semiconductor regions NM. Whereas, in the pixel region 1A, in the active region AcR, in the portions of the p type well PW2 on the opposite sides of the gate electrode GEr, there are formed n type low concentration semiconductor regions NM. Further, in the peripheral circuit region 2A, in the active region AcH, in the portions of the p type well PW3 on the opposite sides of the gate electrode GEH, there are formed n type low concentration semiconductor regions NM. In the active region AcL, in the portions of the p type well PW3 on the opposite sides of the gate electrode GEL, there are formed n type low concentration semiconductor regions NM.

For example, in the pixel region 1A and the peripheral circuit region 2, over the semiconductor substrate 1S, the photoresist film R3 is formed, and is subjected to exposure and development treatments using a photolithography technology. As a result, in the pixel region 1A, in the active regions AcAS and AcR, the photoresist film R3 is patterned so that the gate electrodes GEa, GEs, and GEr, and the p type well PW2 are exposed. Whereas, in the peripheral circuit region 2A, in the active regions AcH and AcL, the photoresist film R3 is patterned so that the gate electrodes GEH and GEL, and the p type well PW3 are exposed. On the other hand, in the pixel region 1A, in the active region AcTP, the n type well NW and the $p^+$ type semiconductor region PR are covered with the photoresist film R3 so as not to be doped with n type impurity ions.

Then, using the photoresist film R3, and the gate electrodes GEa, GEs, GEr, GEH, and GEL as a mask, n type impurity ions are doped. As a result, in the pixel region 1A, in the portions of the p type well PW2 on respective opposite sides of the gate electrodes GEa, GEs and GEr, there are formed n type low concentration semiconductor regions NM, respectively. Whereas, in the peripheral circuit region 2A, in the portions of the p type well PW3 on respective opposite sides of the gate electrodes GEH and GEL, there are formed n type low concentration semiconductor regions NM, respectively.

At this step, there is exposed the portion of the p type well PW2 in which the drain region of the transfer transistor TX (see FIG. 19 described later) is formed. In the exposed portion of the p type well PW2, there may be formed the n type low concentration semiconductor region NM.

Whereas, in Step S21, the following procedure is also acceptable: first, in the active regions AcAS, AcR, and AcH, under given conditions, n type impurity ions are doped to form n type low concentration semiconductor regions NM; then, in the active region AcL, under other conditions, n type impurity ions are doped to form n type low concentration semiconductor regions NM.

Incidentally, when a p channel type MISFET is formed in the peripheral circuit region 2A, in the peripheral circuit region 2A, p type impurity ions such as boron (B) may be doped, thereby to form p type low concentration semiconductor regions.

Figure 18:
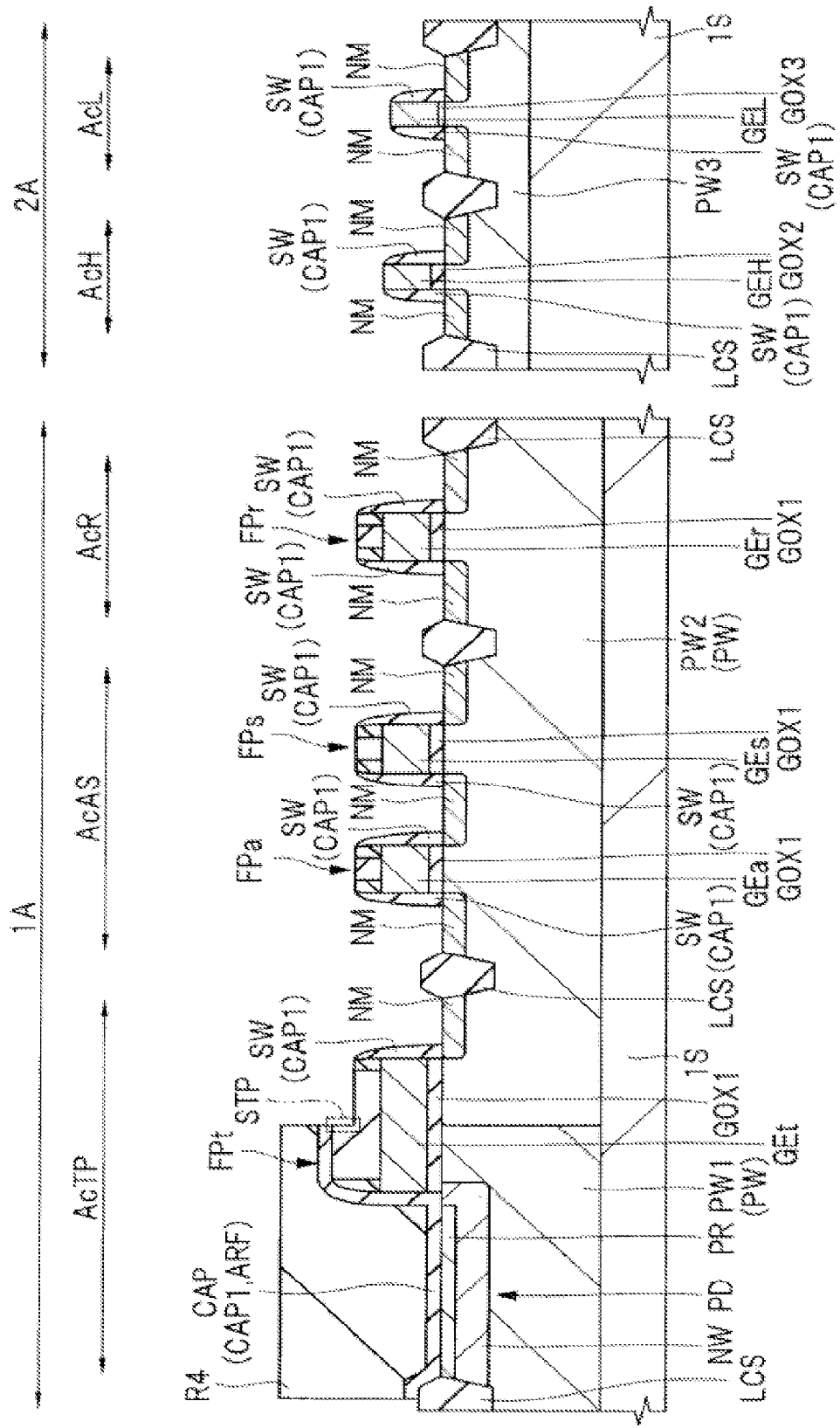
FIG. 18 is a cross sectional view showing the semiconductor device of First Embodiment during a manufacturing step.

Then, as shown in FIG. 18, the cap insulation film CAP is formed and patterned (Step S22 of FIG. 6).

First, as shown in FIG. 18, over the semiconductor substrate 1S, an insulation film CAP1 which is a monolayer film formed of one, or a lamination film formed of two or more of a silicon oxide ($SiO_2$) film, a silicon nitride (SiN) film, and a silicon oxynitride (SiON) film is formed using, for example, a CVD method.

Then, as shown in FIG. 18, the insulation film CAP1 is patterned. For example, in the pixel region 1A and the peripheral circuit region 2A, over the insulation film CAP1, a photoresist film R4 is formed, and is subjected to exposure and development treatments using a photolithography technology. As a result, in the pixel region 1A, the portions of the photoresist film R4 over the film part FPt, over the n type well NW, and over the $p^+$ type semiconductor region PR are left, and other portions of the photoresist film R4 are removed.

Then, with the film part FPt, the n type well NW, and the $p^+$ type semiconductor region PR covered with the photoresist film R4, in the pixel region 1A, the insulation film CAP1 over each of the active regions AcAS and AcR is anisotropically etched by a RIE (Reactive Ion Etching) method or the like. Further, in the peripheral circuit region 2A, the insulation film CAP1 over each of the active regions AcH and AcL is anisotropically etched by a RIE method or the like.

At this step, in the pixel region 1A, over the n type well NW, over the $p^+$ type semiconductor region PR, and over the film part FPt, the insulation film CAP1 is left, thereby to form a cap insulation film CAP. Incidentally, the cap insulation film CAP functions as the antireflection film ARF.

On the other hand, in the peripheral circuit region 2A, the insulation film CAP1 is etched back, so that the film parts FPH and FPL are exposed. Further, the exposed film parts FPH and FPL are removed. Then, at each side surface of the gate electrodes GEH and GEL, the insulation film CAP1 is left, thereby to form a sidewall SW. Namely, the sidewall SW is formed of the insulation film CAP1.

On the other hand, in the pixel region 1A, over each of the active regions AcAS and AcR, the insulation film CAP1 is etched back, so that the film parts FPa, FPs, and FPr are exposed. Herein, the film thickness TH5 of the film parts FPa, FPs, and FPr (see FIG. 13) is larger than the film thickness TH6 of the film parts FPH and FPL (see FIG. 13). Therefore, even when the film parts FPa, FPs, and FPr are etched back until the film parts FPH and FPL are removed, the film parts FPa, FPs, and FPr can be left without being fully removed. As a result, at the side surfaces of the gate electrode GEa, and the side surfaces of the left film part FPa, the insulation films CAP1 are left, thereby to form sidewalls SW, respectively. Further, at the side surfaces of the gate electrode GEs, and the side surfaces of the left film part FPs, the insulation films CAP1 are left, thereby to form sidewalls SW. Further, at the side surfaces of the gate electrode GEr, and the side surfaces of the left film part FPr, the insulation films CAP1 are left, thereby to form sidewalls SW.

Incidentally, as shown in FIG. 18, in consideration of the alignment precision for light exposure, the photoresist film R4 over the end of the film part FPt opposite to the photodiode PD side thereof is removed so that, in a plan view, the portion of the p type well PW2 adjacent to the gate electrode GEt is exposed with reliability. As a result, the insulation film CAP1 is etched back, so that the end of the film part FPt opposite to the photodiode PD side thereof is exposed. Then, even when the end of the film part FPt opposite to the photodiode PD side thereof is etched back until the film parts FPH and FPL are removed, the end of the film part FPt opposite to the photodiode PD side thereof can be left without being fully removed. As a result, at the side surface of the gate electrode GEt opposite to the photodiode PD side thereof, and the side surface of the left film part FPt opposite to the photodiode PD side thereof, the insulation films CAP1 are left, thereby to form sidewalls SW, respectively.

Thus, when the end of the film part FPt opposite to the photodiode PD side thereof is etched back, the film part FPt may have a step part STP. At this step, the film thickness of the portion of the film part FPt opposite to the photodiode PD side thereof from the step part STP is smaller than the film thickness TH5 of the portion of the film part FPt on the photodiode PD side from the step part, STP (see FIG. 13).

Figure 19:
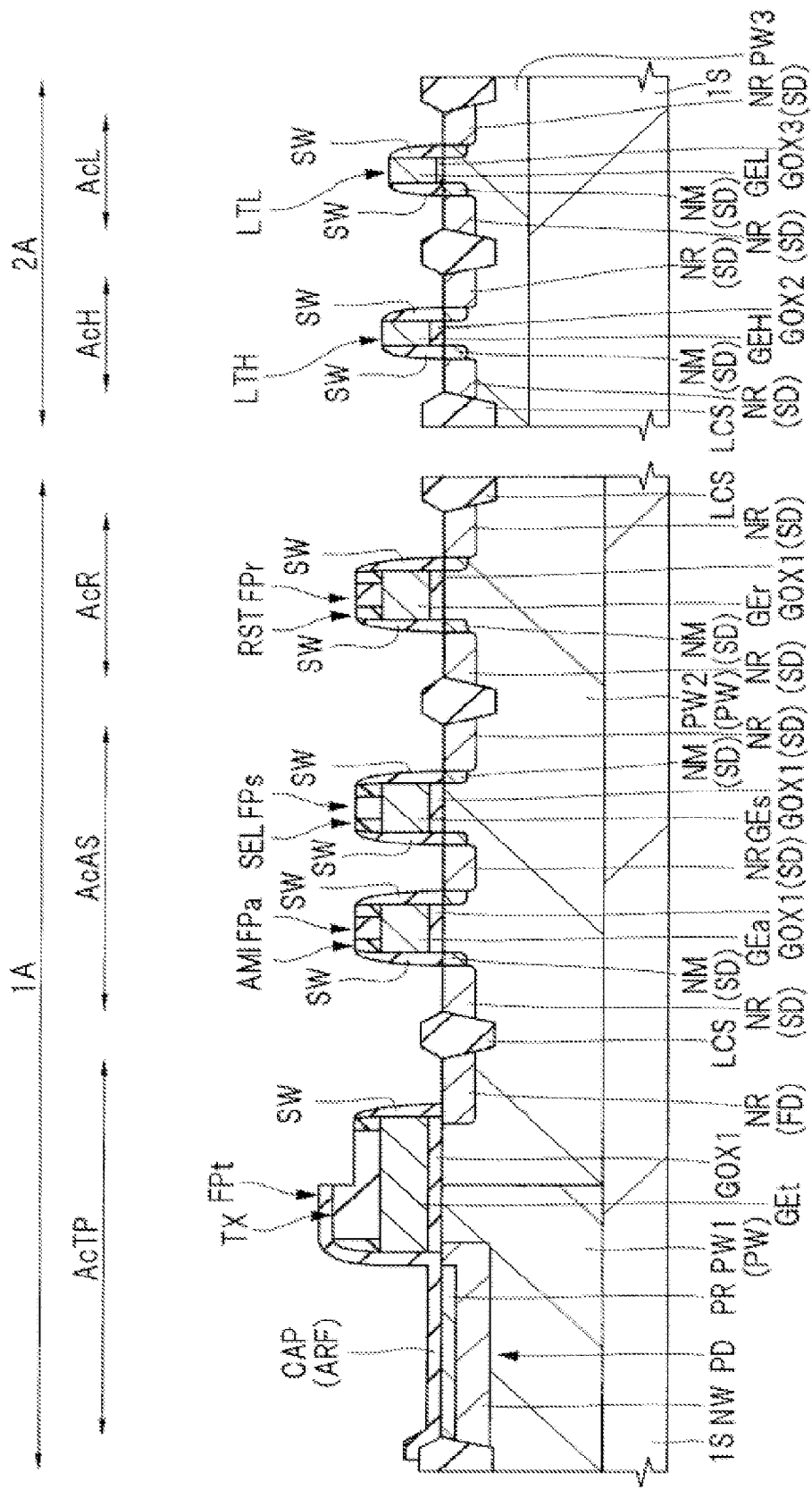
FIG. 19 is a cross sectional view showing the semiconductor device of First Embodiment during a manufacturing step.

Then, as shown in FIG. 19, n type high concentration semiconductor regions NR are formed (Step S23 of FIG. 6).

In the Step S23, in the pixel region 1A, in the active region AcTP, using the cap insulation film CAP as the antireflection film ARF, and the gate electrode GEt as a mask, n type impurity ions such as phosphorus (P) or arsenic (As) are doped. As a result, in the pixel region 1A, in the active region AcTP, in the portion of the p type well PW2 arranged on the side of the gate electrode GEt opposite to the photodiode PD side (the right-hand side of FIG. 19), there is formed an n type high concentration semiconductor region NR. The n type high concentration semiconductor region NR is also a semiconductor region which is the drain region of the transfer transistor TX, and serves as a floating diffusion FD. Namely, there is formed the transfer transistor TX including the gate electrode GEt, the n type high concentration semiconductor region NR which is the drain region, and the film part FPt.

Further, in Step S23, in the pixel region 1A, in the active region AcAS, using the gate electrode GEa, and the sidewalls SW formed at the side surfaces on the opposite sides of the gate electrode GEa as a mask, n type impurity ions are doped. As a result, in the portions of the p type well PW2 on the opposite sides of the combined body formed of the gate electrode GEa, and the sidewalls SW formed at the side surfaces on the opposite sides of the gate electrode GEa, there are formed n type high concentration semiconductor regions NR, respectively. Then, there is formed the amplification transistor AMI including the gate electrode GEa, the n type high concentration semiconductor regions NR which are source/drain regions SD, and the film part FPa.

Further, in the pixel region 1A, in the active region AcAS, using the gate electrode GEs, and the sidewalls SW formed at the side surfaces on the opposite sides of the gate electrode GEs as a mask, n type impurity ions are doped. As a result, in the portions of the p type well PW2 on the opposite sides of the combined body formed of the gate electrode GEs, and the sidewalls SW formed at the side surfaces on the opposite sides of the gate electrode GEs, there are formed n type high concentration semiconductor regions NR, respectively. Then, there is formed the selection transistor SEL including the gate electrode GEs, the n type high concentration semiconductor regions NR which are source/drain regions SD, and the film part FPs.

Further, in the pixel region 1A, in the active region AcR, using the gate electrode GEr, and the sidewalls SW formed at the side surfaces on the opposite sides of the gate electrode GEr as a mask, n type impurity ions are doped. As a result, in the active region AcR, in the portions of the p type well PW2 on the opposite sides of the combined body formed of the gate electrode GEr, and the sidewalls SW formed at the side surfaces on the opposite sides of the gate electrode GEr, there are formed n type high concentration semiconductor regions NR, respectively. Then, there is formed the reset transistor RST including the gate electrode GEr, the n type high concentration semiconductor regions NR which are source/drain regions SD, and the film part FPr.

On the other hand, in Step S23, in the peripheral circuit region 2A, in the active region AcH, using the gate electrode GEH, and the sidewalls SW formed at the side surfaces on the opposite sides of the gate electrode GEH as a mask, n type impurity ions are doped. As a result, in the portions of the p type well PW3 on the opposite sides of the combined body formed of the gate electrode GEH, and the sidewalls SW formed at the side surfaces on the opposite sides of the gate electrode GEH, there are formed n type high concentration semiconductor regions NR, respectively. Then, there is formed the transistor LTH including the gate electrode GEH, and the n type high concentration semiconductor regions NR which are source/drain regions SD.

Further, in the peripheral circuit region 2A, in the active region AcL, using the gate electrode GEL, and the sidewalls SW formed at the side surfaces on the opposite sides of the gate electrode GEL as a mask, n type impurity ions are doped. As a result, in the portions of the p type well PW3 on the opposite sides of the combined body formed of the gate electrode GEL, and the sidewalls SW formed at the side surfaces on the opposite sides of the gate electrode GEL, there are formed n type high concentration semiconductor regions NR, respectively. Then, there is formed the transistor LTL including the gate electrode GEL, and the n type high concentration semiconductor regions NR which are source/drain regions SD.

Incidentally, when in the peripheral circuit region 2A, a p channel type MISFET is formed, in the peripheral circuit region 2A, p type impurity ions such as boron (B) may be doped, thereby to form p type high concentration semiconductor regions serving as the source/drain regions of the p channel type MISFET.

Then, in order to activate the impurities doped in the steps up to this point, activation annealing is performed. Incidentally, the order of doping of respective impurities is not restricted by the order of the steps. Further, a plurality of the same conductivity type semiconductor regions can be doped with impurities at the same time in one step, so that the doping steps of respective impurities can be adjusted. Incidentally, also after activation annealing, the p⁺ type semiconductor region PR is formed in the portion of the upper layer part of the n type well NW apart from the gate electrode GEt.

Figure 20:
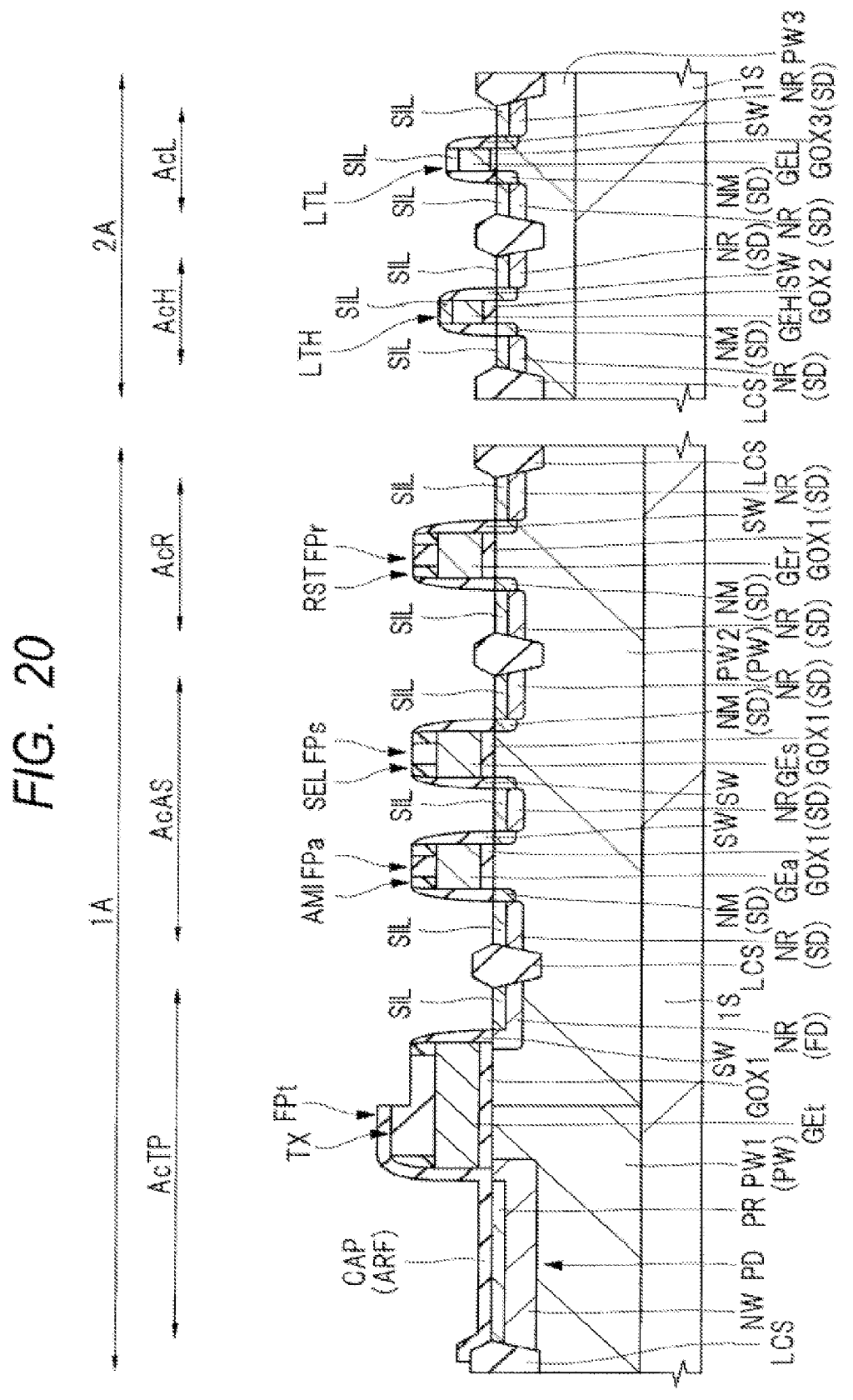

Then, as shown in FIG. 20, silicide layers SIL are formed (Step S24 of FIG. 6). In the step of the Step S24, in each region in which a silicide layer is not formed, over the semiconductor substrate 1S, there is formed a silicide blocking film (not shown). On the other hand, in the regions in each of which the silicide layer SIL is formed, such as the gate electrodes GEH and GLH, and the n type high concentration semiconductor regions NR, a silicide blocking film (not shown) is not formed over the semiconductor substrate 1S.

Then, over the semiconductor substrate 1S, a metal film (not shown) formed of, for example, a nickel (Ni) film is formed using a sputtering method or the like. As the metal film, other than a nickel film, there may be used a metal film such as a titanium (Ti) film, a cobalt (Co) film, or a platinum (Pt) film, and an alloy film formed of the metals, Then, the semiconductor substrate 1S is subjected to a heat treatment, thereby to effect the reaction between the metal film (not shown), and silicon forming the gate electrodes GEH and GLH, and silicon forming the n type high concentration semiconductor regions NR. This results in the formation of the silicide layer SIL formed of, for example, a nickel silicide layer. Then, the unreacted portions of the metal film (not shown) are removed. Thus, in the pixel region 1A, in the active regions AcTP, AcAS, and AcR, at each upper surface of the film parts FPt, FPa, FPs, and FPr, a silicide layer is not formed.

On the other hand, in the pixel region 1A, in the active region AcTP, at the upper surface of the n type high concentration semiconductor region NR, there is formed a silicide layer SIL, and in the active regions AcAS and AcR, at each upper surface of the n type high concentration semiconductor regions NR, a silicide layer SIL is formed. Whereas, in the peripheral circuit region 2A, in the active regions AcH and AcL, at each upper surface of the n type high concentration semiconductor regions NR, and each upper surface of the gate electrodes GEH and GEL, there is formed a silicide layer SIL. The silicide layers can reduce the coupling resistance between respective regions and plugs.

Incidentally, in the step of the Step S24, in the pixel region 1A, the silicide layer SIL need not be formed at the upper surface of the n type high concentration semiconductor region NR which is the drain region of the transfer transistor TX. In this case, a silicide blocking film (not shown) is also formed at the upper surface of the n type high concentration semiconductor region NR which is the drain region of the transfer transistor TX.

Figure 21:
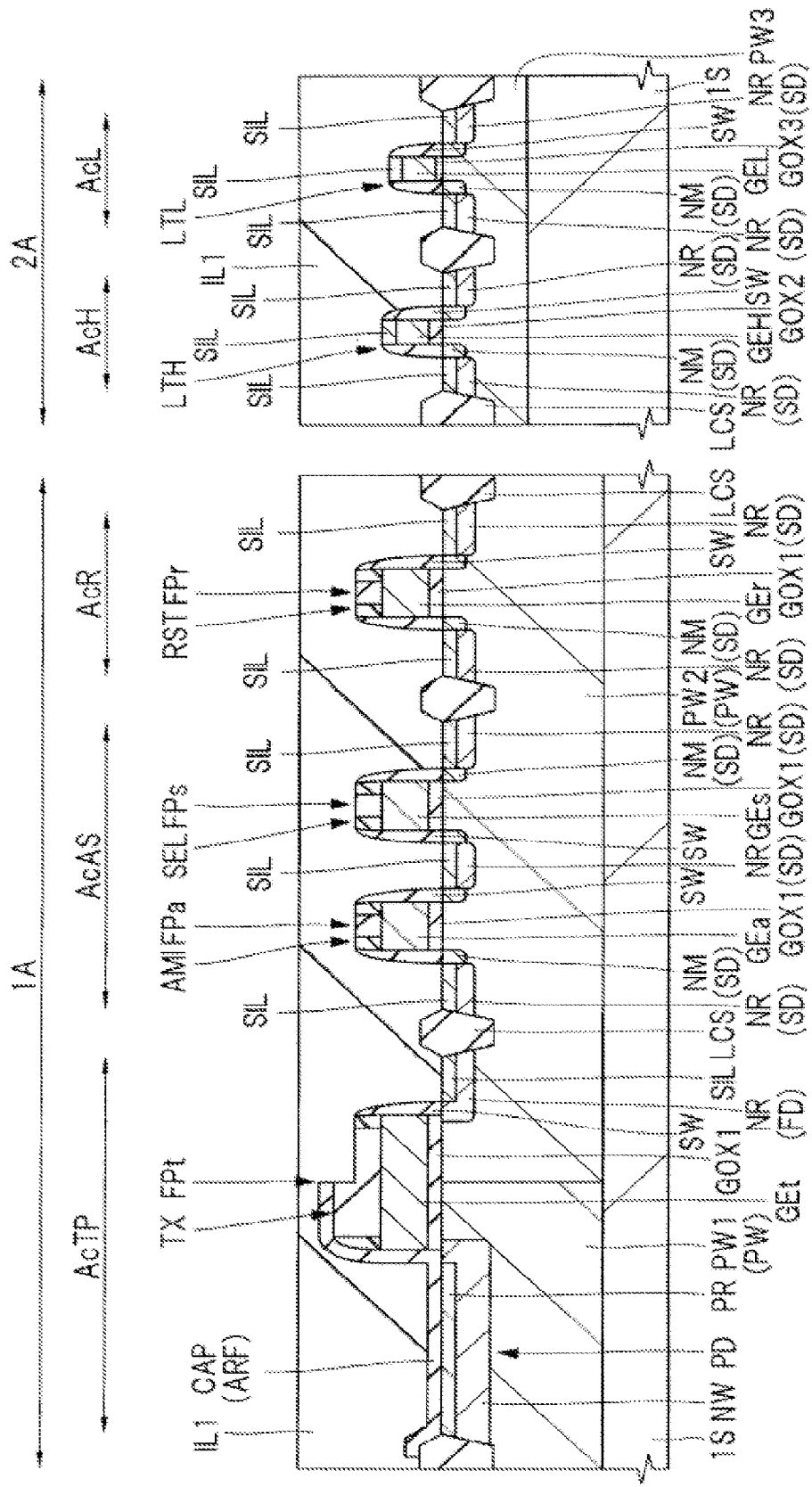
FIG. 21 is a cross sectional view showing the semiconductor device of First Embodiment during a manufacturing step.

Then, as shown in FIG. 21, an interlayer insulation film IL1 is formed (Step S25 of FIG. 6). In the Step S25, in the pixel region 1A and the peripheral circuit region 2A, over the semiconductor substrate 1S, there is formed the interlayer insulation film IL1. Namely, the interlayer insulation film IL1 is formed in such a manner as to cover the photodiode PD, the transfer transistor TX, the amplification transistor AMI, the selection transistor SEL, and the reset transistor RST, and the transistors LTH and LTL.

For example, over the semiconductor substrate 1S, a silicon oxide film is deposited by a CVD method using a TEOS gas as a raw material gas. Thereafter, if required, the upper surface of the interlayer insulation film IL1 is planarized using a CMP (Chemical Mechanical Polishing) method or the like.

Figure 22:
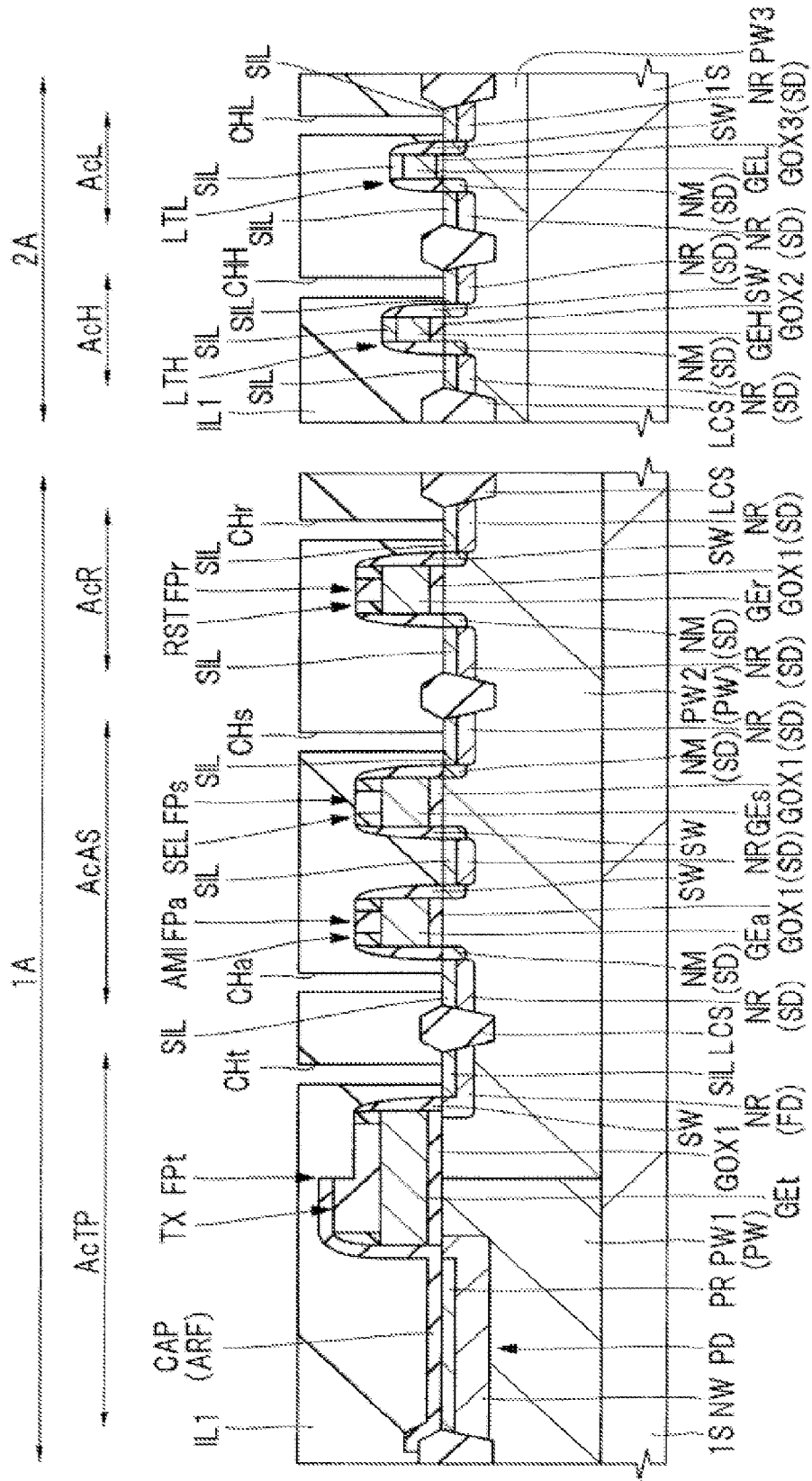
FIG. 22 is a cross sectional view showing the semiconductor device of First Embodiment during a manufacturing step.

Then, as shown in FIG. 22, contact holes CHt, CHa, CHs, CHr, CHH, and CHL are formed (Step S26 of FIG. 6). In the Step S26, the interlayer insulation film IL1 is patterned, thereby to form the contact holes CHt, CHa, CHs, CHr, CHH, and CHL.

Over the n type high concentration semiconductor region NR of the transfer transistor TX, there is formed the contact hole CHt penetrating through the interlayer insulation film IL1, and reaching the n type high concentration semiconductor region NR. Over the n type high concentration semiconductor region NR of the amplification transistor AMI, there is formed the contact hole CHa penetrating through the interlayer insulation film IL1, and reaching the silicide layer SIL formed at the upper surface of the n type high concentration semiconductor region NR. Over the n type high concentration semiconductor region NR of the selection transistor SEL, there is formed the contact hole CHs penetrating through the interlayer insulation film IL1, and reaching the silicide layer SIL formed at the upper surface of the n type high concentration semiconductor region NR. Over the n type high concentration semiconductor region NR of the reset transistor RST, there is formed the contact hole CHr penetrating through the interlayer insulation film IL1, and reaching the silicide layer SIL formed at the upper surface of the n type high concentration semiconductor region NR.

Over the n type high concentration semiconductor region NR of the transistor LTH, there is formed the contact hole CHH penetrating through the interlayer insulation film IL1, and reaching the silicide layer SIL formed at the upper surface of the n type high concentration semiconductor region NR. Over the n type high concentration semiconductor region NR of the transistor LTL, there is formed the contact hole CHL penetrating through the interlayer insulation film IL1, and reaching the silicide layer SIL formed at the upper surface of the n type high concentration semiconductor region NR.

At this step, also over the gate electrodes GEt, GEa, GEs, GEr, GEH, and GEL, there are formed contact holes (not shown).

Then, as shown in FIG. 4, plugs PGt, PGa, PGs, PGr, PGH, and PGL are formed (Step S27 of FIG. 6). In the Step S27, conductive films are filled in respective insides of the contact holes CHt, CHa, CHs, CHr, CHH, and CHL, thereby to form the plugs PGt, PGa, PGs, PGr, PGH, and PGL, respectively.

First, over the interlayer insulation film IL1 including the bottom surfaces and the inner walls of the contact holes CHt, CHa, CHs, CHr, CHH, and CHL, there is formed a barrier conductor film. The barrier conductor film is formed of a titanium film and a titanium nitride film formed over the titanium film, and can be formed using, for example, a sputtering method. The barrier conductor film has a so-called diffusion barrier property of preventing, for example, tungsten which is a material for the main conductor film to be embedded in a later step from being diffused into silicon.

Then, a main conductor film formed of a tungsten film is formed over the barrier conductor film in such a manner as to fill each of the contact holes CHt, CHa, CHs, CHr, CHH, and CHL. The main conductor film can be formed using, for example, a CVD method. Then, unnecessary portions of the main conductor film and the barrier conductor film formed over the interlayer insulation film IL1 are removed by, for example, a CVD method. As a result, it is possible to form each of the plugs PGt, PGa, PGs, PGr, PGH, and PGL.

Then, as shown in FIG. 3, over the interlayer insulation film IL1, there are formed interlayer insulation films IL2 to IL4, and wires M1 to M3. For example, over the interlayer insulation film IL1, as the interlayer insulation film IL2, a lamination film of a silicon nitride (SiN) film and a silicon oxide ($SiO_2$) film is formed by a CVD method or the like. Then, there is formed a contact hole penetrating through the interlayer insulation film IL2, and reaching the wire M1. Then, over the interlayer insulation film IL2 including the inside of the contact hole, as a barrier film, a lamination film of a tantalum (Ta) film, and a tantalum nitride (TaN) film thereover is deposited by a sputtering method or the like. Then, over the barrier film, as a seed film (not shown), a thin copper (Cu) film is deposited by a sputtering method or the like. By an electrolytic plating method, the copper film is deposited over the seed film. Then, unnecessary portions of the barrier film, the seed film, and the copper film over the interlayer insulation film IL2 are removed by a CMP method or the like. Thus, in the inside of the wire trench, the barrier film, the seed film, and the copper film are embedded. As a result, the wire M1 can be formed (single damascene method).

Below, in the same manner, as shown in FIG. 3, over the interlayer insulation film IL2 including the wire M1 formed therein, there is formed the interlayer insulation film IL3. In the interlayer insulation film IL3, there is formed the wire M2. Over the interlayer insulation film IL3 including the wire M2 formed therein, there is formed the interlayer insulation film IL4. In the interlayer insulation film IL4, there is formed the wire M3.

Incidentally, in the present embodiment, there is shown the example in which the wire M1 and the wire M2 are each formed of a copper wire by a damascene method. However, not limited thereto, the wire M1 and the wire M2 may be formed using aluminum by a patterning method.

Then, as shown in FIG. 3, a microlens ML is formed in a region over the interlayer insulation film IL4 at the uppermost layer, and including the pixel region 1A in a plan view. Namely, the microlens ML as an on-chip lens is formed in such a manner as to overlap the n type well NW forming the photodiode PD in a plan view. Incidentally, as shown in FIG. 3, between the microlens ML and the interlayer insulation film IL4, there may be formed a passivation film PF and a color filter CL sequentially from the bottom.

By the steps up to this point, as shown in FIG. 3, the semiconductor device of the present First Embodiment can be manufactured.

Incidentally, in the present First Embodiment, for example, respective conductivity types of the semiconductor substrate 1S, the p type wells PW1, PW2, and PW3, the n type well NW, the $p^+$ type semiconductor region PR, the n type low concentration semiconductor region NM, and the n type high concentration semiconductor region NR may be changed to the opposite conductivity types, respectively (the same also applies to Second Embodiment).

<Regarding Ion Implantation for Forming Photodiode>

Then, ion implantation for forming the photodiode will be described in comparison with a semiconductor device of Comparative Example 1.

Figure 23:
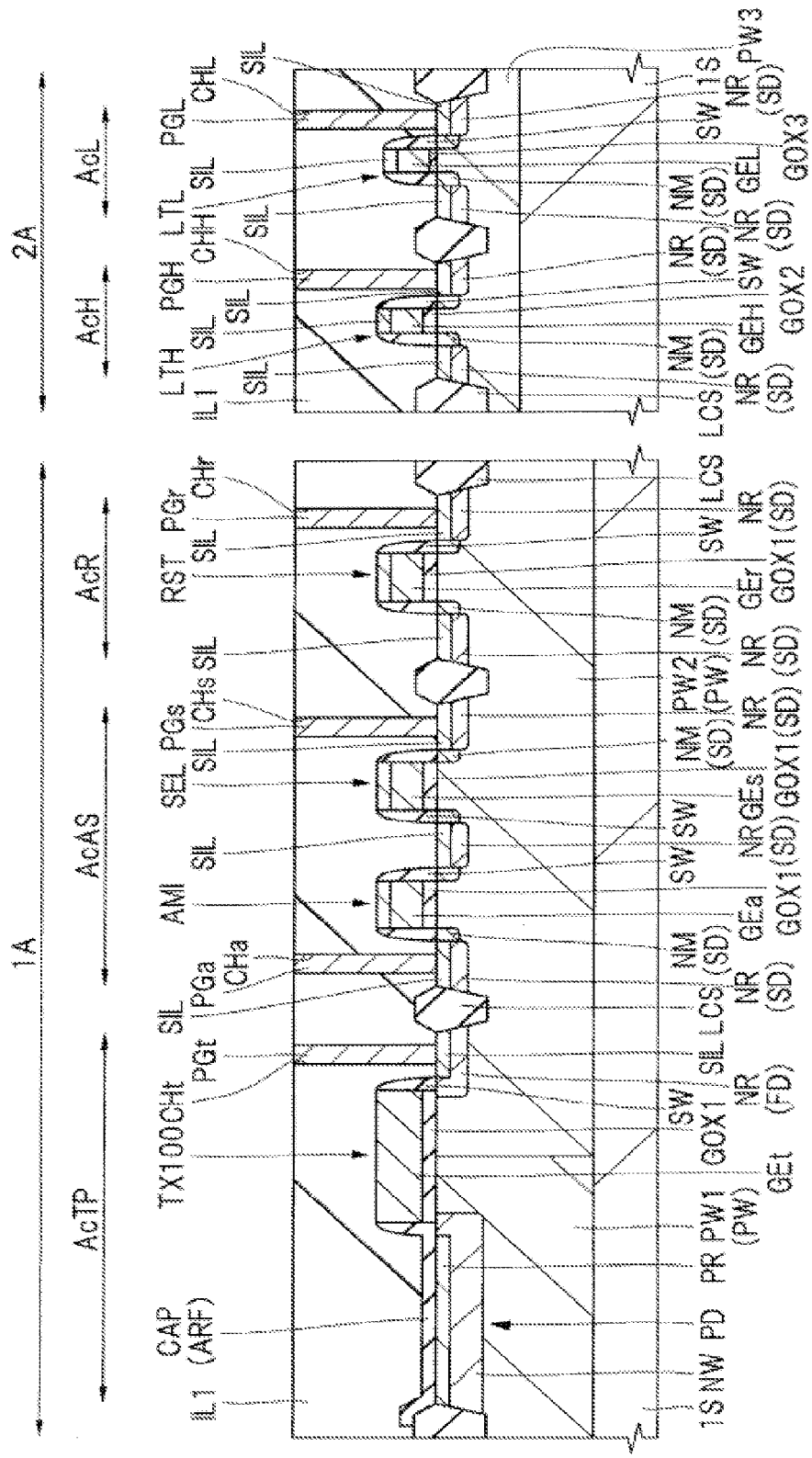
FIG. 23 is a cross sectional view showing the configuration of a semiconductor device of Comparative Example 1.
Figure 24:
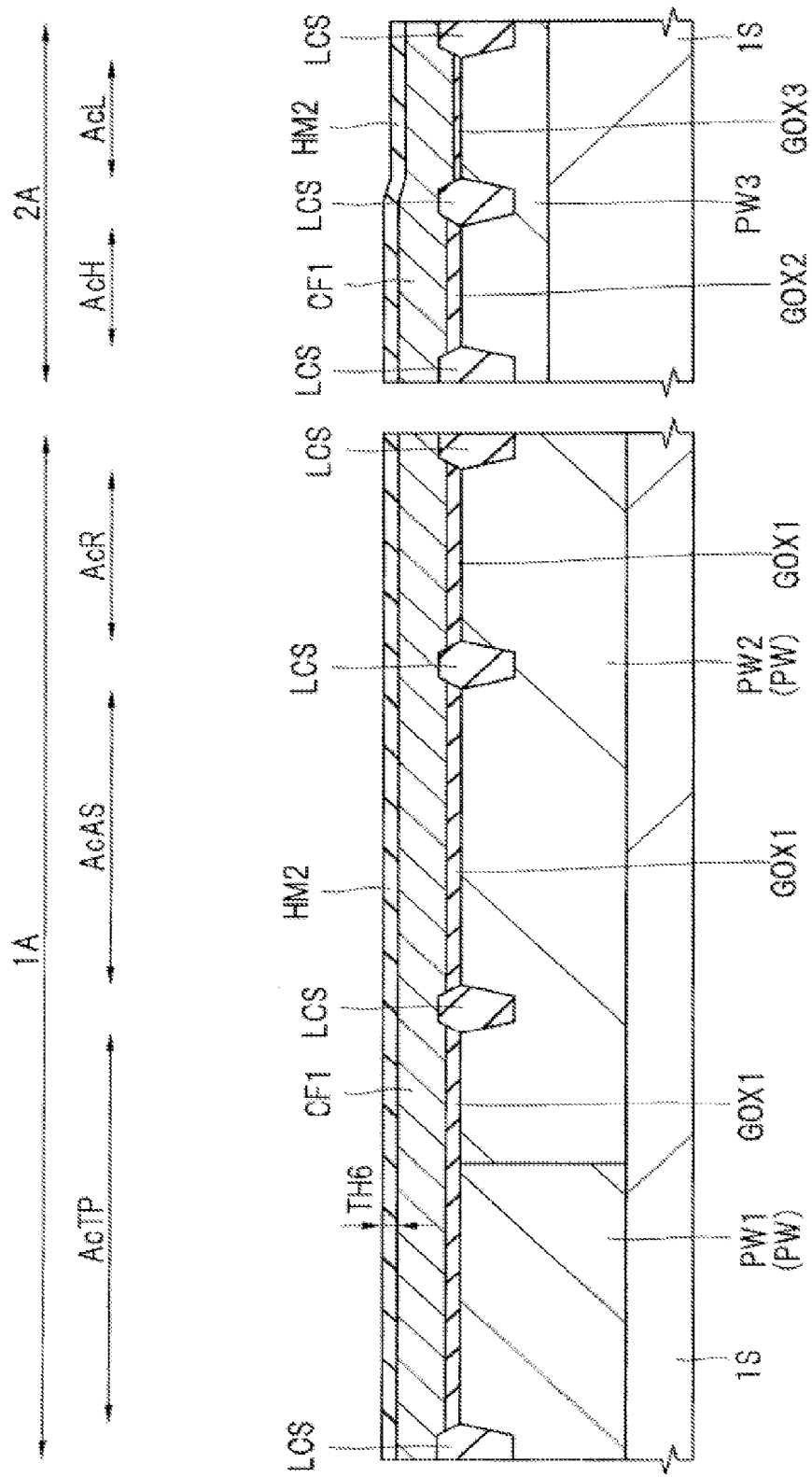
FIG. 24 is a cross sectional view showing the semiconductor device of Comparative Example 1 during a manufacturing step.
Figure 25:
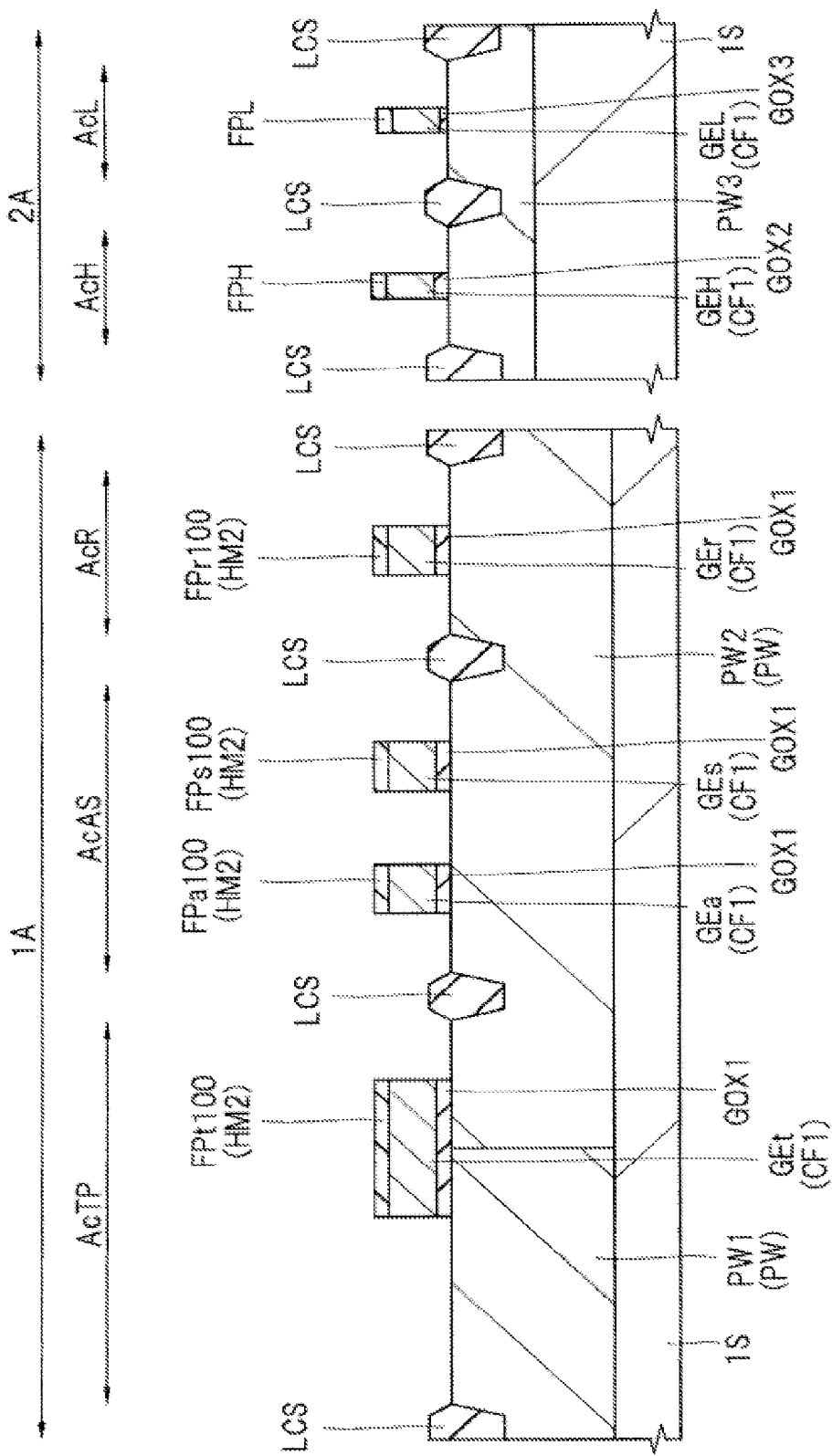
FIG. 25 is a cross sectional view showing the semiconductor device of Comparative Example 1 during a manufacturing step.
Figure 26:
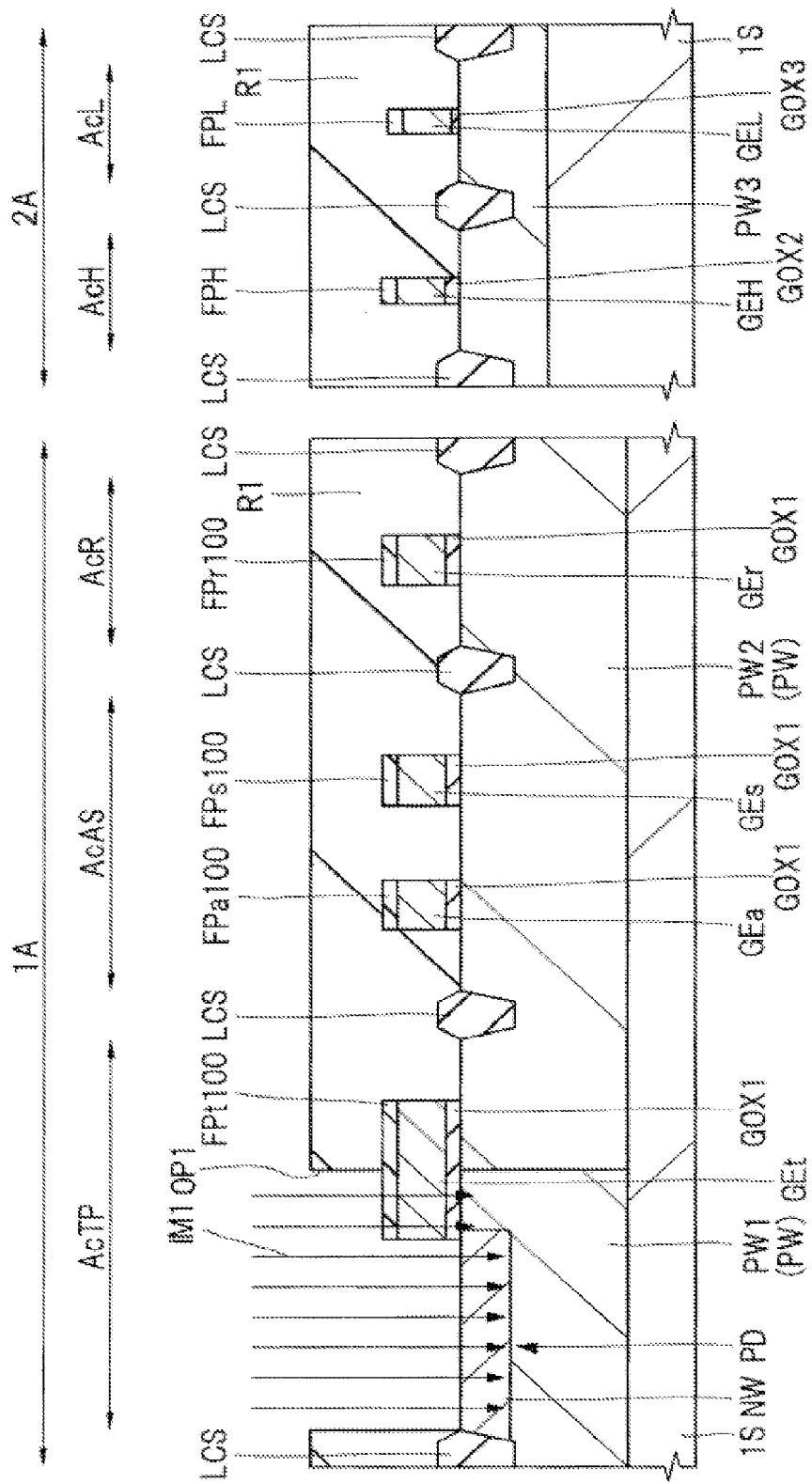
FIG. 26 is a cross sectional view showing the semiconductor device of Comparative Example 1 during a manufacturing step.

FIG. 23 is a cross sectional view showing the configuration of the semiconductor device of Comparative Example 1. FIGS. 24 to 26 are each a cross sectional view showing the semiconductor device of Comparative Example 1 during a manufacturing step. Incidentally, in FIG. 23, the portion above the interlayer insulation film IL1 is not shown.

As shown in FIG. 23, in the semiconductor device of Comparative Example 1, as distinct from the semiconductor device of First Embodiment, between the gate electrode GEt of a transfer transistor TX100 and the interlayer insulation film IL1, there is not formed the film part FPt (see FIG. 3). Whereas, between the gate electrode GEa of the amplification transistor AMI and the interlayer insulation film IL1, there is not formed a film part FPa (see FIG. 3), and between the gate electrode GEs of the selection transistor SEL and the interlayer insulation film IL1, there is not formed a film part FPs (see FIG. 3). Further, between the gate electrode GEr of the reset transistor RST and the interlayer insulation film IL1, there is not formed a film part FPr (see FIG. 3). On the other hand, at each upper surface of the gate electrodes GEa, GEs, and GEr, there is formed a silicide layer SIL.

In the manufacturing steps of the semiconductor device of Comparative Example 1, the steps of Steps S11 to Step S13 described by reference to FIGS. 7 to 9 in First Embodiment are performed. Then, without performing Step S14 described by reference to FIG. 10, as shown in FIG. 24, over the conductive film CF1, there is formed a thin hard mask film HM2 having a film thickness TH6.

Then, as shown in FIG. 25, using the film parts FPt100, FPa100, FPs100, and FPr100 formed by patterning the thin hard mask film HM2 as a mask, the conductive film CF1, and the gate insulation films GOX1, GOX2, and GOX3 are etched.

As a result, over the active region AcTP, the gate electrode GEt formed of the conductive film CF1 is formed via the gate insulation film GOX1. Whereas, over the active region AcAS, the gate electrode GEa formed of the conductive film CF1 is formed via the gate insulation film GOX1, and the gate electrode GEs formed of the conductive film CF1 is formed via the gate insulation film GOX1. Further, over the active region AcR, the gate electrode GEr formed of the conductive film CF1 is formed via the gate insulation film GOX1.

On the other hand, to the peripheral circuit region 2A, the same as Step S18 described by reference to FIG. 14 in First Embodiment applies.

Then, as shown in FIG. 26, the n type well NW is formed. Then, as described by reference to FIGS. 16 to 22, and the like in First Embodiment, Step S20 and subsequent steps are performed, thereby to form the semiconductor device of Comparative Example 1.

In Comparative Example 1, in the step of forming the n type well NW shown in FIG. 26, in the pixel region 1A and the peripheral circuit region 2A, over the semiconductor substrate 1S, there is formed a photoresist film R1. Then, in the pixel region 1A, an opening OP1 is formed so that the p type well PW1 that is the portion of the active region AcTP in which the n type well NW is formed is exposed at the bottom of the opening OP1. Then, using the photoresist film R1 including the opening OP1 formed therein as a mask, n type impurity ions IM1 are doped.

At this step, the opening OP1 is formed in consideration of the alignment precision for exposure so that the portion of the p type well PW1 adjacent to the gate electrode GEt is exposed at the bottom of the opening OP1 with reliability in a plan view. Namely, the opening OP1 is formed in such a manner as to penetrate through the photoresist film R1, and to reach the end on one side (the left-hand side of FIG. 26) of the film part FPt100. Whereas, in Comparative Example 1, over the gate electrode GEt, the film part FPt100 including only the thin hard mask film HM2 (see FIG. 25) is formed, but the film part FPt including the thick hard mask film HM1 (see FIG. 15) is not formed. Therefore, ions may penetrate through film part FPt100, the gate electrode GEt, and the gate insulation film GOX1, to be doped into the p type well PW1 immediately under the gate insulation film GOX1.

As described by showing the manufacturing steps of the Comparative Example 1, for the CMOS image sensor, after forming the gate electrode GEt, ions are doped to a position deep from the upper surface of the semiconductor substrate 1S in self-alignment with the gate electrode GEt, thereby to form the photodiode PD. The reason why ions are doped in self-alignment with the gate electrode GEt is as follows: if a deviations is caused in positional relationship between the gate electrode GEt and the photodiode PD, the characteristics for transferring the electrons generated in the photodiode PD are deteriorated.

Further, for the CMOS image sensor, a red light reaches a position deep from the upper surface of the semiconductor substrate 1S formed of silicon. Therefore, in order to receive lights including a red light, to generate electrons with efficiency, and to trap the generated electrons with efficiency, the pn junction of the photodiode PD is desirably arranged at a position deep from the upper surface of the semiconductor substrate 1S. Therefore, for the n type well of the p type well PW1 and the n type well NW forming the pn junction of the photodiode PD, the lower surface of the n type well NW is arranged at a position as deep as possible.

However, when ions are doped in alignment with the gate electrode GEt, the ions may penetrate through the gate electrode GEt, to be doped into the gate insulation film GOX1 and the semiconductor substrate 1S under the gate electrode GEt. Thus, in order to prevent or inhibit the gate insulation film GOX1 and the semiconductor substrate 1S under the gate electrode GEt from being doped with ions, for example, it can be considered that ions are doped with an insulation film formed over the gate electrode GEt.

However, in the peripheral circuit region 2A, in order to ensure coupling at a low resistance even when the dimensions become finer with an increase in operation speed, silicide layers are formed at respective upper surfaces of the gate electrodes GEH and GEL, and the upper surfaces of the source/drain regions SD. For this reason, with a thick insulation film formed over the gate electrode GEt including over each of the gate electrodes GEH and GEL in the peripheral circuit region 2A, ions are doped, thereby to form the photodiode PD. Then, the insulation film over each of the gate electrodes GEH and GEL in the peripheral circuit region 2A is required to be removed. However, when the thick insulation film over each of the gate electrodes GEH and GEL in the peripheral circuit region 2A is removed by, for example, wet etching, the element isolation region LCS or the gate insulation films GEH and GEL may be partially removed. Therefore, it is difficult to remove the insulation film over each of the gate electrodes GEH and GEL in the peripheral circuit region 2A after forming the photodiode PD.

Namely, in order to form the silicide layers SIL with ease, it is not possible to forma thick insulation film over the gate electrode GEt. Therefore, in order to prevent impurity ions from penetrating through the gate electrode GEt, and being doped into the gate insulation film GOX1 and the semiconductor substrate 1S under the gate electrode GEt when, for example, n type impurities are doped in order to form the photodiode PD, n type impurity ions cannot be doped into a position deep from the upper surface of the semiconductor substrate 1S.

As a result, the photodiode PD is formed at a position shallow from the upper surface of the semiconductor substrate 1S. Accordingly, the impurity ions in the $p^+$ type semiconductor region PR formed for compensating for crystal defects in the portion in the vicinity of the upper surface of the semiconductor substrate 1S are diffused in the inside of the photodiode PD. Then, the diffusion of the impurity ions from the $p^+$ type semiconductor region PR in the inside of the photodiode PD reduces the number of saturated electrons in the photodiode PD. This may reduce the sensitivity of the CMOS image sensor, resulting in the degradation of the performances of the semiconductor device.

Whereas, in the CMOS image sensor, when a dark current increases while not being irradiated with a light, a light is determined as being exposed thereto despite the light not being exposed thereto. As a result, false lighting is caused, resulting in the formation of white points. One of the probable causes for the dark current is the crystal defects formed in the semiconductor region forming the photodiode PD. Particularly, the portion in the vicinity of the upper surface of the semiconductor substrate 1S includes a large number of crystal defects. For this reason, the formation of the photodiode PD at a position shallow from the upper surface of the semiconductor substrate 1S may increase the frequency of the formation of white points with no light exposed thereto, namely, the formation of pixel defects, resulting in the reduction of the sensitivity of the CMOS image sensor. This reduces the performances of the semiconductor device.

<Main Features and Effects of the Present Embodiment>

In the present First Embodiment, over the gate electrode GEt, there is formed the film part FPt formed of the thick hard mask film HM1. Further, when, for example, n type impurity ions are doped in order to form the photodiode PD, the impurity ions are doped in self-alignment with the gate electrode GEt covered with the film part FPt.

This makes it difficult for the impurity ions to penetrate through the gate electrode GEt, and to be doped into the gate insulation film GOX1 and the p type well PW1 under the gate electrode GEt. For this reason, in the region in which the photodiode PD is formed, n type impurity ions can be doped to a position deep from the upper surface of the p type well PW1. Accordingly, the n type well NW can be formed at a position deep from the upper surface of the p type well PW1. As a result, it is possible to prevent or inhibit the impurity ions doped into the $p^+$ type semiconductor region PR formed for compensating for crystal defects in the portion in the vicinity of the upper surface of the p type well PW1 from being diffused into the inside of the photodiode PD. Therefore, it is possible to prevent or inhibit the reduction of the number of saturated electrons in the photodiode PD, which can improve the sensitivity of the CMOS image sensor. As a result, it is possible to improve the performances of the semiconductor device.

Further, the photodiode PD can be formed at the portion distant from the portion in the vicinity of the upper surface of the p type well PW1 including a large number of crystal defects. Therefore, it is possible to reduce the frequency of the formation of white points with no light exposed thereto, namely, the formation of pixel defects. Thus, it is possible to improve the sensitivity of the CMOS image sensor. As a result, it is possible to improve the performances of the semiconductor device.

On the other hand, in the present First Embodiment, as distinct from Second Embodiment described later, also over respective gate electrodes GEa, GEs, and GEr of transistors other than the transfer transistor TX in the pixel region 1A, there are formed the film parts FPa, FPs, and FPr each formed of the thick hard mask film HM1, respectively. Therefore, during the manufacturing steps of the semiconductor device, it is not necessary to perform the step of removing the film parts over the gate electrodes GEa, GEs, and GEr of transistors other than the transfer transistor TX in the pixel region 1A while leaving the film part over the gate electrode GEt of the transfer transistor TX in the inside of the pixel region 1A. Therefore, as compared with Second Embodiment described later, the semiconductor device can be manufactured with ease.

Second Embodiment

In First Embodiment, a description has been given to the example in which the film parts each including the thick hard mask film are also formed over the gate electrodes of transistors other than the transfer transistor in the pixel region, in addition to over the gate electrode of the transfer transistor. On the other hand, in Second Embodiment, a description will be given to an example in which, over the gate electrode of the transfer transistor, there is formed a film part formed of a thick hard mask film, but, over each gate electrode of transistors other than the transfer transistor in the pixel region, a film part formed of a thick hard mask film is not formed.

The configuration of the semiconductor device of the present Second Embodiment is the same as the configuration of the semiconductor device of First Embodiment described by reference to FIGS. 1 and 2. A description thereon will be omitted. Further, the element structure in the peripheral circuit region is the same as the element structure in the peripheral circuit region described by reference to FIGS. 3 and 4. A description thereon will be omitted.

<Element Structure in Pixel Region>

Figure 27:
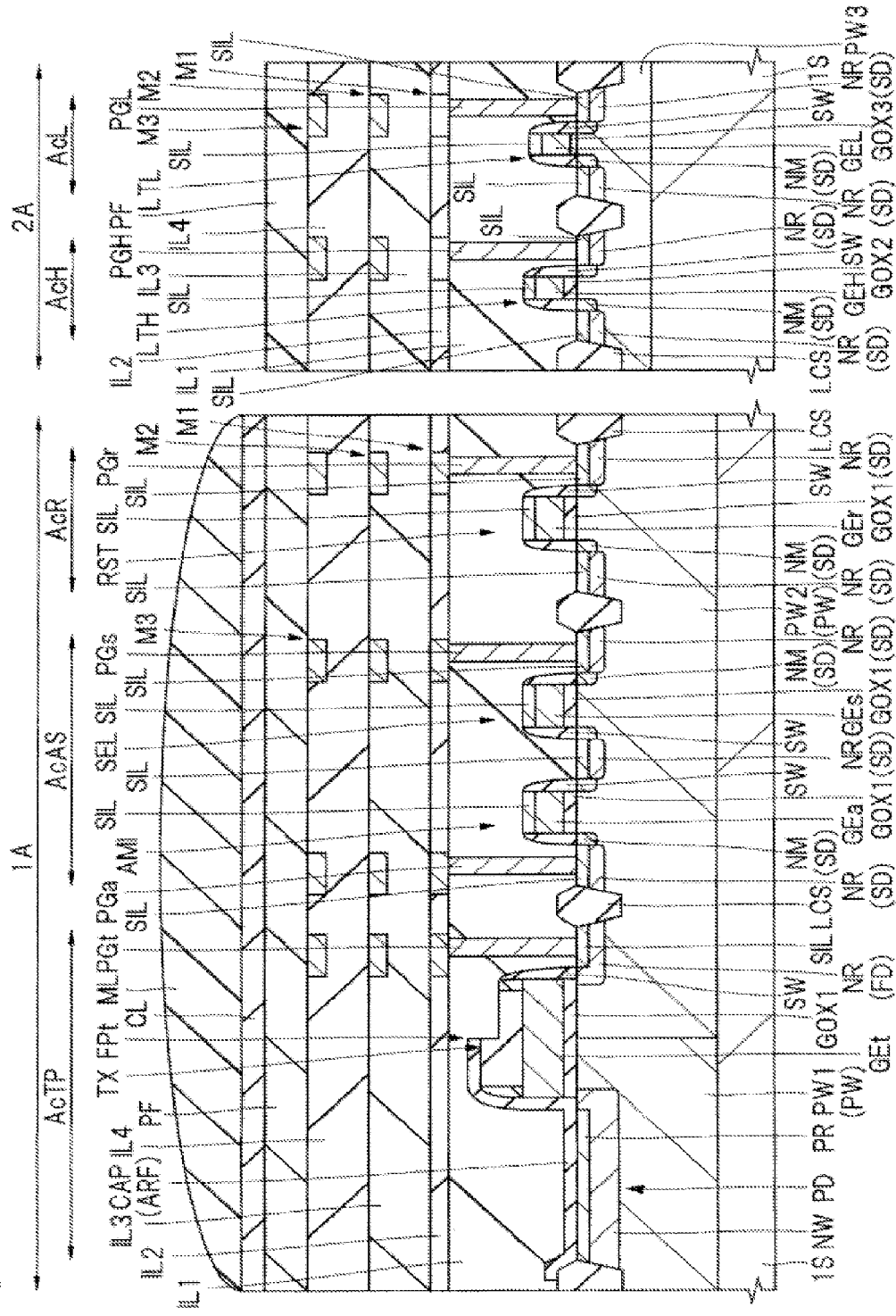
FIG. 27 is a cross sectional view showing the configuration of a semiconductor device of Second Embodiment.
Figure 28:
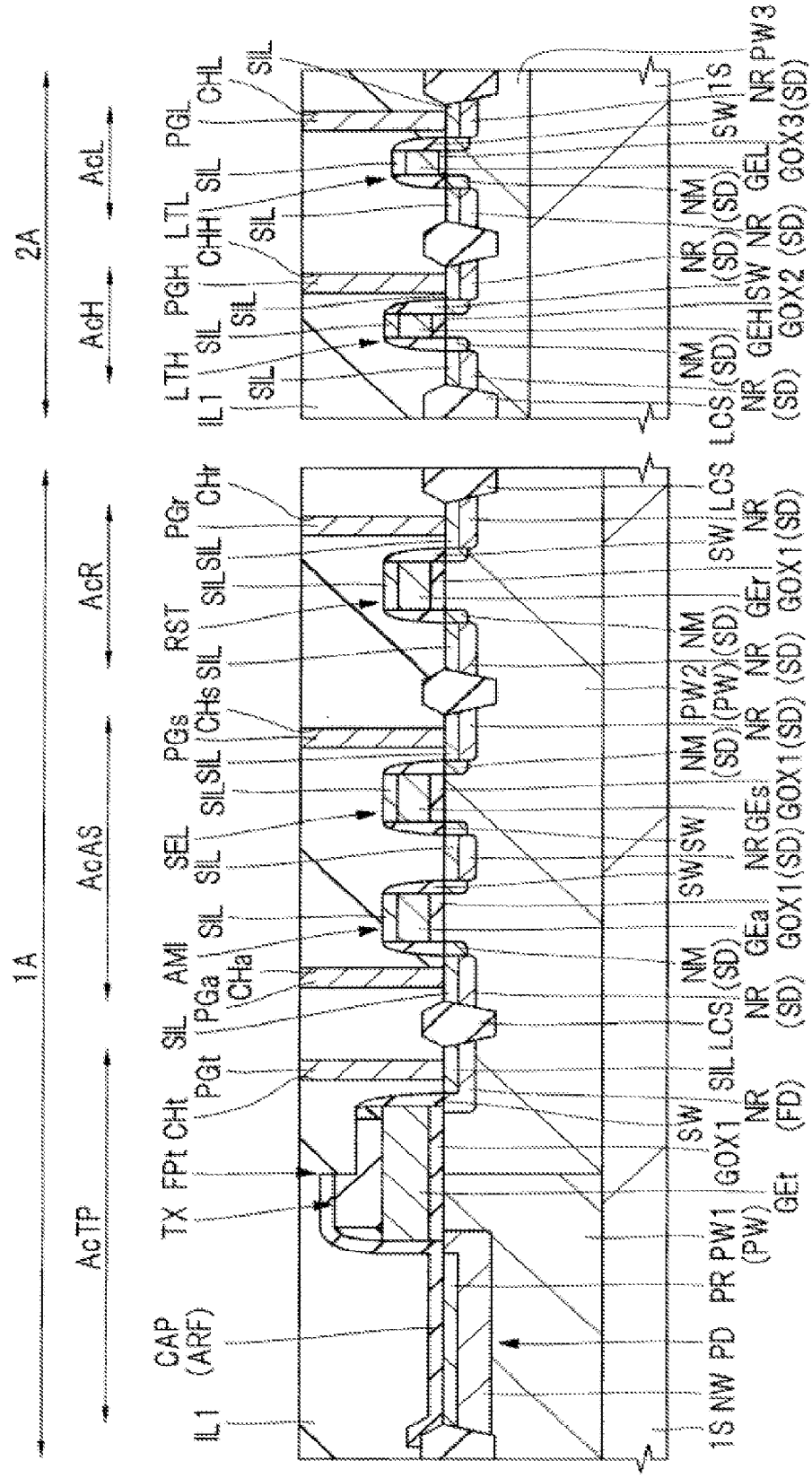
FIG. 28 is a cross sectional view showing the configuration of the semiconductor device of Second Embodiment.

Then, a description will be given to the element structure in the pixel region. FIGS. 27 and 28 are each a cross sectional view showing the configuration of the semiconductor device of Second Embodiment. Incidentally, in FIGS. 27 and 28, as in FIGS. 3 and 4, the element structure in the pixel region 1A and the element structure in the peripheral circuit region 2A are shown together. Further, in FIG. 28, the portion above the interlayer insulation film IL1 of FIG. 27 is not shown.

Respective portions other than the amplification transistor AMI, the selection transistor SEL, and the reset transistor RST in the element structure in the pixel region 1A of the semiconductor device of the present Second Embodiment are the same as respective portions in the element structure in the pixel region 1A of the semiconductor device of First Embodiment. A description thereon will be omitted.

The amplification transistor AMI has the same structure as that of the amplification transistor AMI in First Embodiment, except that the film part FPa (see FIG. 3) is not formed over the gate electrode GEa. Then, in the present Second Embodiment, at the upper surface of the gate electrode GEa, there is formed a silicide layer SIL. This enables a coupling between the gate electrode GEa and a plug (not shown) at a low resistance.

The selection transistor SEL has the same structure as that of the selection transistor SEL of First Embodiment, except that the film part FPs (see FIG. 3) is not formed over the gate electrode GEs. Then, in the present Second Embodiment, at the upper surface of the gate electrode GEs, there is formed a silicide layer SIL. This enables a coupling between the gate electrode GEs and a plug (not shown) at a low resistance.

The reset transistor RST has the same structure as that of the reset transistor RST of First Embodiment, except that the film part FPr (see FIG. 3) is not formed over the gate electrode GEr. Then, in the present Second Embodiment, at the upper surface of the gate electrode GEr, there is formed a silicide layer SIL. This enables a coupling between the gate electrode GEr and a plug (not shown) at a low resistance.

The silicide layers SIL formed at respective upper surfaces of the gate electrodes GEa, GEs, and GEr are each formed of a metal silicide layer such as nickel silicide as with the silicide layers SIL formed at the upper surfaces of the source/drain regions SD on respective opposite sides of the gate electrodes GEa, GEs, and GEr.

<Manufacturing Method of Semiconductor Device>

Then, a description will be given to a method for manufacturing a semiconductor device of the present Second Embodiment. FIGS. 29 to 38 are each a cross sectional view showing the semiconductor device of Second Embodiment during a manufacturing step.

Incidentally, in FIGS. 29 to 38, the manufacturing steps in the pixel region 1A and the manufacturing steps in the peripheral circuit region 2A are shown together. However, the manufacturing steps in the peripheral circuit region 2A are the same as the manufacturing steps in the peripheral circuit region 2A in First Embodiment described by reference to FIGS. 7 to 22. A description thereon will be omitted.

Further, the manufacturing steps of the semiconductor device of the present Second Embodiment are substantially the same as the manufacturing steps of the semiconductor device of First Embodiment. Therefore, below, a description will be given by reference to FIGS. 5 and 6 which are each a manufacturing process flowchart showing some of the manufacturing steps of the semiconductor device of First Embodiment.

In the manufacturing steps of the semiconductor device of the present Second Embodiment, after performing the steps of Step S11 to Step S13 of FIG. 5 described by reference to FIGS. 7 to 9 in First Embodiment, the step of Step S14 of FIG. 5 is performed, thereby to form the thick hard mask film HM1 as shown in FIG. 10.

Figure 29:
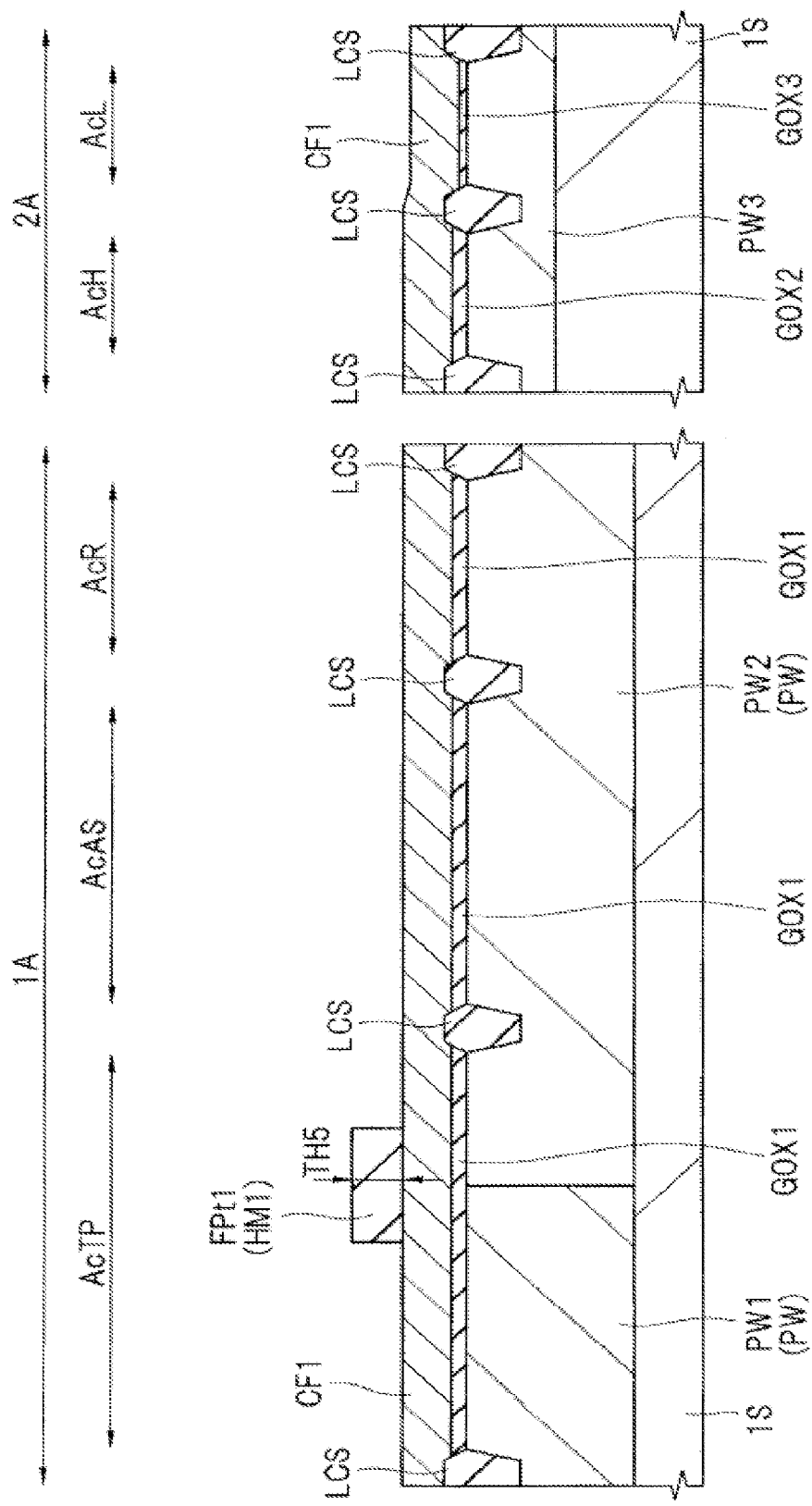
FIG. 29 is a cross sectional view showing the semiconductor device of Second Embodiment during a manufacturing step.

Then, the step corresponding to Step S15 of FIG. 5 is performed, thereby to pattern the thick hard mask film HM1. In the step corresponding to the Step S15, as shown in FIG. 29, in the pixel region 1A, the thick hard mask film HM1 is patterned. As a result, although the film part FPt1 formed of the thick hard mask film HM1 is formed, the film parts FPa1, FPs1, and FPr1 (see FIG. 11) are not formed.

Figure 30:
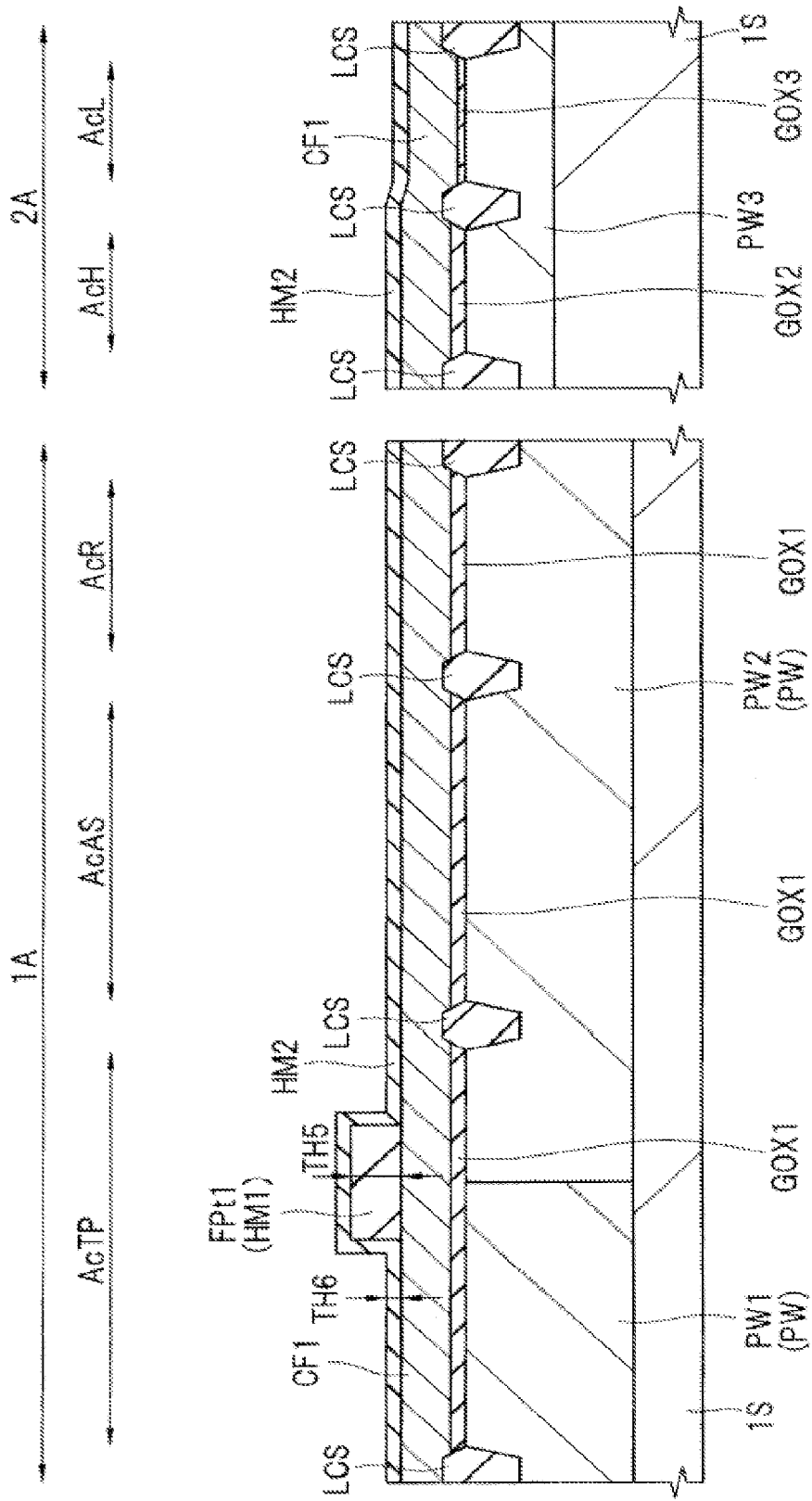
FIG. 30 is a cross sectional view showing the semiconductor device of Second Embodiment during a manufacturing step.

Then, the step corresponding to Step S16 of FIG. 5 is performed, thereby to form the thin hard mask film HM2. As described previously, the film parts FPa1, FPs1, and FPr1 (see FIG. 1) are not formed. For this reason, in the step corresponding to the Step S16, as shown in FIG. 30, in the pixel region 1A, over the conductive film CF1 including over the film part FPt1, there is formed the hard mask film HM2 thinner than the hard mask film HM1, namely, the hard mask film HM2 having a film thickness TH6 smaller than the thickness TH5 of the hard mask film HM1. As for other points, the procedure can be performed in the same manner as in the step of Step S16 of FIG. 5.

Figure 31:
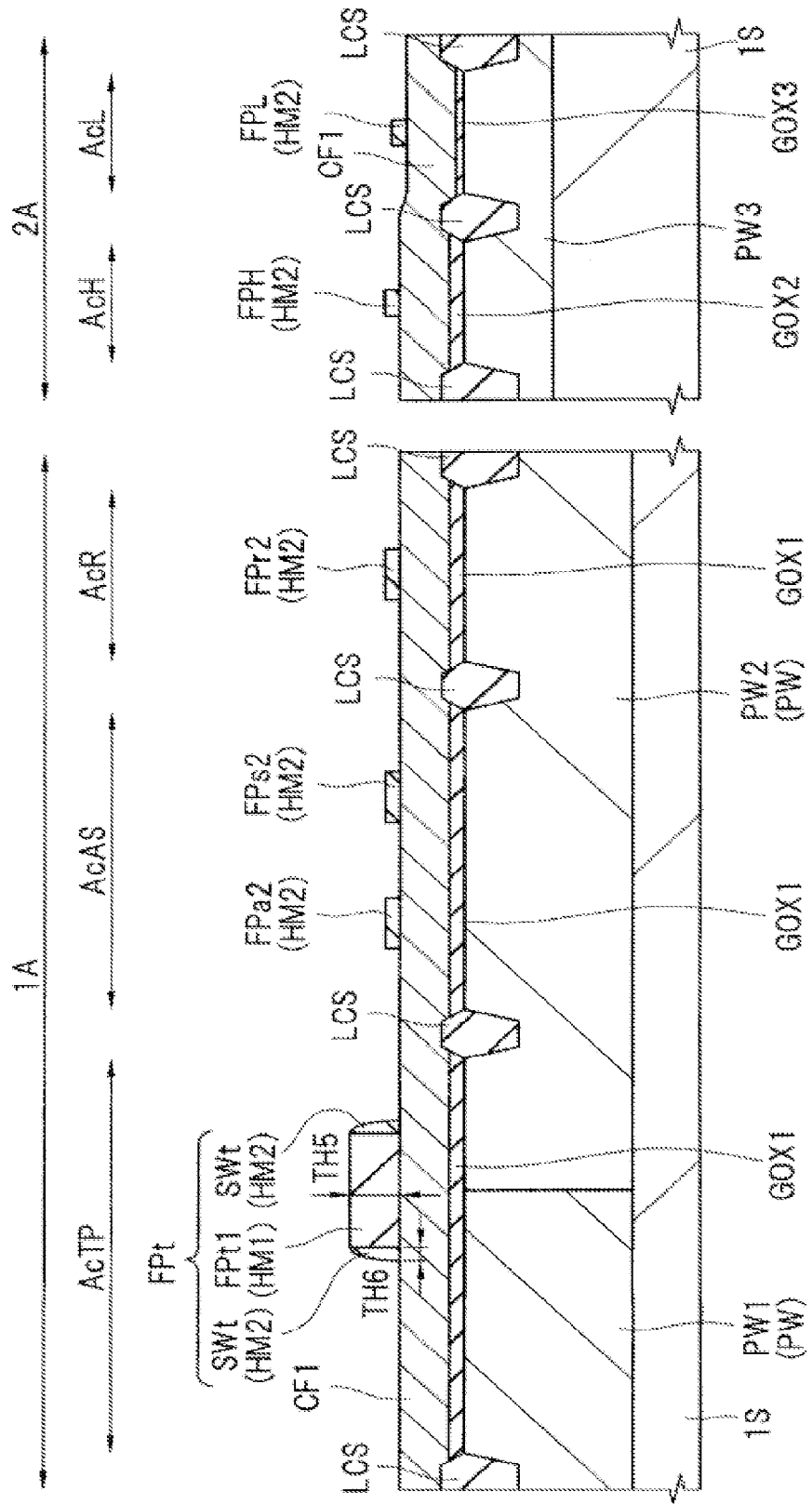
FIG. 31 is a cross sectional view showing the semiconductor device of Second Embodiment during a manufacturing step.

Then, the step corresponding to Step S17 of FIG. 5 is performed, thereby to pattern the thin hard mask film HM2. In the step corresponding to the Step S17, as shown in FIG. 31, in the pixel region 1A, in the region in which the film parts FPa2, FPs2, and FPr2 are formed, the photoresist film is left. Then, using the photoresist film as a mask, the thin hard mask film HM2 is etched. As a result, as shown in FIG. 31, in the pixel region 1A, over the conductive film CF1, the thin hard mask film HM2 is left, thereby to form film parts FPa2, FPs2, and FPr2. As for other points, the procedure can be performed in the same manner as in the step of Step S17 of FIG. 5.

Figure 32:
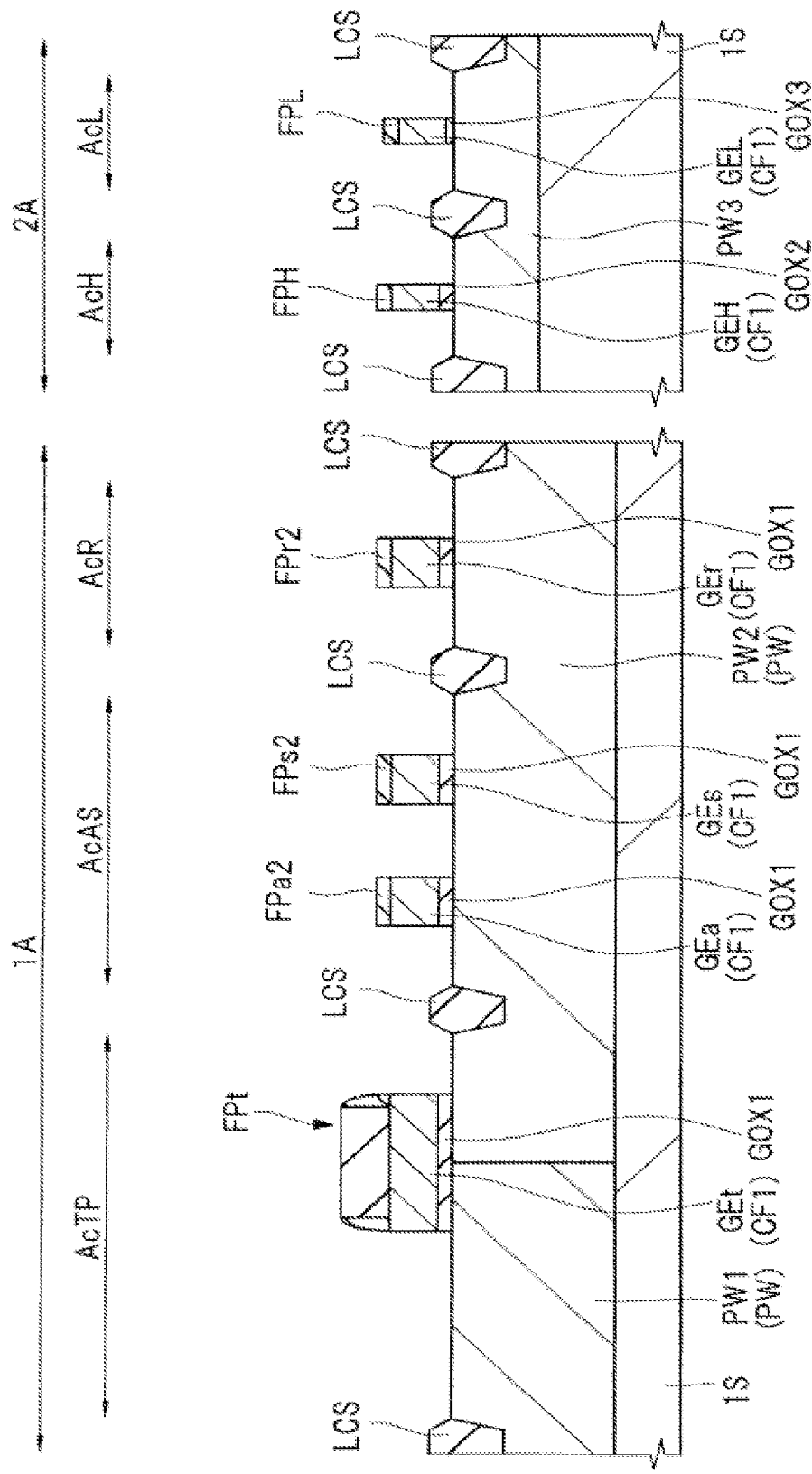
FIG. 32 is a cross sectional view showing the semiconductor device of Second Embodiment during a manufacturing step.

Then, the step corresponding to Step S18 of FIG. 5 is performed. As a result, as shown in FIG. 32, the gate electrodes GEt, GEa, GEs, GEr, GEH, and GEL are formed. In the step corresponding to the Step S18, the film thickness TH6 of the film parts FPa2, FPs2, and FPr2 (see FIG. 30) is smaller than the film thickness TH5 of the film parts FPa, FPs, and FPr (see FIG. 13). As for other points, the procedure can be performed in the same manner as in the step of Step S18 of FIG. 5.

Figure 33:
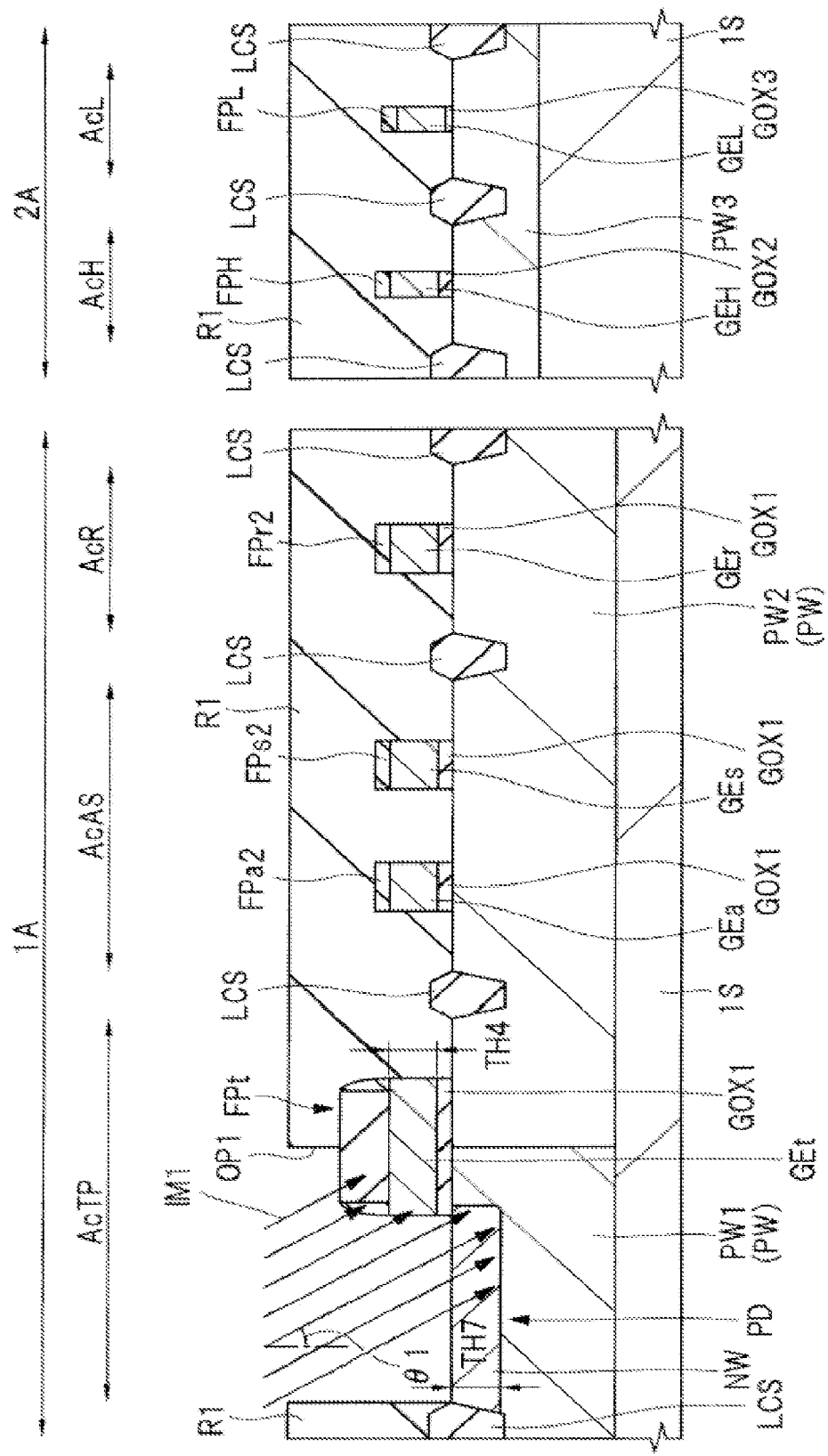
FIG. 33 is a cross sectional view showing the semiconductor device of Second Embodiment during a manufacturing step.
Figure 34:
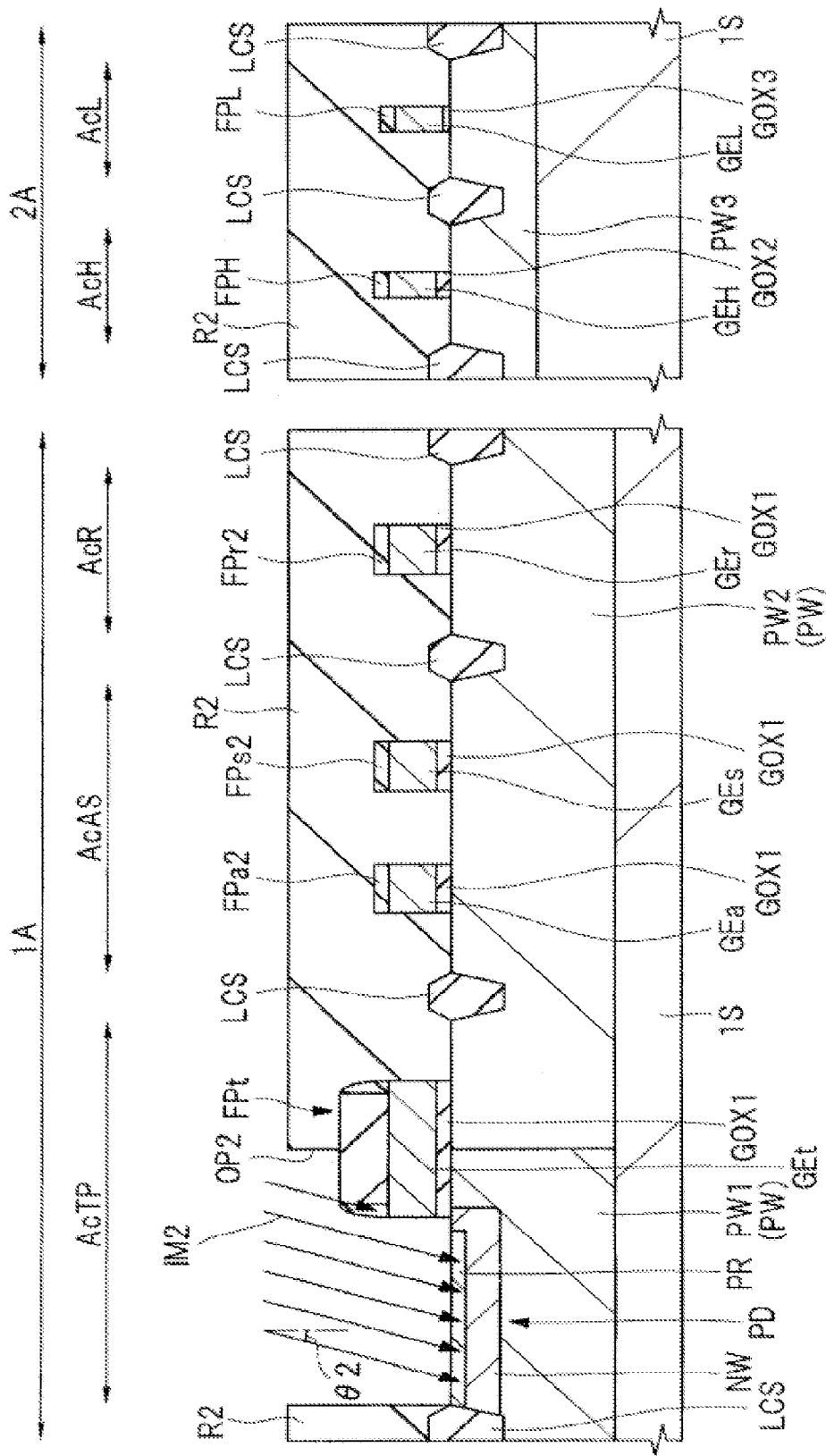
FIG. 34 is a cross sectional view showing the semiconductor device of Second Embodiment during a manufacturing step.
Figure 35:
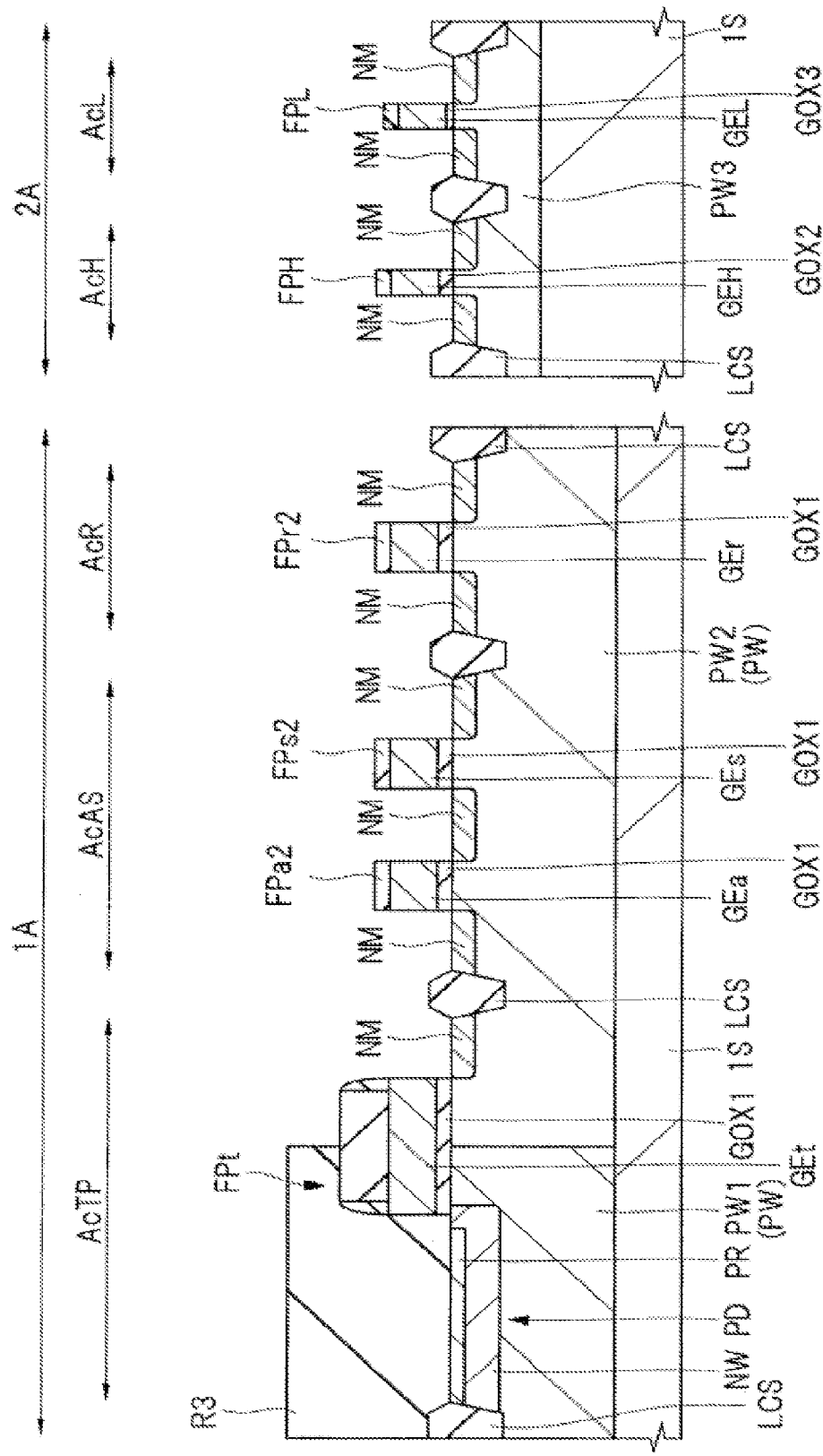
FIG. 35 is a cross sectional view showing the semiconductor device of Second Embodiment during a manufacturing step.

Then, the same step as Step S19 of FIG. 5 is performed, thereby to form the n type well NW as shown in FIG. 33. Then, the same step as Step S20 of FIG. 5 is performed, thereby to form the $p^+$ type semiconductor region PR as shown in FIG. 34. Then, the same step as Step S21 of FIG. 6 is performed, thereby to form the n type low concentration semiconductor regions NM as shown in FIG. 35.

Figure 36:
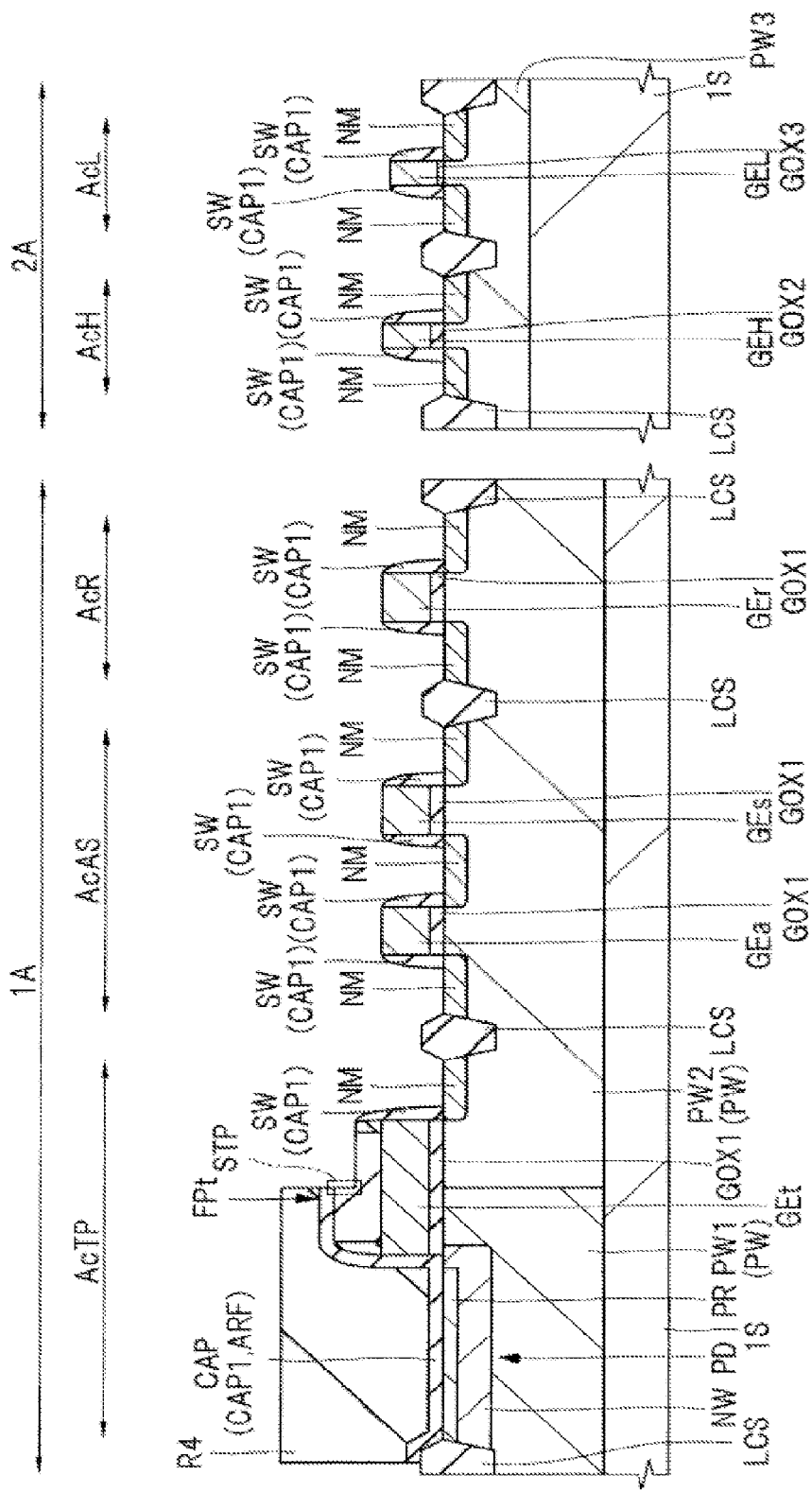
FIG. 36 is a cross sectional view showing the semiconductor device of Second Embodiment during a manufacturing step.

Then, the step corresponding to Step S22 of FIG. 6 is performed, thereby to form and pattern the cap insulation film CAP as shown in FIG. 36. In the step corresponding to the Step S22, in the pixel region 1A, the insulation film CAP1 is etched back, so that the film parts FPa2, FPs2, and FPr2 are exposed. Further, the exposed film parts FPa2, FPs2, and FPr2 are removed. Then, at respective side surfaces of the gate electrodes GEa, GEs, and GEr, the insulation films CAP1 are left. As a result, there are formed the sidewalls SW each formed of the left insulation film CAP1. As for other points, the procedure can be performed in the same manner as in the step of Step S22 of FIG. 6.

Figure 37:
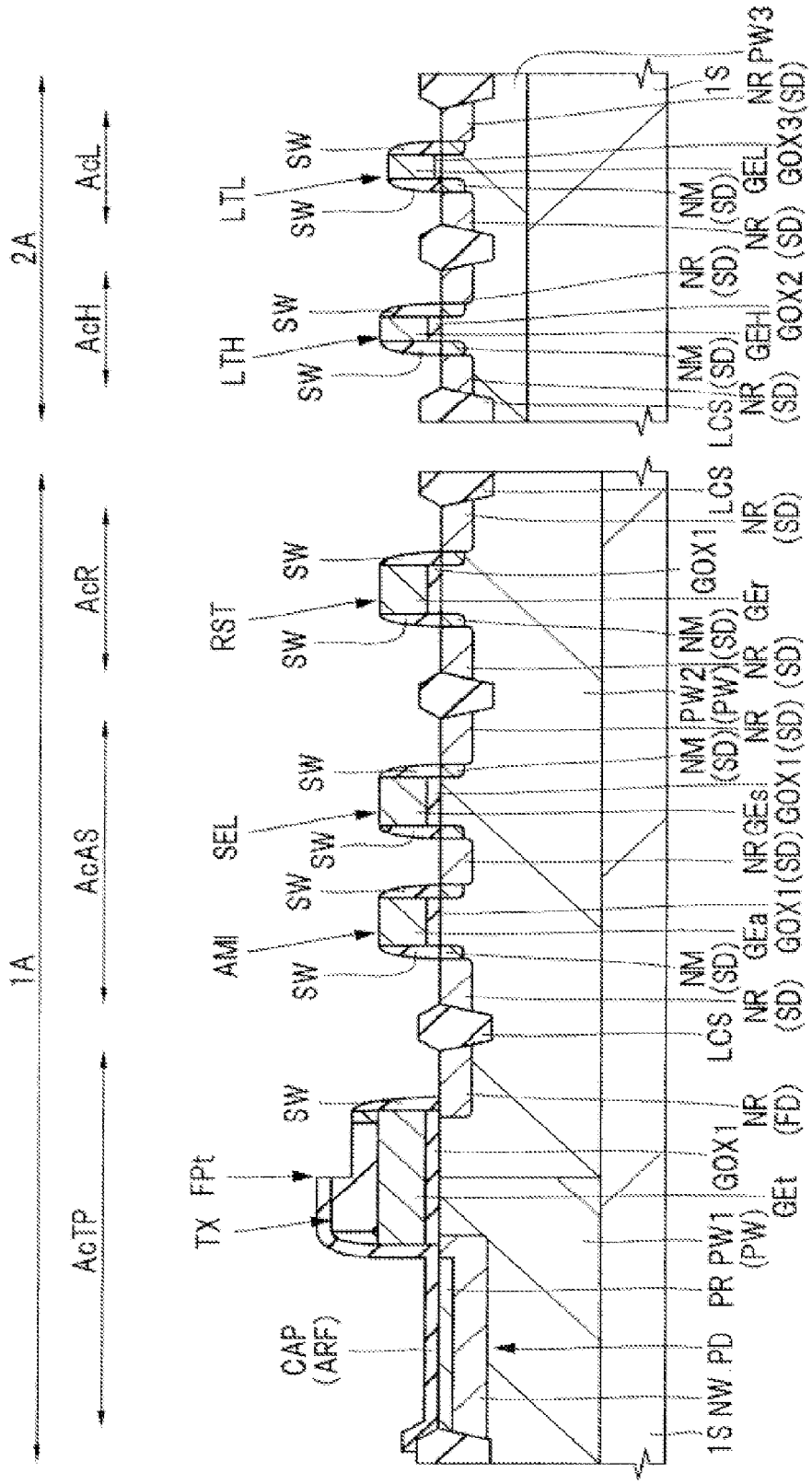
FIG. 37 is a cross sectional view showing the semiconductor device of Second Embodiment during a manufacturing step.

Then, the same step as Step S23 of FIG. 6 is performed, thereby to form the n type high concentration semiconductor regions NR as shown in FIG. 37.

Figure 38:
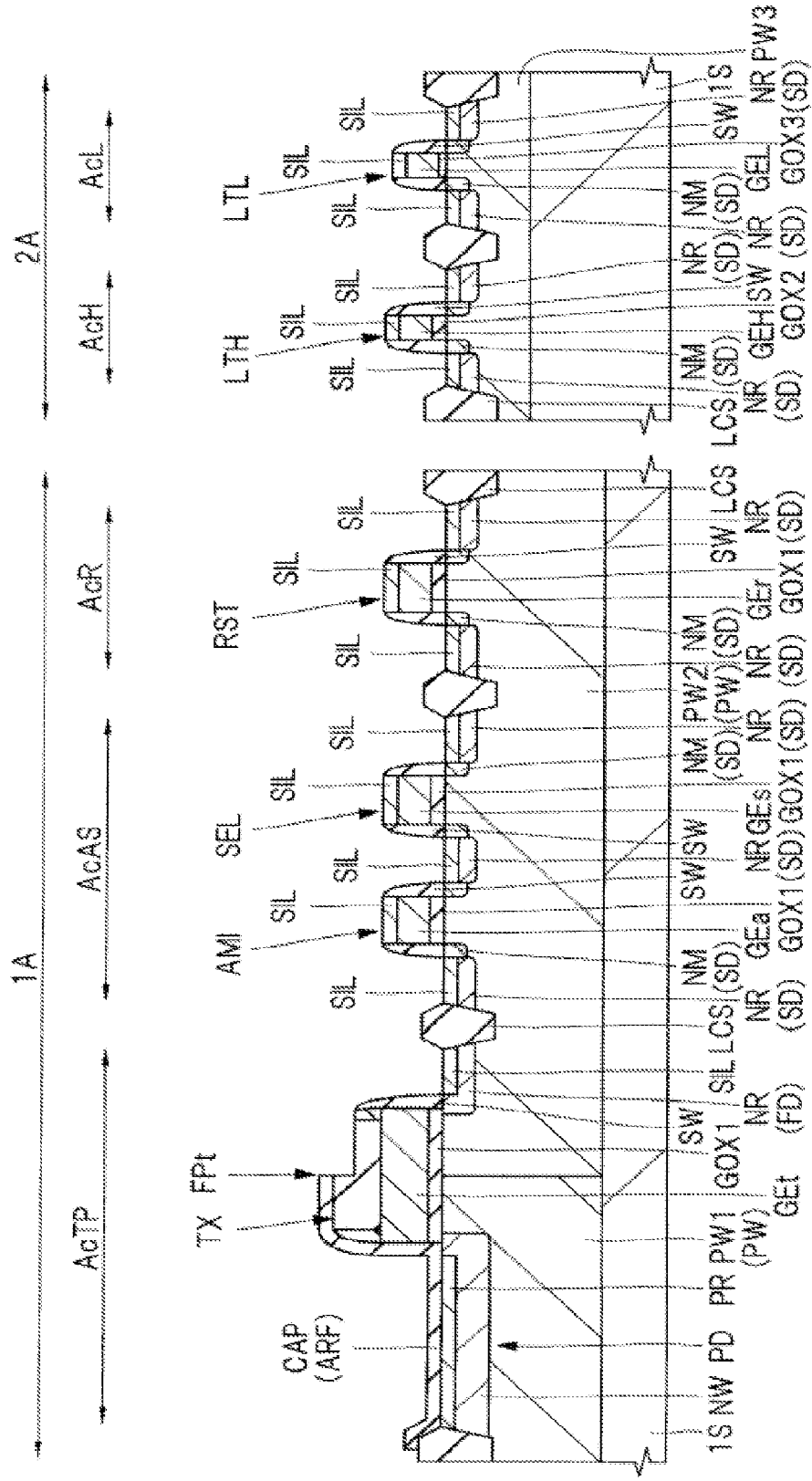
FIG. 38 is a cross sectional view showing the semiconductor device of Second Embodiment during a manufacturing step.

Then, the step corresponding to Step S24 of FIG. 6 is performed, thereby to form the silicide layers SIL as shown in FIG. 38. In the step corresponding to the Step S24, in the active regions AcAS and AcR, at respective upper surfaces of the gate electrodes GEa, GEs, and GEr, there are formed the silicide layers SIL. As for other points, the procedure can be performed in the same manner as in the step of Step S24 of FIG. 6.

Incidentally, also in the present Second Embodiment, as with First Embodiment, in the step corresponding to Step S24, the silicide layer SIL need not be formed at the upper surface of the n type high concentration semiconductor region NR which is the drain region of the transfer transistor TX.

Then, the same steps as the steps of Step S25 to Step S27 of FIG. 6 described in connection with the manufacturing steps of the semiconductor device of First Embodiment are performed. As a result, as shown in FIG. 28, there are formed the interlayer insulation film IL1, the contact holes CHt, CHa, CHs, CHr, CHH, and CHL, and the plugs PGt, PGa, PGs, PGr, PGH, and PGL.

Then, as with First Embodiment, the interlayer insulation films IL2 to IL4, the wires M1 to M3, and the microlens ML are formed. As a result, as shown in FIG. 27, the semiconductor device of the present Second Embodiment can be manufactured. Incidentally, as shown in FIG. 27, the passivation film PF and the color filter CL can be formed sequentially from the bottom between the microlens ML and the interlayer insulation film IL4.

<Main Features and Effects of the Present Embodiment>

In the present Second Embodiment, as with First Embodiment, over the gate electrode GEt, there is formed the film part FPt formed of the thick hard mask film HM1. Whereas, when, for example, n type impurity ions are doped in order to form the photodiode PD, the impurity ions are doped in self-alignment with the gate electrode GEt covered with the film part FPt. As with First Embodiment, this makes it difficult for the impurity ions to penetrate through the gate electrode GEt, and to be doped into the gate insulation film GOX1 and the p type well PW1 under the gate electrode GEt. For this reason, the semiconductor device of the present Second embodiment has the same effects as the effects of the semiconductor device of First Embodiment.

For example, as with First Embodiment, it is possible to prevent or inhibit the reduction of the number of saturated electrodes in the photodiode PD. This can improve the sensitivity of the CMOS image sensor, resulting in an improvement of the performances of the semiconductor device. Further, as with First Embodiment, it is possible to reduce the frequency of the formation of white points with no light exposed thereto, namely, the formation of pixel defects. This can improve the sensitivity of the CMOS image sensor, resulting in an improvement of the performances of the semiconductor device.

On the other hand, in the present Second Embodiment, as distinct from First Embodiment, over each of the gate electrodes GEa, GEs, and GEr of transistors other than the transfer transistor TX in the pixel region 1A, there is not formed a film part including a thick hard mask film HM1. This can establish a coupling between respective gate electrodes of transistors other than the transfer transistor TX in the pixel region 1A, such as the amplification transistor AMI, the selection transistor SEL, and the reset transistor RST and the plugs, respectively, at a low resistance.

Up to this point, the invention completed by the present inventors was specifically described based on the embodiments. However, it is naturally understood that the present invention is not limited to the embodiment, and can be variously changed within the scope not departing from the gist.

What is claimed is:

1. A method for manufacturing a semiconductor device, comprising the steps of:
   (a) providing a semiconductor substrate;
   (b) forming a first semiconductor region of a first conductivity type in a first region on a first main surface side of the semiconductor substrate;
   (c) forming a second semiconductor region in a second region on the first main surface side of the semiconductor substrate;
   (d) forming a first conductive film over the first semiconductor region, and over the second semiconductor region via a first gate insulation film;
   (e) forming a first film part formed of a first insulation film over a portion of the first conductive film formed over the first semiconductor region, and forming a second film part formed of a second insulation film over a portion of the first conductive film formed over the second semiconductor region;
   (f) after the step (e), under a condition in which the first insulation film is not present over the first conductive film formed over the second semiconductor region, etching the first conductive film, thereby leaving a first gate electrode having an upper surface covered with the first film part, and leaving a second gate electrode having an upper surface covered with the second film part;
   (g) forming a third semiconductor region of a second conductivity type different from the first conductivity type in the inside of a first portion of the first semiconductor region arranged on a first side of the first gate electrode, in alignment with the first gate electrode by an ion implantation method, and thereby forming a photodiode including the first semiconductor region and the third semiconductor region;
   (h) after the step (g), removing the second film part;
   (i) forming a fourth semiconductor region being a drain region at a second portion of the first semiconductor region arranged on a second side of the first gate electrode opposite to the first side thereof, and thereby forming a transfer transistor including the first gate electrode, the fourth semiconductor region, and the first film part, and arranged for transferring electrical charges formed by the photodiode;
   (j) after the step (h), forming a fifth semiconductor region being a source region or a drain region in the second semiconductor region, and thereby forming a first transistor including the second gate electrode and the fifth semiconductor region;
   (k) forming a first metal silicide layer at the upper surface of the second gate electrode, and forming a second metal silicide layer at an upper surface of the fifth semiconductor region; and
   (l) after the step (k), forming an interlayer insulation film in such a manner as to cover the transfer transistor and the first transistor,
   wherein the first insulation film over the first semiconductor region is of greater height than the second insulation film over the second semiconductor region.

2. The method for manufacturing a semiconductor device according to claim 1,
   wherein in the step (e), over portions of the first conductive film formed over the first semiconductor region, a third film part, a fourth film part, and a fifth film part are each formed of the first insulation film, respectively, and
   wherein in the step (f), the first conductive film is etched so as to leave a third gate electrode having an upper surface covered with the third film part, a fourth gate electrode having an upper surface covered with the fourth film part, and a fifth gate electrode gate electrode having an upper surface covered with the fifth film part,
   the method for manufacturing a semiconductor device, further comprising the steps of:
   (m) forming a sixth semiconductor region being a source region or a drain region in the first semiconductor region, and thereby forming an amplification transistor including the third gate electrode, the sixth semiconductor region, and the third film part, and arranged for amplifying a signal according to electrical charges transferred by the transfer transistor;
   (n) forming a seventh semiconductor region being a source region or a drain region in the first semiconductor region, and thereby forming a selection transistor including the fourth gate electrode, the seventh semiconductor region, and the fourth film part, and arranged for selecting the amplification transistor;
   (o) forming an eighth semiconductor region being a source region or a drain region in the first semiconductor region, and thereby forming a reset transistor including the fifth gate electrode, the eighth semiconductor region, and the fifth film part, and arranged for erasing electrical charges in the photodiode;
   (p) forming a third metal silicide layer at an upper surface of the sixth semiconductor region;
   (q) forming a fourth metal silicide layer at an upper surface of the seventh semiconductor region; and
   (r) forming a fifth metal silicide layer at an upper surface of the eighth semiconductor region,
   wherein in the step (l), the interlayer insulation film is formed in such a manner as to cover the amplification transistor, the selection transistor, and the reset transistor.

3. The method for manufacturing a semiconductor device according to claim 1,
   wherein, in the step (e), over portions of the first conductive film formed over the first semiconductor region, a third film part, a fourth film part and a fifth film part are each formed of the first insulation film, respectively,
   wherein in the step (f), the first conductive film is etched so as to leave a third gate electrode having an upper surface covered with the third film part, a fourth gate electrode having an upper surface covered with the fourth film part, and a fifth gate electrode: gate electrode having an upper surface covered with the fifth film part, and wherein in the step (h), the third film part, the fourth film part, and the fifth film part are removed, the method for manufacturing a semiconductor device, further comprising the steps of:

(m) after the step (h), forming a sixth semiconductor region being a source region or a drain region in the first semiconductor region, and thereby forming an amplification transistor including the third gate electrode and the sixth semiconductor region, and arranged for amplifying a signal according to electrical charges transferred by the transfer transistor;

(n) after the step (h), forming a seventh semiconductor region being a source region or a drain region in the first semiconductor region, and thereby forming a selection transistor including the fourth gate electrode and the seventh semiconductor region, and arranged for selecting the amplification transistor;

(o) after the step (h), forming an eighth semiconductor region being a source region or a drain region in the first semiconductor region, and thereby forming a reset transistor including the fifth gate electrode and the eighth semiconductor region, and arranged for erasing electrical charges in the photodiode;

(p) forming a third metal silicide layer at the upper surface of the third gate electrode, and forming a fourth metal silicide layer at an upper surface of the sixth semiconductor region;

(q) forming a fifth metal silicide layer at the upper surface of the fourth gate electrode, and forming a sixth metal silicide layer at an upper surface of the seventh semiconductor region; and (r) forming a seventh metal silicide layer at the upper surface of the fifth gate electrode, and forming an eighth metal silicide layer at an upper surface of the eighth semiconductor region, wherein in the step (l), the interlayer insulation film is formed in such a manner as to cover the amplification transistor, the selection transistor, and the reset transistor.

4. The method for manufacturing a semiconductor device according to claim 1, wherein the step (e) comprises the steps of:

(e1) forming the first insulation film over the first conductive film over the first semiconductor region and the second semiconductor region;

(e2) patterning the first insulation film to form the first film part, and removing the first insulation film over the second semiconductor region;

(e3) forming the second insulation film over the first conductive film over the first semiconductor region and the second semiconductor region, including over the first film part;

(e4) etching the second insulation film in the first region, thereby leaving a portion of the second insulation film as a first sidewall part at a side surface of the first film part; and (e5) patterning the second insulation film in the second region, and thereby forming the second film part.

5. The method for manufacturing a semiconductor device according to claim 1, wherein the step (g) comprises the steps of:

(g1) forming a resist film over the semiconductor substrate, including over the first film part and over the second film part;

(g2) forming a first opening penetrating through the resist film, and reaching a first portion of the first semiconductor region; and (g3) forming the third semiconductor region in the inside of the first portion of the first semiconductor region exposed at a bottom of the first opening in alignment with the first gate electrode by an ion implantation method, and thereby forming the photodiode, wherein in the first opening formed in the step (g2), an upper surface of a portion of the first film part formed over an end on the first side of the first gate electrode is exposed.

6. The method for manufacturing a semiconductor device according to claim 5, wherein in step (g3), the ion implantation method includes oblique ion implantation in which ions are exposed to a side surface of the first gate electrode.

7. The method for manufacturing a semiconductor device according to claim 6, wherein in step (g3), the ion implantation method includes a combination of vertical ion implantation and oblique ion implantation.

8. The method for manufacturing a semiconductor device according to claim 1, wherein in the step (g), the third semiconductor region is formed such that a distance from the first main surface of the semiconductor substrate to a surface of the third semiconductor region opposite to a first main surface side thereof is larger than a film thickness of the first gate electrode.

9. The method for manufacturing a semiconductor device according to claim 1, wherein the first insulation film is formed of a silicon oxide film, a silicon nitride film, or a silicon oxynitride film.

10. The method for manufacturing a semiconductor device according to claim 9, further comprising:

after step (h), forming a cap insulating film over the first semiconductor region, and anisotropically etching the cap insulating film while protecting portions of the cap insulating film over the photodiode and over a first portion of the first film part on the photodiode side, thereby forming a step between the first portion of the first film part and a second portion of the first film part opposite the photodiode side.

11. The method for manufacturing a semiconductor device according to claim 10, wherein the cap insulating film is also formed over the second semiconductor region, and the anisotropic etching is performed such that portions of the cap insulating film are respectively left as a sidewall covering a side of the first gate electrode opposite the photodiode side and as sidewalls covering opposite sides of the second gate electrode.

* * * * *